United States Patent
Lee et al.

(10) Patent No.: US 12,048,150 B2
(45) Date of Patent: Jul. 23, 2024

(54) SEMICONDUCTOR MEMORY DEVICE

(71) Applicant: Samsung Electronics Co., Ltd., Suwon-si (KR)

(72) Inventors: Kyung Hwan Lee, Seoul (KR); Yong Seok Kim, Suwon-si (KR); Il Gweon Kim, Hwaseong-si (KR); Hyun Cheol Kim, Seoul (KR); Hyeoung Won Seo, Yongin-si (KR); Sung Won Yoo, Hwaseong-si (KR); Jae Ho Hong, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 244 days.

(21) Appl. No.: 17/377,848

(22) Filed: Jul. 16, 2021

(65) Prior Publication Data
US 2022/0139948 A1    May 5, 2022

(30) Foreign Application Priority Data
Nov. 3, 2020  (KR) ........................ 10-2020-0145137

(51) Int. Cl.
  *H10B 43/20*    (2023.01)
  *H10B 43/10*    (2023.01)
(52) U.S. Cl.
  CPC ............. *H10B 43/20* (2023.02); *H10B 43/10* (2023.02)
(58) Field of Classification Search
  CPC ........ H10B 43/20; H10B 43/10; H10B 43/30; H10B 43/35; H01L 27/11578; H01L 27/11565; H01L 29/792; H01L 29/40117; H01L 27/11568; H01L 29/4234
  See application file for complete search history.

(56) References Cited

U.S. PATENT DOCUMENTS

| | | | |
|---|---|---|---|
| 8,630,114 B2 | 1/2014 | Lue | |
| 9,646,985 B2 | 5/2017 | Noh et al. | |
| 9,831,247 B2 | 11/2017 | Han et al. | |
| 2010/0219466 A1* | 9/2010 | Sung | H10B 12/488 257/329 |
| 2013/0320433 A1* | 12/2013 | Cho | H01L 29/407 257/329 |

(Continued)

FOREIGN PATENT DOCUMENTS

CN    110785846 A    2/2020

*Primary Examiner* — Shahed Ahmed
*Assistant Examiner* — Khatib A Rahman
(74) *Attorney, Agent, or Firm* — Harness, Dickey & Pierce, P.L.C.

(57) ABSTRACT

A semiconductor memory device having improved electrical characteristics is provided. The semiconductor memory device comprises a first semiconductor pattern separated from a substrate in a first direction, a first gate structure extending in the first direction and penetrating the first semiconductor pattern, a first conductive connecting line connected to the first semiconductor pattern and extending in a second direction different from the first direction, and a second conductive connecting line connected to the first semiconductor pattern. The first gate structure is between the first conductive connecting line and the second conductive connecting line, the first gate structure includes a first gate electrode and a first gate insulating film, and the first gate insulating film includes a first charge holding film contacting with the first semiconductor pattern.

20 Claims, 58 Drawing Sheets

(56) References Cited

U.S. PATENT DOCUMENTS

| | | | |
|---|---|---|---|
| 2019/0206869 A1* | 7/2019 | Kim | H01L 23/528 |
| 2020/0058584 A1* | 2/2020 | Sukekawa | H01L 23/5225 |
| 2020/0203427 A1* | 6/2020 | Noh | H10B 63/84 |
| 2020/0243423 A1 | 7/2020 | Or-Bach et al. | |
| 2021/0111183 A1* | 4/2021 | Gardner, I | H01L 27/0924 |

* cited by examiner

Trap site

Trap site

SEMICONDUCTOR MEMORY DEVICE

CROSS-REFERENCE TO RELATED APPLICATION

This application claims priority from Korean Patent Application No. 10-2020-0145137 filed on Nov. 3, 2020 in the Korean Intellectual Property Office, and all the benefits accruing therefrom under 35 U.S.C. 119, the contents of which in its entirety are herein incorporated by reference.

BACKGROUND

Some example embodiments relate to a semiconductor memory device, and more specifically, to a three-dimensional semiconductor memory device having improved electrical characteristics.

In order to satisfy existing performance and/or low price expectations of consumers, increasing a degree of integration of a semiconductor element is being pursued. In the case of the semiconductor elements, since the degree of integration is an important factor in determining the price of a product, an increased density is particularly being pursued.

In the case of a conventional two-dimensional or planar semiconductor element, the degree of integration is mainly determined by an area occupied by unit memory cells, and is therefore greatly affected by a level of fine pattern forming technology. However, since ultra-expensive apparatuses such as ultra-expensive photolithographic equipment is used for shrinking of patterns, the degree of integration of two-dimensional semiconductor elements is increasing, but may still be limited. As a result, three-dimensional semiconductor memory elements including memory cells arranged three-dimensionally have been proposed.

SUMMARY

Some example embodiments provide a three-dimensional semiconductor memory device having improved electrical characteristics and/or reliability.

According to some example embodiments, there is provided a semiconductor memory device comprising a first semiconductor pattern separated from a substrate in a first direction, a first gate structure extending in the first direction and penetrating the first semiconductor pattern, a first conductive connecting line connected to the first semiconductor pattern and extending in a second direction different from the first direction, and a second conductive connecting line connected to the first semiconductor pattern. The first gate structure is between the first conductive connecting line and the second conductive connecting line, the first gate structure includes a first gate electrode and a first gate insulating film, and the first gate insulating film includes a first charge holding film contacting with the first semiconductor pattern.

According to some example embodiments, there is provided a semiconductor memory device comprising a semiconductor pattern separated from a substrate in a first direction, a first gate structure extending in the first direction and penetrating the semiconductor pattern, a first conductive connecting line connected to the semiconductor pattern and extending in a second direction different from the first direction, and a second conductive connecting line connected to the semiconductor pattern and extending in the first direction. The first gate structure is between the first conductive connecting line and the second conductive connecting line, the first gate structure includes a first gate electrode and a first gate insulating film, and the first gate insulating film includes a first charge holding film.

According to some example embodiments, there is provided a semiconductor memory device comprising a semiconductor pattern including a first impurity region separated from a substrate in a first direction, the first impurity region having a first conductive type, a second impurity region having a second conductive type different from the first conductive type, and a channel region between the first impurity region and the second impurity region, a first gate structure and a second gate structure, the first gate structure and the second gate structure extending extend in the first direction and penetrating the channel region, a first conductive connecting line connected to the first impurity region and extending in a second direction different from the first direction, and a second conductive connecting line connected to the second impurity region. The first gate structure and the second gate structure each include a gate electrode and a gate insulating film, and the gate insulating film includes a charge holding film.

However, aspects of inventive concepts are not restricted to the one set forth herein. The above and other aspects of inventive concepts will become more apparent to one of ordinary skill in the art to which example embodiments pertain by referencing the detailed description of the present disclosure given below.

BRIEF DESCRIPTION OF THE DRAWINGS

The above and other aspects and features of example embodiments will become more apparent by describing in detail example embodiments thereof referring to the attached drawings, in which.

DETAILED DESCRIPTION OF SOME EXAMPLE EMBODIMENTS

Figure 1A:
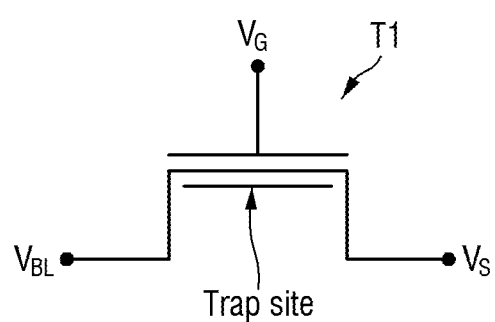
FIGS. 1A and 1B are schematic circuit diagrams of unit cells for explaining the operation of a semiconductor memory device according to some example embodiments.
Figure 1B:
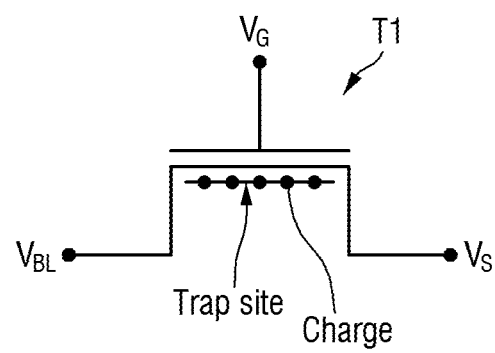

FIGS. 1A and 1B are schematic circuit diagrams of a unit cell for explaining the operation of the semiconductor memory device according to some example embodiments.

Referring to FIGS. 1A and 1B, in the semiconductor memory device according to some example embodiments, a first transistor T1 may include a charge trap site.

A bit line voltage $V_{BL}$ may be applied to a drain region of the first transistor T1. A source voltage $V_S$ may be applied to a source region of the first transistor T1. A gate voltage $V_G$ may be applied to a gate of the first transistor T1.

In FIG. 1A, the first transistor T1 does not include a charge trapped at the charge trap site. In FIG. 1B, since the first transistor T1 is programmed, the first transistor T1 may include a charge trapped in the charge trap site.

A threshold voltage of the first transistor T1 may change depending on whether there is a charge, such as one or more electrons or one or more holes, trapped at the charge trap site. For example, a first threshold voltage of the first transistor T1 including the trapped charge may be different from a second threshold voltage of the first transistor T1 including no trapped charge.

In order to operate the first transistor T1, the same gate voltage $V_G$, bit line voltage $V_{BL}$, and source voltage $V_S$ may be applied to the first transistor T1 of FIG. 1A and the first transistor T1 of FIG. 1B. When the first transistor T1 of FIG. 1A and the first transistor T1 of FIG. 1B are operated under the same conditions such as the same electrical/bias conditions, a drain current value of the first transistor T1 of FIG. 1A may be a first current, and a drain current value of the first transistor T1 of FIG. 1B may be a second current.

Since the first threshold voltage and the second threshold voltage are different from each other, the first current may be different from the second current. The first transistor T1 may be used as a memory element by utilizing a difference between the first current and the second current.

Figure 2A:
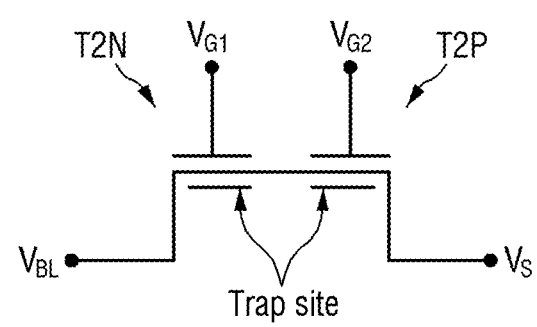
FIGS. 2A and 2B are circuit diagrams of unit cells of the semiconductor memory device according to some example embodiments.
Figure 2B:
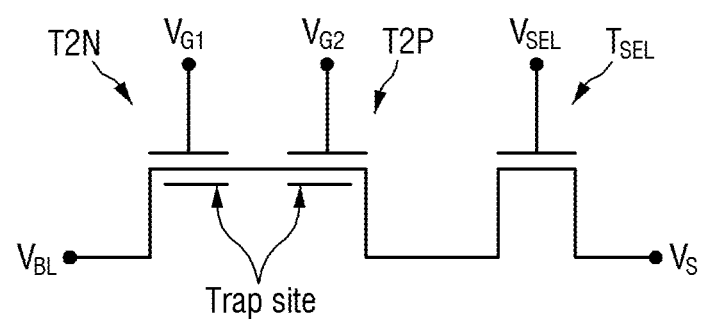
Figure 3A:
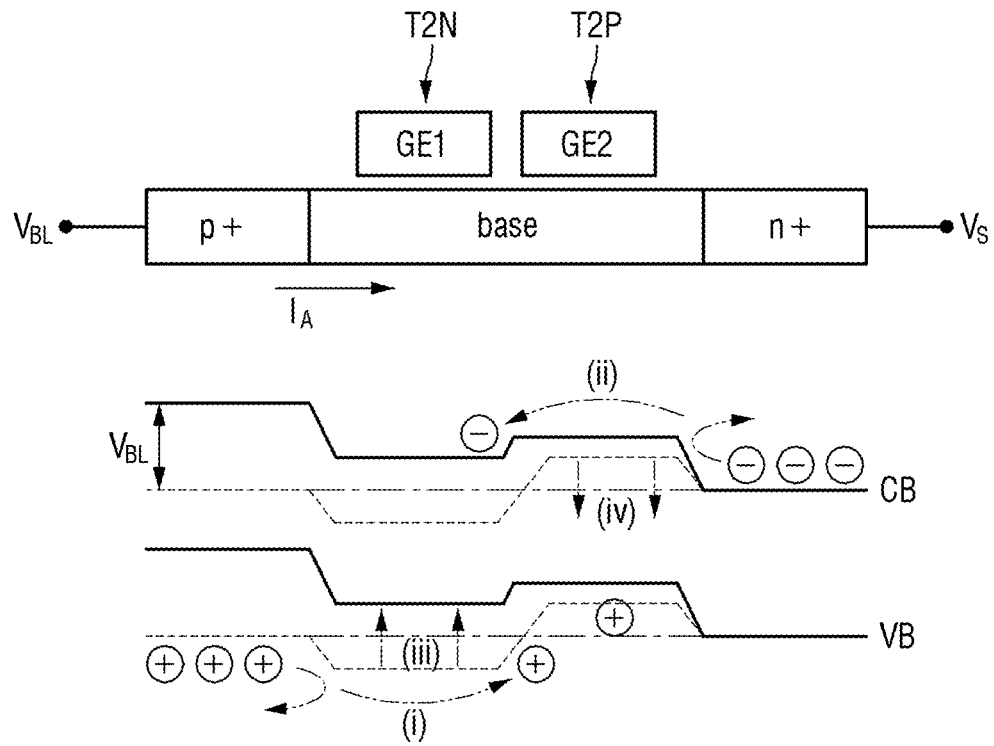
FIGS. 3A and 3B are diagrams for explaining the operation of the unit cells of FIG. 2A.
Figure 3B:
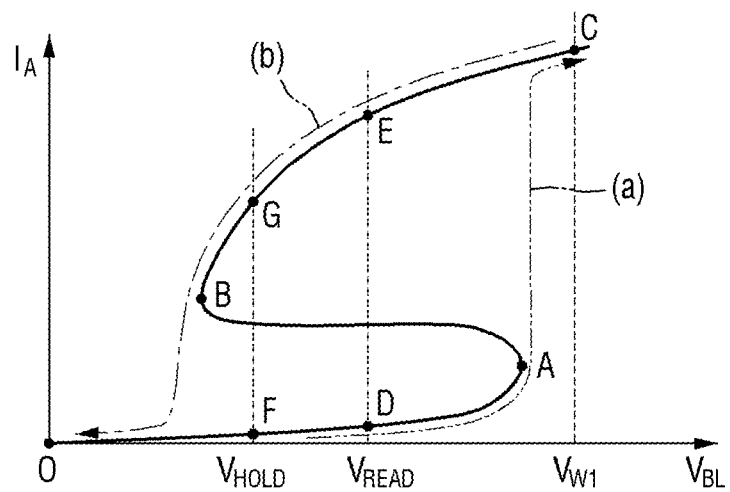

FIGS. 2A and 2B are circuit diagrams of unit cells of the semiconductor memory device according to some example embodiments. FIGS. 3A and 3B are diagrams for explaining the operation of the unit cell of FIG. 2A. For reference, FIG. 3A is a diagram for explaining a writing operation of the unit cell of FIG. 2A.

Referring to FIGS. 2A, 3A and B, the semiconductor memory device according to some example embodiments may include a semiconductor region that includes a p-type impurity region (p+) that may be doped with, e.g. heavily doped with impurities such as boron, an n-type impurity region (n+), that may be doped with, e.g. heavily doped with impurities such as phosphorus and/or arsenic, and a base region (base) between the p-type impurity region (p+) and the n-type impurity region (n+), that may be intrinsic or undoped or lightly doped with impurities such as boron, phosphorus, or arsenic.

The semiconductor memory device may include, for example, a first gate electrode GE1 and a second gate electrode GE2 that are placed on the base region (base). The first gate electrode GE1 may be closer to the p-type impurity region (p+) than the second gate electrode GE2. A first control transistor T2N may be defined by the first gate electrode GE1 and the base region (base). A second control transistor T2P may be defined by the second gate electrode GE2 and the base region (base). As in the first transistor T1 shown in FIGS. 1A and 1B, the first control transistor T2N and the second control transistor T2P may each include a charge trap site.

For example, the p-type impurity region (p+) may be or correspond to an anode region, and the n-type impurity region (n+) may be or correspond to a cathode region. The base region (base) may be or correspond a channel region in which charges such as electrons and/or holes move. The p-type impurity region (p+) may be connected to, for example, a bit line, and a bit line voltage $V_{BL}$ may be applied thereto. The n-type impurity region (n+) may be connected to a source region, and a source voltage $V_S$ may be applied thereto. For example, the source voltage $V_S$ may be, but is not limited to, a ground voltage.

The p-type impurity region (p+) may be formed of a semiconductor material doped with p-type impurities such as boron, and the n-type impurity region (n+) may be formed of a semiconductor material doped with n-type impurities such as phosphorus and/or arsenic. As an example, the base region (base) may be formed of an intrinsic semiconductor material that is not doped with impurities. The base region (base) may be formed of an undoped semiconductor material. As another example, the base region (base) may be formed of a semiconductor material doped with, e.g. lightly doped with p-type impurities at a small concentration, e.g. at a concentration lower by orders of magnitude than that of the p-type impurity region (p+). When the base region (base) is doped with p-type impurities, a doping concentration of the base region (base) is lower than a doping concentration of the p-type impurity region (p+).

When a first voltage $V_{G1}$, which is a positive voltage, is applied to the first gate electrode GE1, a part of the base region (base) may exhibit the characteristics of the n-type semiconductor material. When a second voltage $V_{G2}$, which is a negative voltage, is applied to the second gate electrode GE2, the rest of the base region (base) may exhibit the characteristics of the p-type semiconductor material. Even if the base region (base) is formed of an intrinsic semiconductor material or is lightly doped with a p-type semiconductor material, a voltage may be applied to the first gate electrode GE1 and the second gate electrode GE2 to modulate electrical properties of the base region (base). For example, in a state in which the voltage is applied to the first gate electrode GE1 and the second gate electrode GE2, the semiconductor region of the semiconductor memory device may have a Shockley diode structure/pnpn structure. For example, the semiconductor memory device of example embodiments may be or correspond to a memory device including a thyristor structure, e.g. a 1Thy memory device. The memory device may not be or include a capacitor.

Hereinafter, the writing operation of the semiconductor memory device of the present disclosure will be described using FIG. 3A. For reference, the following description will be given using a case where the base region (base) is formed of an intrinsic semiconductor material. Since a first voltage $V_{G1}$, which is a positive voltage, is applied to the first gate electrode GE1, and simultaneously or concurrently a second voltage $V_{G2}$, which is a negative voltage, is applied to the second gate electrode GE2, the base region (base) may have an "np structure". Additionally, the source voltage $V_S$ may be a ground voltage.

A band diagram of the p-type impurity region (p+), the base region (base), and the n-type impurity region (n+) having the pnpn structure may be a first state (e.g. a conduction band CB and a valence band VB of a solid line). For example, in the first state, there may be no voltage difference between the bit line voltage $V_{BL}$ and the source voltage $V_S$. In the first state, no current may flow between the p-type impurity region (p+) and the n-type impurity region (n+).

When a positive voltage is applied to the bit line voltage $V_{BL}$, the band diagram of the p-type impurity region (p+), the base region (base), and the n-type impurity region (n+) may be a second state (e.g. a conduction band CB and a valence band VB of a dotted line).

In the second state, holes applied to the p-type impurity region (p+) may not pass an energy barrier between the p-type impurity region (p+) and the base region (base). Further, electrons applied to the n-type impurity region (n+) may not pass the energy barrier between the n-type impurity region (n+) and the base region (base).

For example, although there is a voltage difference between the bit line voltage $V_{BL}$ and the source voltage $V_S$, current $I_A$ does not flow or does not flow well between the p-type impurity region (p+) and the n-type impurity region (n+).

At this time, when a positive voltage smaller than the first voltage $V_{G1}$ is applied to the first gate electrode GE1, as in (iii), the energy barrier between the p-type impurity region (p+) and the base region (base) may be temporarily lowered.

When the energy barrier between the p-type impurity region (p+) and the base region (base) is lowered, the holes of the p-type impurity region (p+) may move (i) to the base region (base). The hole (i) moved to the base region (base) may lower the energy barrier between the n-type impurity region (n+) and the base region (base), as in (iv).

When the energy barrier between the n-type impurity region (n+) and the base region (base) is lowered, the electrons of the n-type impurity region (n+) move (ii) to the base region (base). Additionally, the electrons (ii) that have moved to the base region (base) may further lower the energy barrier between the p-type impurity region (p+) and the base region (base).

When such a positive feedback loop is generated, the energy barrier between the p-type impurity region (p+) and the base region (base), and the energy barrier between the n-type impurity region (n+) and the base region (base) may collapse, and there may be no difference between the valence band and the conduction band. The band diagram of the p-type impurity region (p+), the base region (base), and the n-type impurity region (n+) may be a third state (a conduction band CB and a valence band VB of alternated long and short dash line). Unlike the shown configuration, when the bit line voltage $V_{BL}$ further increases, the slope of band diagram of the p-type impurity region (p+), the base region (base), and the n-type impurity region (n+) may further increase.

In the third state, the current $I_A$ between the p-type impurity region (p+) and the n-type impurity region (n+) may flow like a p-i-n diode, e.g. a diode comprising a p-type anode, an intrinsic region, and an n-type cathode. The charge may be trapped at the charge trap site of the first control transistor T2N and the second control transistor T2P, due to the current $I_A$ flowing between the p-type impurity region (p+) and the n-type impurity region (n+). Because the first control transistor T2N and the second control transistor T2P include the charge trap site, the semiconductor memory device of some example embodiments may have a wide memory window.

Unlike the aforementioned configuration, a positive voltage less than the first voltage $V_{G1}$ may not be applied to the first gate electrode GE1. In such a case, by further increasing the voltage difference between the bit line voltage $V_{BL}$ and the source voltage $V_S$, the current may be made to flow like a p-i-n diode between the p-type impurity region (p+) and the n-type impurity region (n+).

Unlike the aforementioned configuration, the band diagram of the p-type impurity region (p+), the base region (base), and the n-type impurity region (n+) may also be modulated, by utilizing the second gate electrode GE2.

Hereinafter, the operation of the semiconductor memory device of example embodiments will be described using FIGS. 3A and 3B. A state "D1" may be or correspond to a state in which the current $I_A$ flows between the p-type impurity region (p+) and the n-type impurity region (n+) as described in FIG. 3A. A state "D0" may be or correspond to a state in which no current $I_A$ flows between the p-type impurity region (p+) and the n-type impurity region (n+).

When the bit line voltage $V_{BL}$ is a write voltage $V_{W1}$, the semiconductor memory device may perform a writing operation. The writing operation of the semiconductor memory device may be performed along a line (a) of FIG. 3B. As a result, the semiconductor memory device may be placed in the state "D1". When the bit line voltage $V_{BL}$ is the write voltage $V_{W1}$, the current $I_A$ between the p-type impurity region (p+) and the n-type impurity region (n+) may be a point "C".

A point "A" of FIG. 3B may be a point on which the energy barrier between the p-type impurity region (p+) and the base region (base) disappears.

When the bit line voltage $V_{BL}$ is a read voltage $V_{READ}$, the semiconductor memory device may perform a reading operation. The read voltage $V_{READ}$ may be less than the voltage of the point "A". In the state "D1", when the bit line voltage $V_{BL}$ is the read voltage $V_{READ}$, the current $I_A$ between the p-type impurity region (p+) and the n-type impurity region (n+) may be a point "E". In the state "D0", when the bit line voltage $V_{BL}$ is the read voltage $V_{READ}$, the current $I_A$ between the p-type impurity region (p+) and the n-type impurity region (n+) may be a point "D".

The data storage value (for example, "0" or "1") of the semiconductor memory device may be confirmed by utilizing the difference between the current $I_A$ of the point "E" and the current $I_A$ of the point "D".

In order for the semiconductor memory device to maintain, e.g. to stably maintain the state "D1", the bit line voltage $V_{BL}$ may be a holding voltage $V_{HOLD}$. In the state "D1", a relationship between the bit line voltage $V_{BL}$ and the current $I_A$ may be a line (b) of FIG. 3B. In the state "D1", when the bit line voltage $V_{BL}$ is the holding voltage $V_{HOLD}$, the current $I_A$ between the p-type impurity region (p+) and the n-type impurity region (n+) may be a point "G". In order for the semiconductor memory device to maintain the state "D0", the bit line voltage $V_{BL}$ may be the holding voltage $V_{HOLD}$. In the state "D0", when the bit line voltage $V_{BL}$ is the holding voltage $V_{HOLD}$, the current $I_A$ between the p-type impurity region (p+) and the n-type impurity region (n+) may be a point "F".

The holding voltage $V_{HOLD}$ needs to be or may be greater than the voltage of the point "B". When the bit line voltage $V_{BL}$ becomes less than the voltage of the point "B", the energy barrier between the p-type impurity region (p+) and the base region (base), and the energy barrier between the n-type impurity region (n+) and the base region (base) are restored. When the energy barrier is restored, no current $I_A$ may flow between the p-type impurity region (p+) and the n-type impurity region (n+). For example, the semiconductor memory device may not maintain the state "D1".

When the bit line voltage $V_{BL}$ becomes less than the voltage of the point "B", the state "D1" of the semiconductor memory device may not be maintained. To explain in another way, the semiconductor memory device may change to the state "D0". For example, the semiconductor memory device may perform an erasing operation.

In FIG. 2B, a selection transistor $T_{SEL}$ may be further placed between the p-type impurity region (p+) and the n-type impurity region (n+). By adjusting the selection voltage $V_{SEL}$ applied to the selection transistor $T_{SEL}$, the movement of charge between the p-type impurity region (p+) and the n-type impurity region (n+) may be controlled.

On the other hand, by adjusting the selection voltage $V_{SEL}$ applied to the selection transistor $T_{SEL}$, the current between the p-type impurity region (p+) and the n-type impurity region (n+) may become 0. Alternatively or additionally, by reducing the voltage difference between the bit line voltage $V_{BL}$ and the source voltage $V_S$ to a threshold value or less, the current between the p-type impurity region (p+) and the n-type impurity region (n+) may become 0.

Unlike those described above, the base region (base) may include an n-type base region and a p-type base region. The n-type base region may be formed of a semiconductor material doped with n-type impurities such as phosphorus and/or arsenic, and the p-type base region may be formed of a semiconductor material doped with p-type impurities such as boron. The n-type base region of the base region (base) is in contact with/in direct contact with the p-type impurity region (p+). For example, in a state in which no voltage is applied to the first gate electrode GE1 and the second gate electrode GE2, the semiconductor region of the semiconductor memory device may have a pnpn structure. A concentration of impurities of the n-type base region of the base region (base) may lower than, e.g. lower by several orders of magnitude than, a concentration of impurities of the n-type impurity region (n+). The concentration of impurities of the p-type base region of the base region (base) may be lower than, e.g. lower by several orders of magnitude than, the concentration of impurities of the p-type impurity region (p+).

Figure 4:
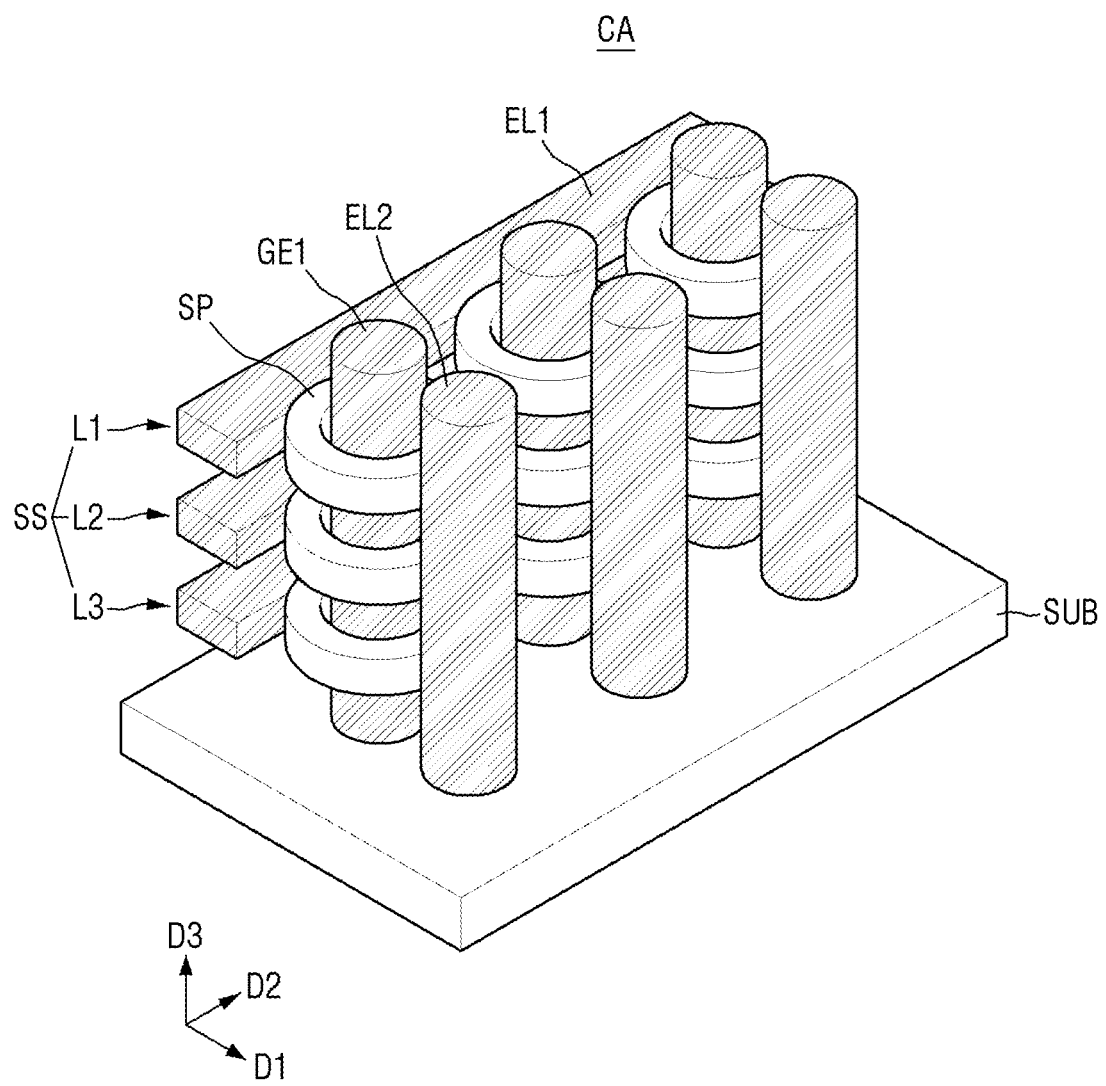
FIGS. 4 to 8B are example perspective views showing the semiconductor memory device according to some example embodiments, respectively.
Figure 5:
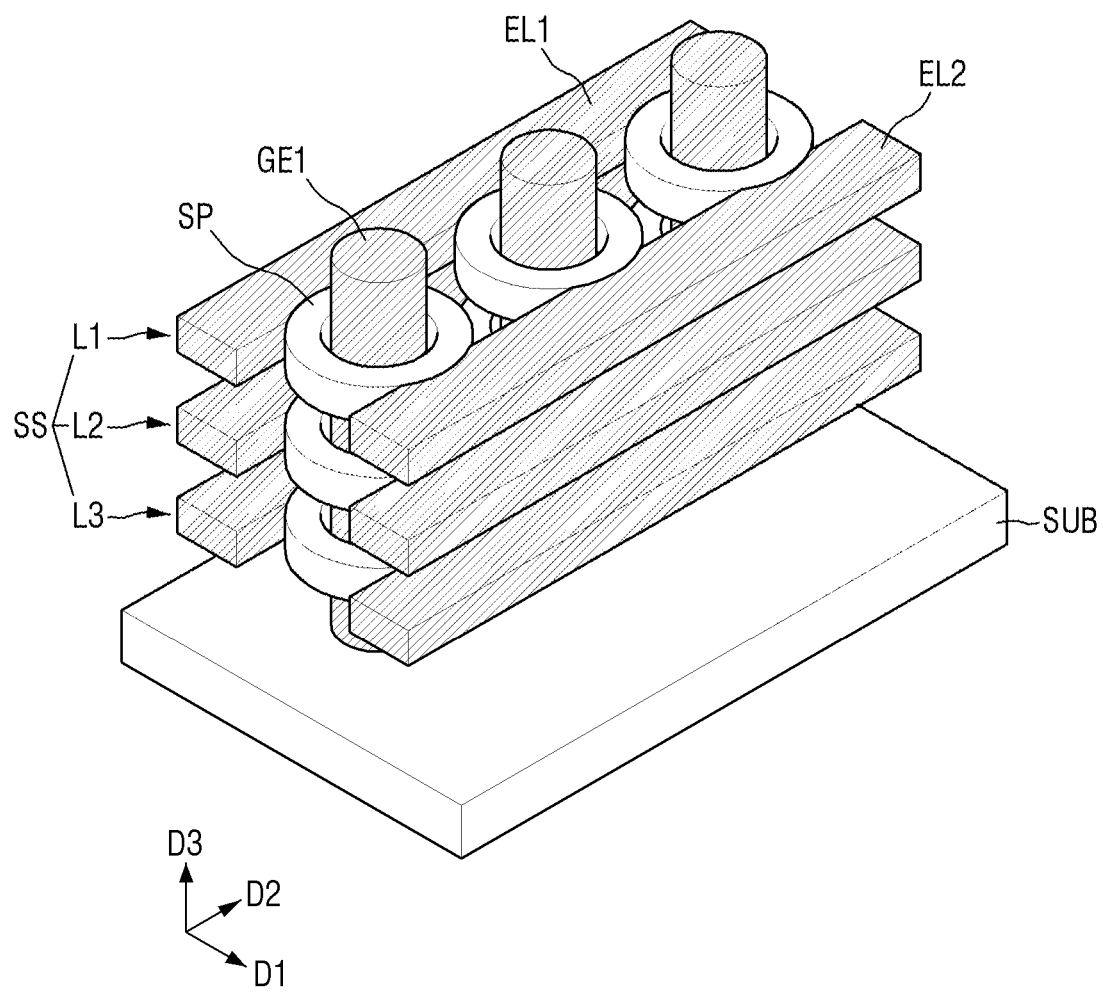
Figure 6:
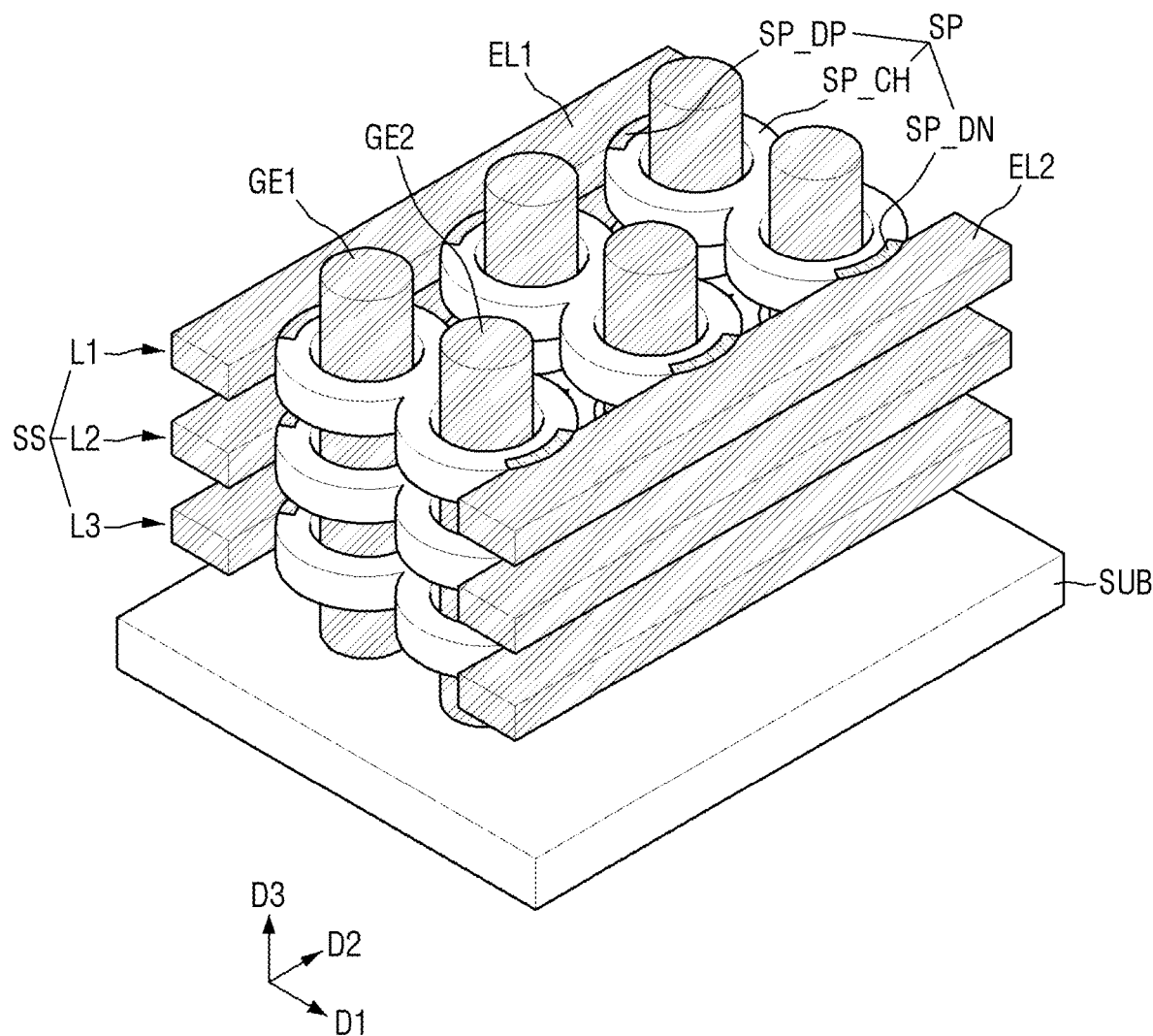
Figure 7:
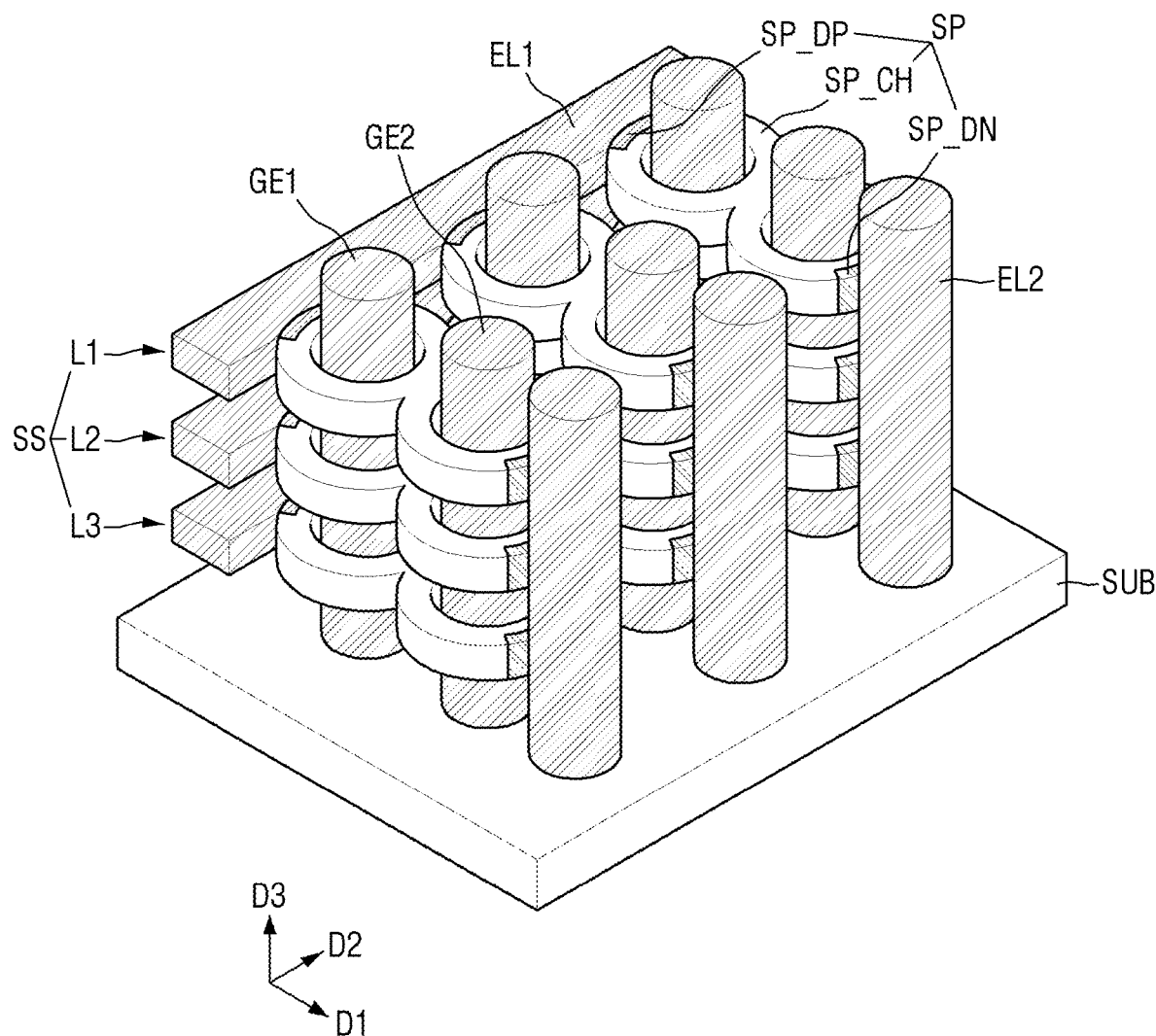

FIGS. 4 to 8B are example perspective views showing a semiconductor memory device according to some example embodiments, respectively. For reference, FIGS. 4, 5, 8A and 8B may be perspective views of a semiconductor memory device having the circuit diagrams shown in FIGS. 1A and 1B. FIGS. 6 and 7 may be perspective views of a semiconductor memory device having the circuit diagram shown in FIG. 2A.

First, referring to FIGS. 1A and 4, a cell array region CA in which a plurality of unit cells described using FIG. 1A are gathered may be placed on the substrate SUB.

The substrate SUB may be or may include a bulk silicon or SOI silicon-on-insulator. The substrate SUB may be or may include a single-crystal or polycrystalline silicon substrate, and/or may include other materials, but are not limited to, for example, at least one of silicon germanium, SGOI (silicon germanium on insulator), indium antimonide, lead tellurium compounds, indium arsenide, indium phosphide, gallium arsenide or gallium antimonide. In the following description, the substrate SUB will be described as a silicon substrate. The substrate SUB may be undoped, or may be lightly doped.

A stacked structure SS including the first to third layers L1, L2, and L3 may be placed on the substrate SUB. The first to third layers L1, L2, and L3 of the stacked structure SS may be stacked to be spaced apart from each other in a direction perpendicular to the upper face of the substrate SUB (that is, a third direction D3). Each of the first to third layers L1, L2, and L3 may include a plurality of semiconductor patterns SP, a first gate electrode GE1, a first conductive connecting line EL1, and a second conductive connecting line EL2.

From a planar perspective, each semiconductor pattern SP may have a closed-loop shape. For example, the closed loop may have an annular shape. Alternatively, the closed loop may have a loop shape having a polygonal shape such as a rectangular shape/square shape with a chamfered outer peripheral surface.

The semiconductor patterns SP may include semiconductor materials such as silicon, germanium, silicon-germanium (SiGe), silicon carbide (SiC), metal oxide or two-dimensional (2D) material. As an example, the semiconductor patterns SP may include polysilicon. Alternatively or additionally, the semiconductor patterns SP may include an amorphous metal oxide, a polycrystalline metal oxide or a combination of the amorphous metal oxide and the polycrystalline metal oxide. When the semiconductor patterns SP include the metal oxide, the semiconductor patterns SP may include, but is not limited to, for example, one or more of indium oxide, tin oxide, zinc oxide, In—Zn-based oxide (IZO), Sn—Zn-based oxide, Ba—Sn-based oxide, Al—Zn-based oxide, Zn—Mg-based oxide, Sn—Mg-based oxide, In—Mg-based oxide, In—Ga-based oxide (IGO), In—Ga—Zn-based oxide (IGZO), In—Al—Zn-based oxide, In—Sn—Zn-based oxide (ITZO), In—W—Zn-based oxide (IWZO), Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Alternatively or additionally, when the semiconductor patterns SP include a two-dimensional material, the semiconductor patterns SP may include, but are not limited to, for example, at least one of a two-dimensional allotrope or a two-dimensional compound, and may include, for example, at least one of graphene, copper sulfide ($CuS_2$), copper diselenide (CuSe$_2$), molybdenum disulfide (MoS$_2$), molybdenum diselenide (MoSe$_2$), tungsten diselenide (WSe$_2$), and tungsten disulfide (WS$_2$).

The first gate electrode GE1 may have a line shape or a pillar shape extending in the third direction D3. The respective first gate electrodes GE1 may be placed apart from each other along the second direction D2.

The first gate electrode GE1 may penetrate the semiconductor pattern SP. The first gate electrode GE1 may pass through a closed loop. The first gate electrode GE1 is not be in contact with the semiconductor pattern SP, and may be separated from the semiconductor pattern SP. The first gate electrode GE1 may be the gate electrode of the first transistor T1 described in FIGS. 1A and 1B.

The first conductive connecting line EL1 may have a line shape and/or bar shape that extends in the second direction D2. The first conductive connecting lines EL1 may be placed apart from each other along the third direction D3. The first conductive connecting line EL1 may be electrically connected to, e.g. directly connected to, the semiconductor pattern SP.

The second conductive connecting line EL2 may have a line shape and/or a pillar shape extending in the third direction D3. The second conductive connecting line EL2 may be spaced apart from the first gate electrode GE1 in the first direction D1. The second conductive connecting lines EL2 may be spaced apart from each other along the second direction D2. The second conductive connecting line EL2 may be electrically connected to the semiconductor pattern SP.

As an example, the first conductive connecting line EL1 may be a bit line which applies a bit line voltage ($V_{BL}$ of FIG. 1A). The second conductive connecting line EL2 may be a source supply line which applies a source voltage ($V_S$ of FIG. 1A). As another example, the second conductive connecting line EL2 may be a bit line which applies the bit line voltage ($V_{BL}$ of FIG. 1A). The first conductive connecting line EL1 may be or correspond to a source supply line which supplies the source voltage ($V_S$ of FIG. 1A).

The first gate electrode GE1 may include a conductive material. For example, the first gate electrode GE1 may include, but is not limited to, at least one of a conductive metal nitride (titanium nitride, tantalum nitride, niobium nitride (NbN), or the like), a metal (tungsten, titanium, tantalum, cobalt, ruthenium, or the like), and a metal-semiconductor compound (tungsten silicide, cobalt silicide, titanium silicide, or the like). The first conductive connecting line EL1 and the second conductive connecting line EL2 may each include, but are not limited to, for example, at least one of a conductive metal nitride and a metal. The first conductive line EL1 and the second conductive line EL2 may include the same, or different, materials.

A first layer L1 among the first to third layers L1, L2, and L3 will be representatively described in detail. The semiconductor patterns SP of the first layer L1 may be arranged in the second direction D2. The semiconductor patterns SP of the first layer L1 may be located at the same level as each other. The first gate electrode GE1 and the second conductive connecting line EL2 may be sequentially arranged in the first direction D1. The first gate electrode GE1 may pass through the semiconductor pattern SP. The semiconductor patterns SP arranged in the second direction D2 may be connected to the first conductive connecting line EL1 placed on the first layer L1. Further, the semiconductor patterns SP arranged in the third direction D3 may be connected to the second conductive connecting line EL2 extending in the third direction D3.

Although not shown, a gate insulating film may be interposed between the first gate electrode GE1 and the semiconductor pattern SP. The gate insulating film may include a charge holding film. The charge holding film may include, for example, at least one of silicon nitride (SiN), zirconium oxynitride (ZrON), hafnium oxide (HfO), hafnium oxynitride (HfON), hafnium aluminum oxide (HfAlO), yttrium oxide (YO), terbium oxidation (TbO), tantalum oxide (TaO), and aluminum oxide (AlO). In the following description, the charge holding film will be described as including silicon nitride. For example, the charge holding film may include a silicon nitride film.

Further, the gate insulating film may further include at least one of a charge blocking film and a charge tunneling film. The charge blocking film and the charge tunneling film may each include, for example, a silicon oxide. For example, the charge blocking film and the charge tunneling film may each include a silicon oxide film.

Although not shown, the empty spaces in the stacked structure SS may be filled with the insulating material. For example, the insulating material may include at least one of a silicon oxide film, a silicon nitride film, and a silicon oxynitride film. A wiring layer electrically connected to the cell array CA may be placed on the stacked structure SS. Although not shown, a peripheral circuit which operates the cell array CA may be formed on the substrate SUB. The peripheral circuit and the cell array may be connected, using the wiring layer.

Some example embodiments according to FIG. 5 will be described focusing on the points different from those described using FIG. 4.

Referring to FIG. 5, the second conductive connecting line EL2 may have a line shape and/or a bar shape extending in the second direction D2. The second conductive connecting line EL2 may be placed apart from each other along the third direction D3. The second conductive connecting line EL2 may be placed side by side with the first conductive connecting line EL1.

For example, the semiconductor patterns SP placed on the first layer L1 and arranged in the second direction D2 may be electrically connected to the second conductive connecting line EL2 placed on the first layer L1.

Some example embodiments according to FIGS. 6 and 7 will be described focusing on the points different from those described using FIGS. 4 and 5.

Referring to FIGS. 6 and 7, the semiconductor memory device according to some example embodiments may further include a second gate electrode GE2.

From a planar view point, each semiconductor pattern SP may have a shape in which a plurality of closed-loops is connected. For example, each closed loop may have an annular shape. Alternatively, each closed loop may have a loop shape having a polygonal shape such as rectangular shape/square shape with a chamfered outer peripheral surface.

Each semiconductor pattern SP may include a channel region SP_CH, a first impurity region SP_DP, and a second impurity region SP_DN. The channel region SP_CH to which the closed loop is connected may extend in the first direction D1. The channel region SP_CH may be interposed between the first and second impurity regions SP_DP and SP_DN. The channel region SP_CH may correspond to the base region (base) described referring to FIG. 3A. The first impurity region SP_DP corresponds to the p-type impurity region (p+) described referring to FIG. 3A, and the second impurity region SP_DN may correspond to the n-type impurity region (n+) described referring to FIG. 3A.

As an example, the first conductive connecting line EL1 may be a bit line which applies the bit line voltage ($V_{BL}$ of FIG. 3A). The second conductive connecting line EL2 may be a source supply line which applies the source voltage ($V_S$ of FIG. 3A).

As another example, the second conductive connecting line EL2 may be a bit line which applies the bit line voltage ($V_{BL}$ of FIG. 3A). The first conductive connecting line EL1 may be a source supply line which applies the source voltage ($V_S$ of FIG. 3A). In such a case, unlike those shown in FIGS. 6 and 7, the position of the first impurity region SP_DP and the position of the second impurity region SP_DN change.

The second gate electrode GE2 may have a line shape and/or a pillar shape extending in the third direction D3. The respective second gate electrodes GE2 may be placed apart from each other along the second direction D2. The first gate electrode GE1 may be spaced apart from the second gate electrode GE2 in the first direction D1. The first gate electrode GE1 and the second gate electrode GE2 may each penetrate the channel region SP_CH. The first gate electrode GE1 and the second gate electrode GE2 may each pass through a closed loop. The first gate electrode GE1 and the second gate electrode GE2 are not in contact with/are isolated from the channel region SP_CH, and may be spaced apart from the channel region SP_CH. The first gate electrode GE1 and the second gate electrode GE2 may be the gate electrodes of the first and second control transistors T2N and T2P described in FIGS. 2A and 3A. The second gate electrode GE2 may include a conductive material.

The first conductive connecting line EL1 may be in contact with the first impurity region SP_DP and electrically connected to the first impurity region SP_DP. The second conductive connecting line EL2 may be in contact with the second impurity region SP_DN and electrically connected to the second impurity region SP_DN.

Although not shown, a gate insulating film may be interposed between the first gate electrode GE1 and the channel region SP_CH, and between the second gate electrode GE2 and the channel region SP_CH. The gate insulating film may include a charge holding film. Further, the gate insulating film may further include at least one of a charge blocking film and a charge tunneling film.

Figure 8A:
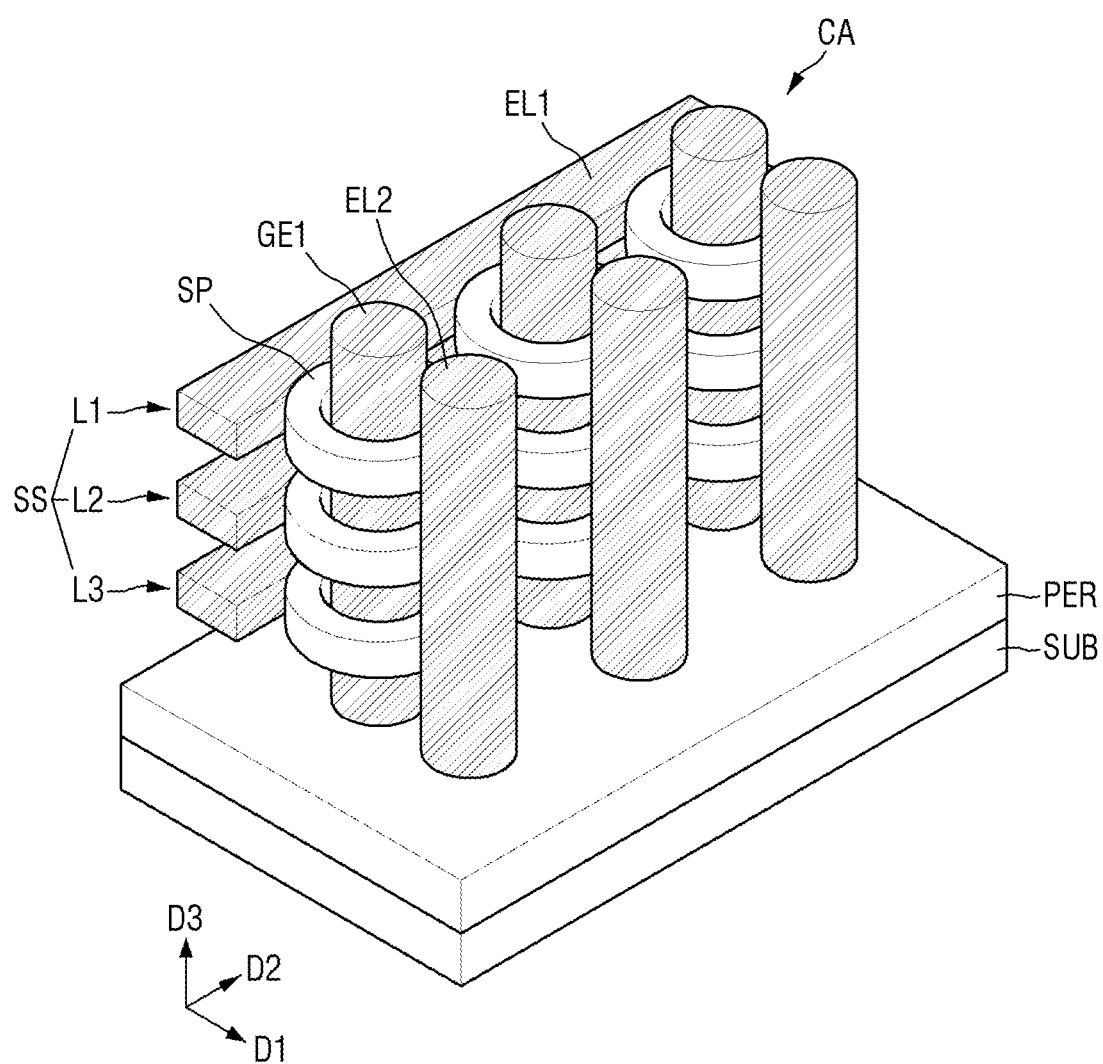
Figure 8B:
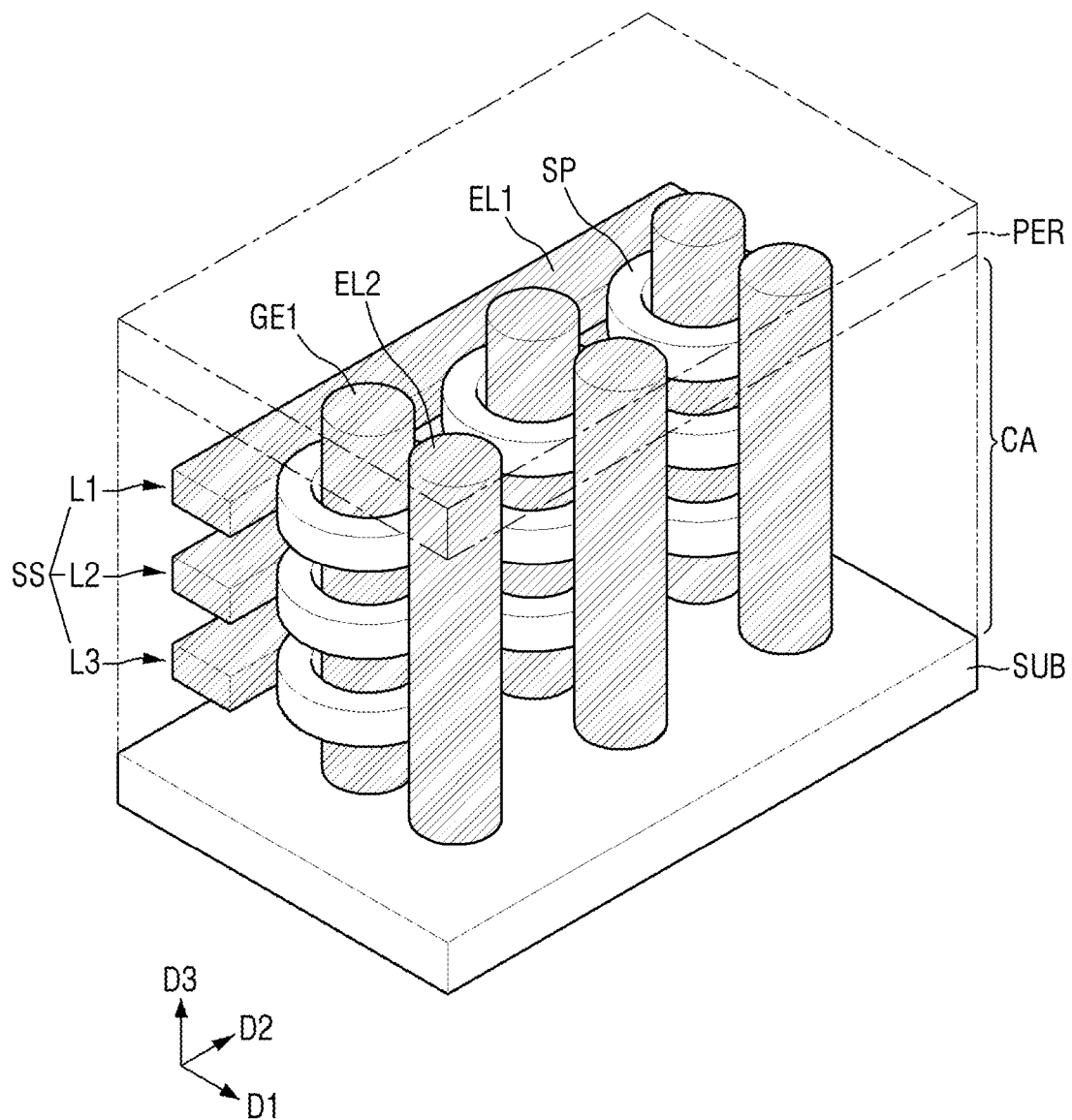

Referring to FIGS. 8A and 8B, the peripheral circuit region PER and the cell array CA may be stacked in the vertical direction (i.e., the third direction D3).

In FIG. 8A, the peripheral circuit region PER may be placed between the substrate SUB and the cell arrays CA. The peripheral circuit region PER may include peripheral circuit transistors formed on the substrate SUB. The peripheral circuit region PER may include a circuit for operating the memory cell array according to the embodiments of the present disclosure.

The cell array CA may be electrically connected to the peripheral circuit region PER through, for example, a through electrode and/or the like. Alternatively, the first gate electrode GE1 and the second conductive connecting line EL2 of the cell array CA may be directly connected to the peripheral circuit region PER.

In FIG. 8B, the cell array CA may be placed on the substrate SUB. The peripheral circuit region PER may be placed on the cell array CA. As mentioned above, the peripheral circuit region PER may include a circuit for operating the cell array CA.

As an example, the first direction D1, the second direction D2 and the third direction D3 may each be, but are not limited to, perpendicular to one another. Further, the first direction D1 and the second direction D2 may be parallel to the upper face of the substrate SUB, and the third direction D3 may be perpendicular to the upper face of the substrate SUB.

Figure 9:
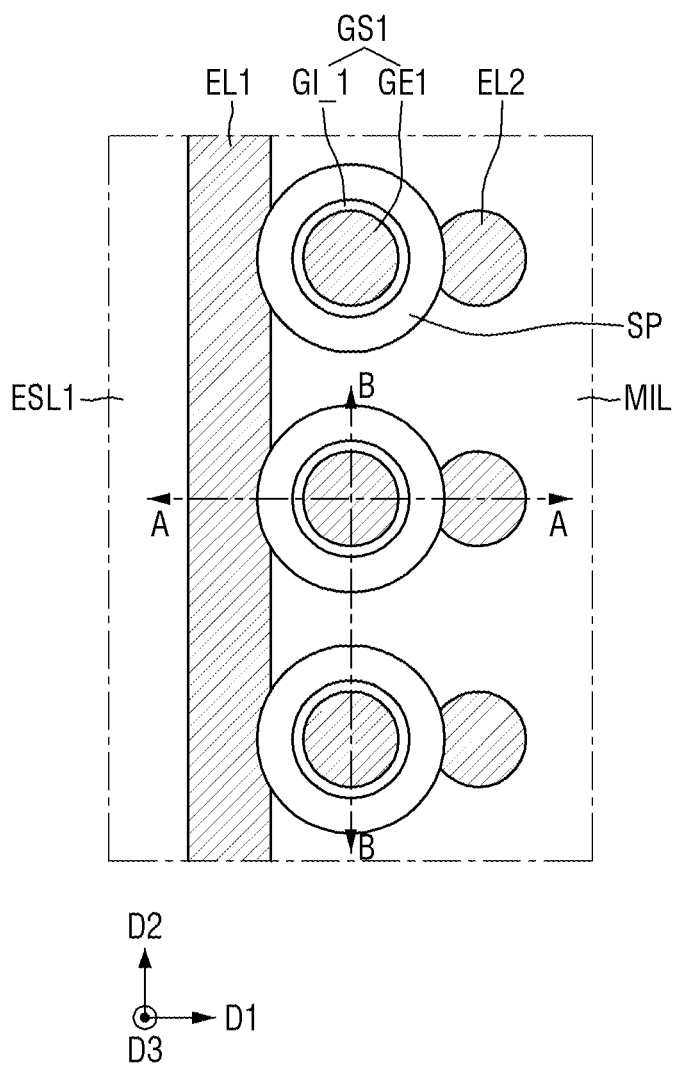
FIGS. 9 to 11 are diagrams for explaining the semiconductor memory device according to some example embodiments.
Figure 10:
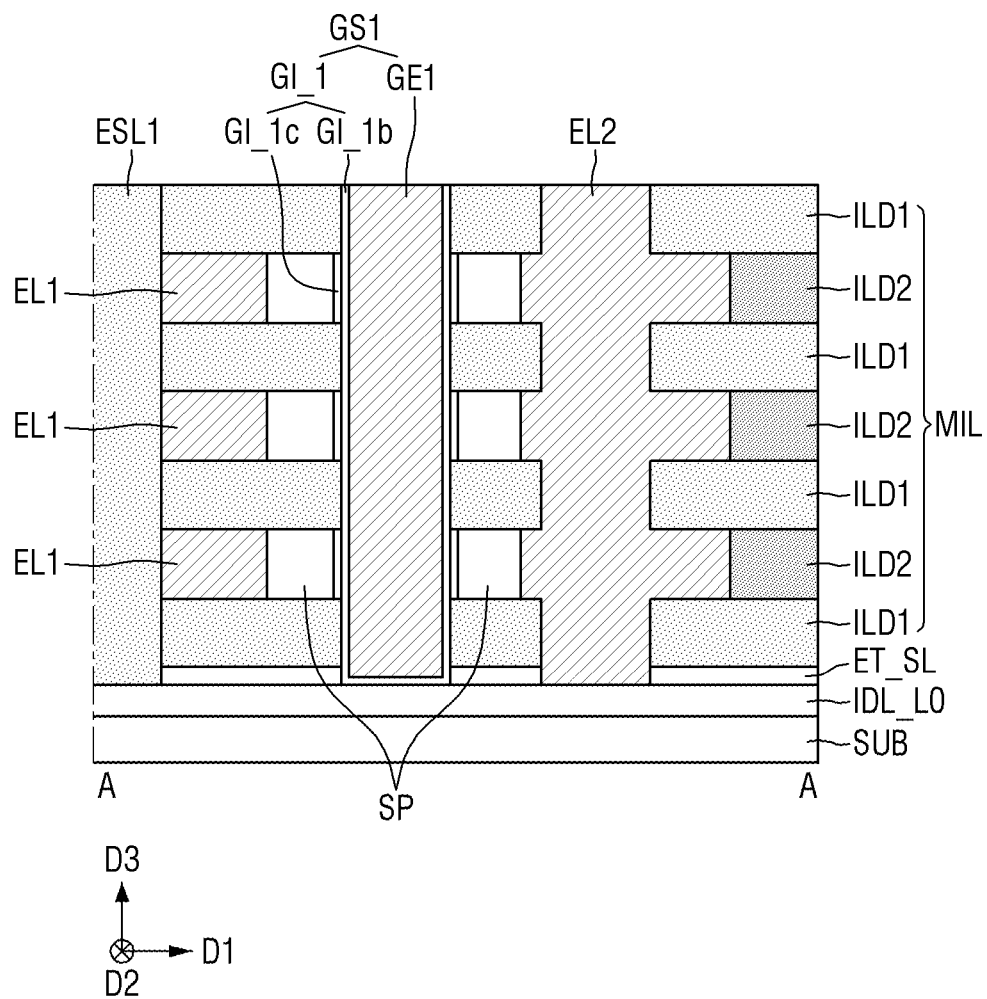
Figure 11:
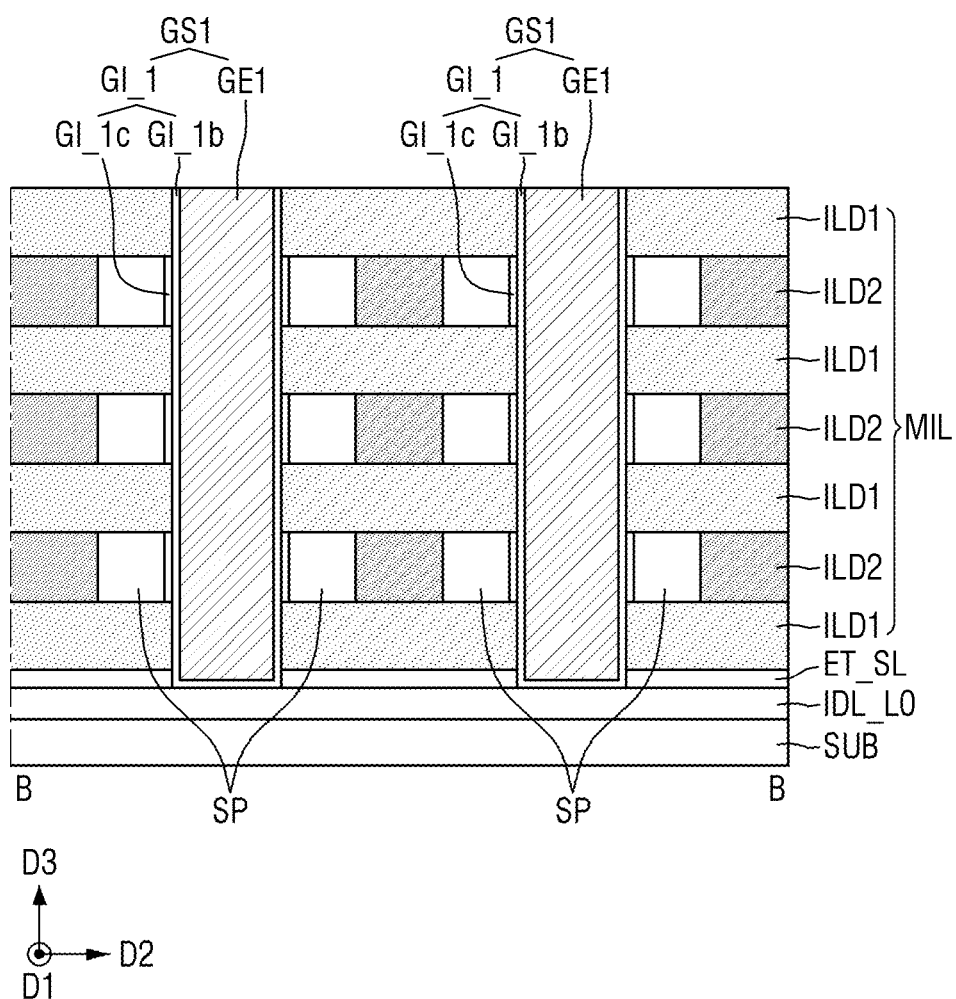

FIGS. 9 to 11 are diagrams for explaining the semiconductor memory device according to some example embodiments. For convenience of explanation, repeated parts of contents described using FIGS. 1A, 1B and 4 will be briefly described. For reference, FIG. 9 is a plan view showing a semiconductor memory device according to some example embodiments. FIGS. 10 and 11 are cross-sectional views taken along lines A-A and B-B of FIG. 9.

Referring to FIGS. 9 to 11, the semiconductor memory devices according to some example embodiments may include a semiconductor pattern SP, a first conductive connecting line EL1, a second conductive connecting line EL2, and a first gate structure GS1.

A lower interlayer insulating film ILD_LO may be placed on the substrate SUB. The lower interlayer insulating film ILD_LO may include, for example, at least one of silicon oxide, silicon nitride and silicon oxynitride. Unlike the shown configuration, the lower interlayer insulating film ILD_LO may not be formed.

An etching stop film ET_SL may be placed on the lower interlayer insulating film ILD_LO. The etching stop film ET_SL may include an insulating material. The etching stop film ET_SL may include a material having an etching selectivity to the material included in the mold structure MIL.

The mold structure MIL may be placed on the etching stop film ET_SL. The mold structure MIL may include a first mold insulating layer ILD1 and a second mold insulating layer ILD2. The mold structure MIL may include a first mold insulating layer ILD1 and a second mold insulating layer ILD2 alternately stacked on the etching stop film ET_SL.

Although FIGS. 10 and 11 show that the number of the first mold insulating layers ILD1 is four and the number of the second mold insulating layers ILD2 is three, this is only for convenience of explanation, and example embodiments are not limited thereto. Further, although the mold structure MIL directly adjacent to the etching stop film ET_SL is shown as the first mold insulating layer ILD1, example embodiments is not limited thereto. Furthermore a thickness of each of the first mold insulating layers ILD1 may be the same as, or different from, a thickness of each of the second mold insulating layers ILD2.

The first mold insulating layer ILD1 and the second mold insulating layer ILD2 may each include an insulating material, and may include different materials. The first insulating material included in the first mold insulating layer ILD1 may have an etching selectivity to the second insulating material included in the second mold insulating layer ILD2. The first mold insulating layer ILD1 and the second mold insulating layer ILD2 may include, for example, at least one of silicon oxide film, silicon nitride film, silicon oxynitride film, carbon-containing silicon oxide film, carbon-containing silicon nitride film, and carbon-containing silicon oxynitride film. As an example, the first mold insulating layer ILD1 may include a silicon oxide film, and the second mold insulating layer ILD2 may include a silicon nitride film. For example, the mold structure MIL may be an ON (oxide/nitride) mold structure.

A plurality of semiconductor patterns SP may be placed on the substrate SUB. The semiconductor patterns SP may be placed along the second direction D2. Further, the semiconductor patterns SP may be stacked along the third direction D3. The semiconductor patterns SP stacked in the third direction D3 may be separated from each other. The semiconductor patterns SP stacked in the third direction D3 may be placed between the adjacent first mold insulating layers ILD1 or between the adjacent second mold insulating layers ILD2. As an example, in the semiconductor memory device according to some example embodiments, the first mold insulating layer ILD1 may be placed between the semiconductor patterns SP adjacent to each other in the third direction D3. Further, the second mold insulating layer ILD2 may be placed between the semiconductor patterns SP adjacent to each other in the second direction D2. The second mold insulating layer ILD2 may be in contact with/direct contact with the semiconductor patterns SP adjacent to each other in the second direction D2. A thickness of each of the semiconductor patterns SP may be the same as a thickness of each of the second mold patterns ILD2.

The semiconductor patterns SP may include semiconductor materials such as silicon, germanium, silicon-germanium, silicon carbide, metal oxides or two-dimensional materials and may be in polycrystalline phase.

In the semiconductor memory device according to some example embodiments, the semiconductor patterns SP may be formed of an undoped semiconductor material, a semiconductor material doped with p-type impurities, or a semiconductor material doped with n-type impurities.

The first gate structure GS1 may be placed on the substrate SUB. The first gate structure GS1 may extend long in the third direction D3. The first gate structure GS1 may penetrate the semiconductor pattern SP. The first gate structure GS1 may penetrate the mold structure MIL.

At least a part of the first gate structure GS1 may be surrounded by the semiconductor pattern SP. In the semiconductor memory device according to some example embodiments, in the region in which the first gate structure GS1 and the semiconductor pattern SP intersect, the semiconductor pattern SP may entirely surround the side walls of the first gate structure GS1 extending in the third direction D3.

The first gate structure GS1 may include a first gate electrode GE1 and a first gate insulating film GI_1. The first gate electrode GE1 may extend in the third direction D3 and penetrate the semiconductor pattern SP. The first gate insulating film GI_1 may be placed between the first gate electrode GE1 and the semiconductor pattern SP.

The first gate insulating film GI_1 may include a first charge holding film GI_1c and a first charge blocking film GI_1b. The first charge holding film GI_1c may serve as a charge trap site of FIG. 1A. Additionally, the first charge holding film GI_1c may also serve as a gate insulating film of the transistor.

For example, the first charge holding film GI_1c may be placed between the first charge blocking film GI_1b and the semiconductor pattern SP. Described in another way, the first charge blocking film GI_1b may be placed between the first charge holding film GI_1c and the first gate electrode GE1. In the semiconductor memory device according to some example embodiments, the first charge holding film GI_1c may be in contact with/in direct contact with the semiconductor pattern SP.

The first charge blocking film GI_1b may extend along the side walls and bottom face of the first gate electrode GE1. The first charge blocking film GI_1b may extend along the side walls of the first mold insulating layer ILD1 located above and below the semiconductor pattern SP. For example, the first charge blocking film GI_1b may be placed between the first gate electrode GE and the semiconductor pattern SP, and between the first gate electrode GE1 and the first mold insulating layer ILD1.

The first charge holding film GI_1c may be placed in the region in which the first gate electrode GE and the semiconductor pattern SP intersect/contact one another. The first charge holding film GI_1c may not be placed in a region in which the first gate electrode GE and the semiconductor pattern SP do not intersect. For example, the first charge holding film GI_1c may not extend along the side walls of the first mold insulating layer ILD1 located above and below the semiconductor pattern SP. Described in another way, the semiconductor pattern SP may include a first semiconductor pattern and a second semiconductor pattern adjacent to each other in the third direction D3. A first charge holding film may be formed in the region in which the first semiconductor pattern and the first gate electrode GE1 intersect. A second charge holding film may be formed in the region in which the second semiconductor pattern and the first gate electrode GE1 intersect. The first charge holding film is separated from the second charge holding film in the third direction D3. The first charge holding film is not connected to the second charge holding film.

Although the first gate electrode GE1 is shown as a single film, this is only for convenience of explanation, and the embodiment is not limited thereto. As an example, the first gate electrode GE1 may include a work function adjusting film. The first gate electrode GE1 may include at least one of a conductive metal nitride, a metal, and a metal-semiconductor compound.

The first charge holding film GI_1c may include, for example, a silicon nitride film. The first charge blocking film GI_1b may include, for example, a silicon oxide film.

The first conductive connecting line EL1 may be connected to the semiconductor pattern SP. The first conductive connecting line EL1 may extend long in the second direction D2. The first conductive connecting line EL1 may be aligned with the upper face of the substrate SUB. The first conductive connecting line EL1 is connected to the semiconductor patterns SP placed along the second direction D2.

The first conductive connecting line EL1 may be placed between the first mold insulating layers ILD1 separated from each other in the third direction D3. The first conductive connecting lines EL1 adjacent to each other the third direction D3 are separated by the first mold insulating layer ILD1 and the first electrode separation pattern ESL1. The first electrode separation pattern ESL1 may extend long in the second direction D2. The first electrode separation pattern ESL1 may include an insulating material.

The second conductive connecting line EL2 may extend in the third direction D3. The second conductive connecting line EL2 is connected to the semiconductor pattern SP arranged in the third direction D3.

The first conductive connecting line EL1 and the second conductive connecting line EL2 may each include at least one of a conductive metal nitride and a metal.

In the semiconductor memory device according to some example embodiments, the first conductive connecting line EL1 and the second conductive connecting line EL2 may have a cross point (XP) structure.

Although the first gate structure GS1 and the second conductive connecting line EL2 are shown to penetrate the etching stop film ET_SL, example embodiments are not limited thereto.

FIGS. 12 to 18 are diagrams for explaining the semiconductor memory device according to some example embodiments, respectively. For convenience of explanation, points different from those described using FIGS. 4 and 9 to 11 will be mainly described.

Figure 12:
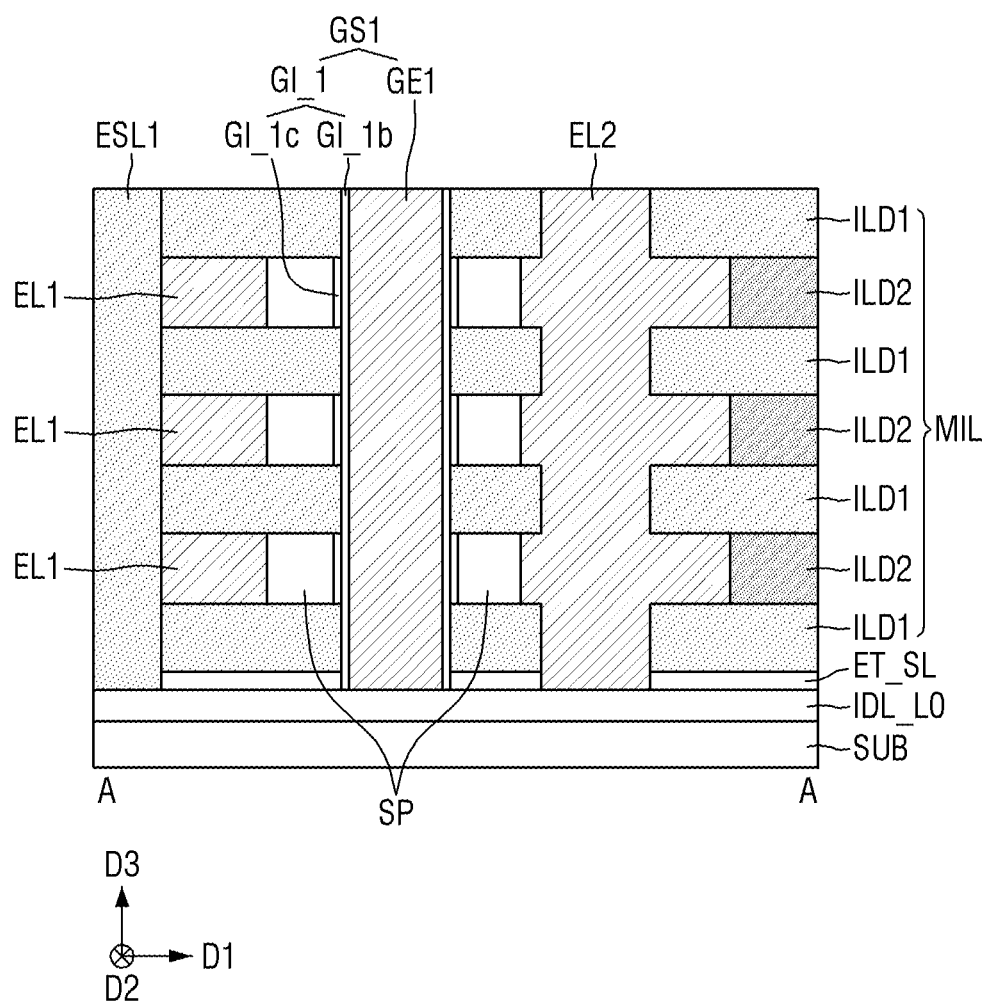
FIGS. 12 to 18 are diagrams for explaining the semiconductor memory devices according to some example embodiments, respectively.

Referring to FIG. 12, in the semiconductor memory device according to some example embodiments, the first charge blocking film GI_1b does not extend along the bottom face of the first gate electrode GE1.

The first charge blocking film GI_1b is not placed between the bottom face of the first gate electrode GE1 and the upper face of the substrate SUB.

Figure 13:
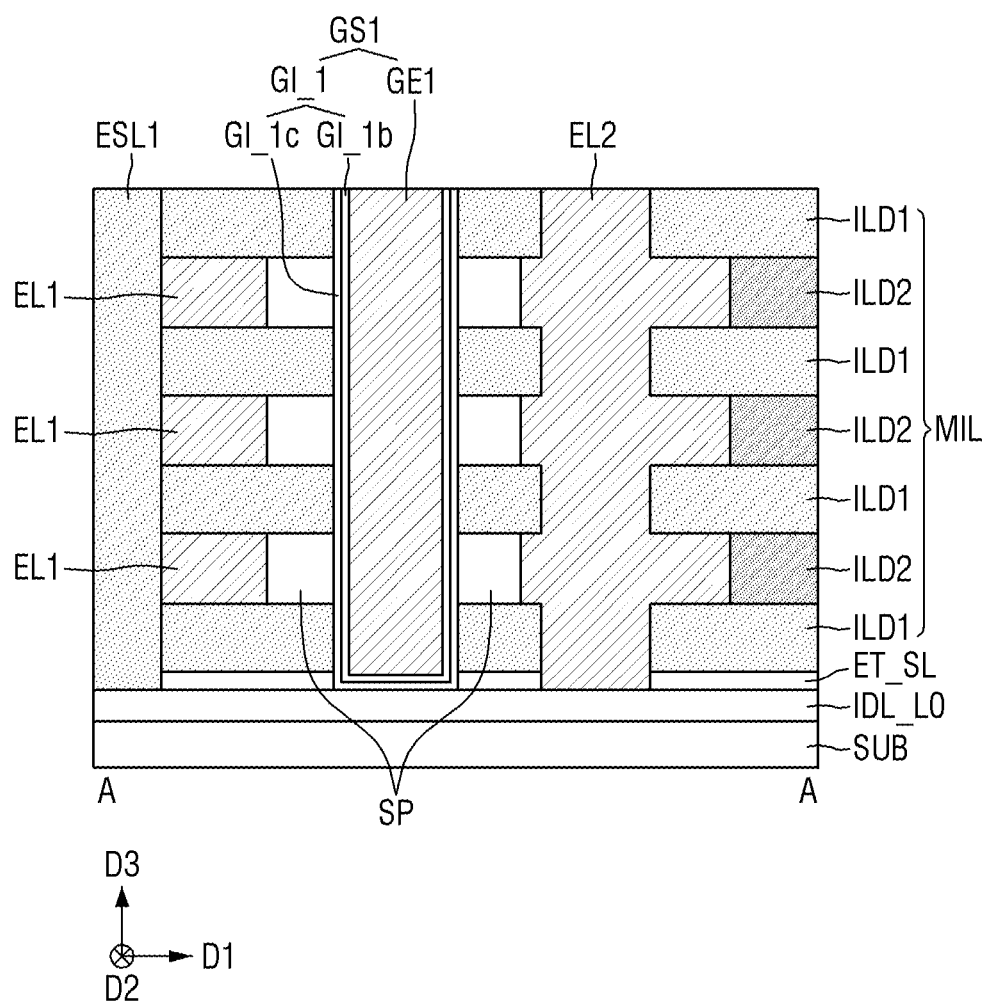

Referring to FIG. 13, in the semiconductor memory device according to some example embodiments, the first charge holding film GI_1c may extend along the side walls of the first mold insulating layer ILD1 placed above and below the semiconductor pattern SP.

The semiconductor pattern SP may include a first semiconductor pattern and a second semiconductor pattern adjacent to each other in the third direction D3. The first charge holding film may be formed in the region in which the first semiconductor pattern and the first gate electrode GE1 intersect. The second charge holding film may be formed in the region in which the second semiconductor pattern and the first gate electrode GE1 intersect. For example, the first charge holding film may be connected to the second charge holding film.

Figure 14:
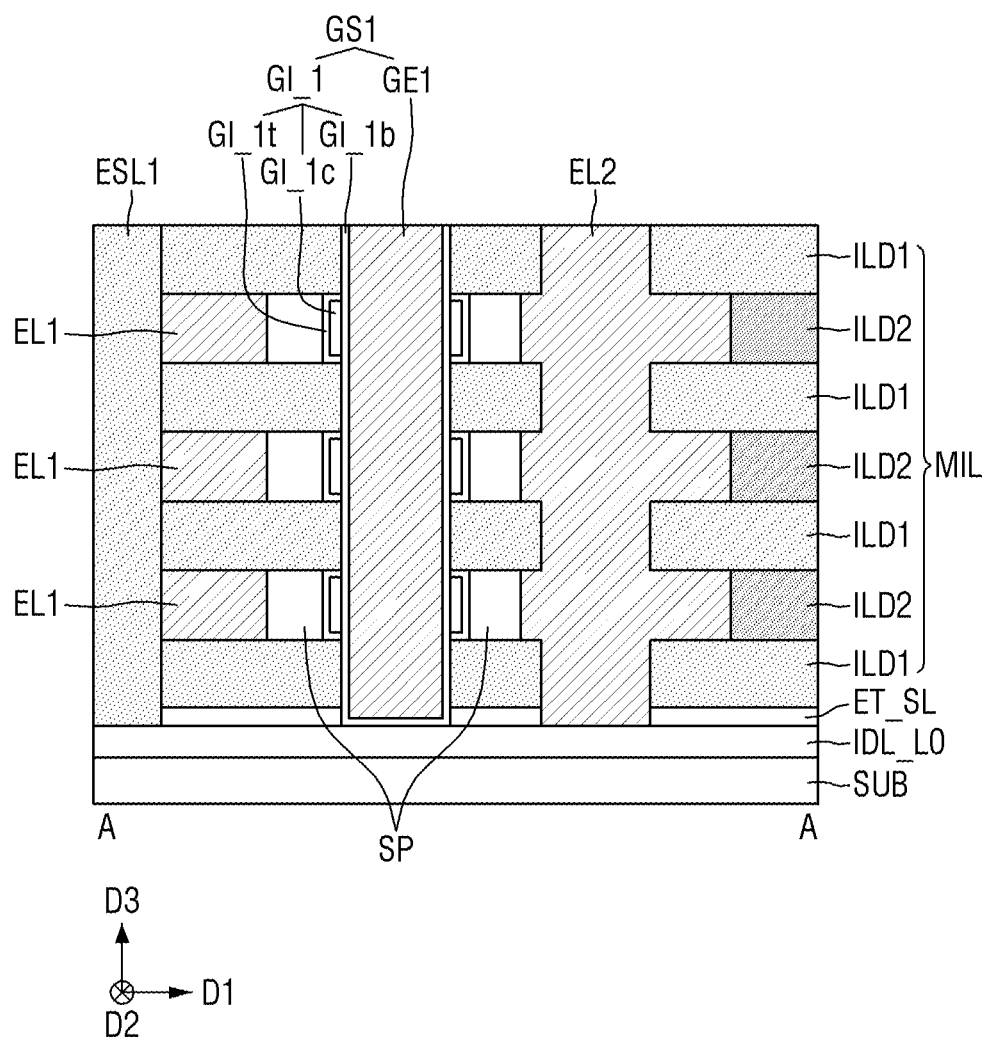

Referring to FIG. 14, in the semiconductor memory device according to some example embodiments, the first gate insulating film GI_1 may further include a first charge tunneling film GI_1t.

The first charge tunneling film GI_1t may be placed between the first charge holding film GI_1c and the semiconductor pattern SP. For example, the first charge tunneling film GI_1t may be in contact with the semiconductor pattern SP. The first charge tunneling film GI_1t may include, for example, a silicon oxide film.

Although the first charge tunneling film GI_1t is shown as not extending along the side wall of the first mold insulating layer ILD1, the embodiment is not limited thereto.

Figure 15:
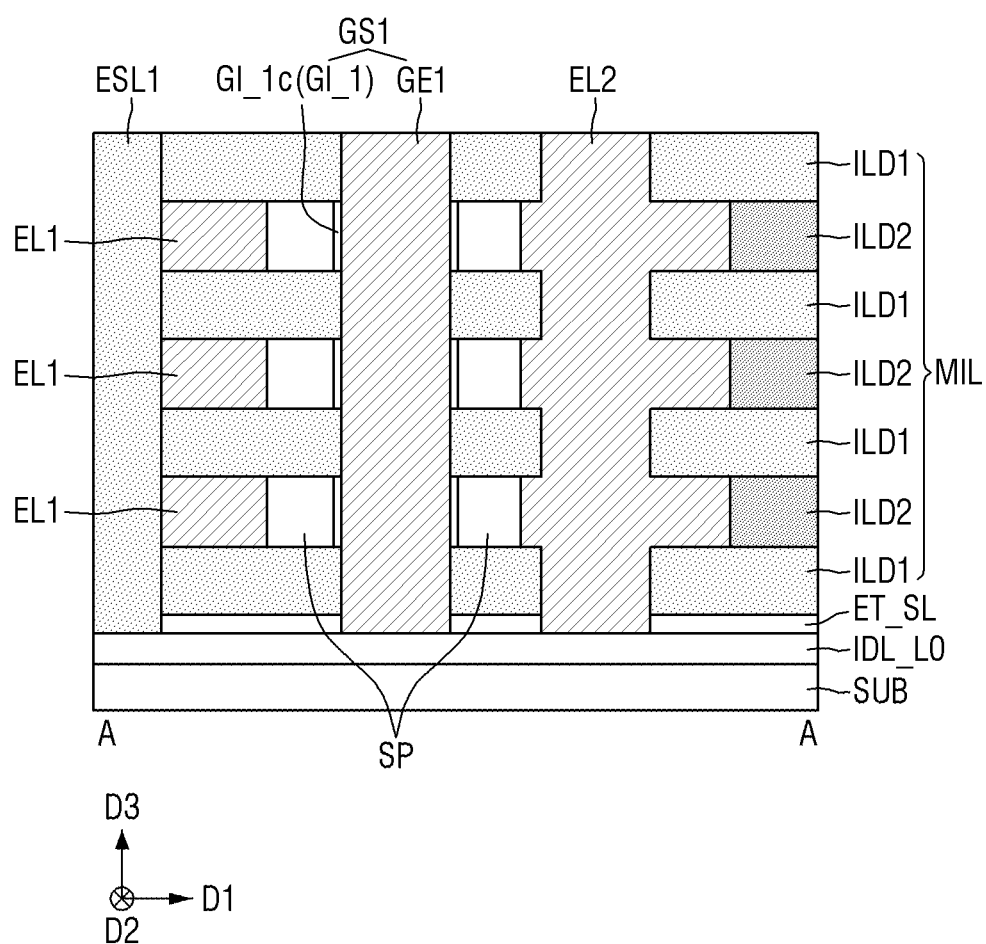

Referring to FIG. 15, in the semiconductor memory device according to some example embodiments, the first gate insulating film GI_1 may not include the first charge blocking film GI_1b.

For example, the first charge holding film GI_1c may be in contact with the semiconductor pattern SP and the first gate electrode GE1.

Figure 16:
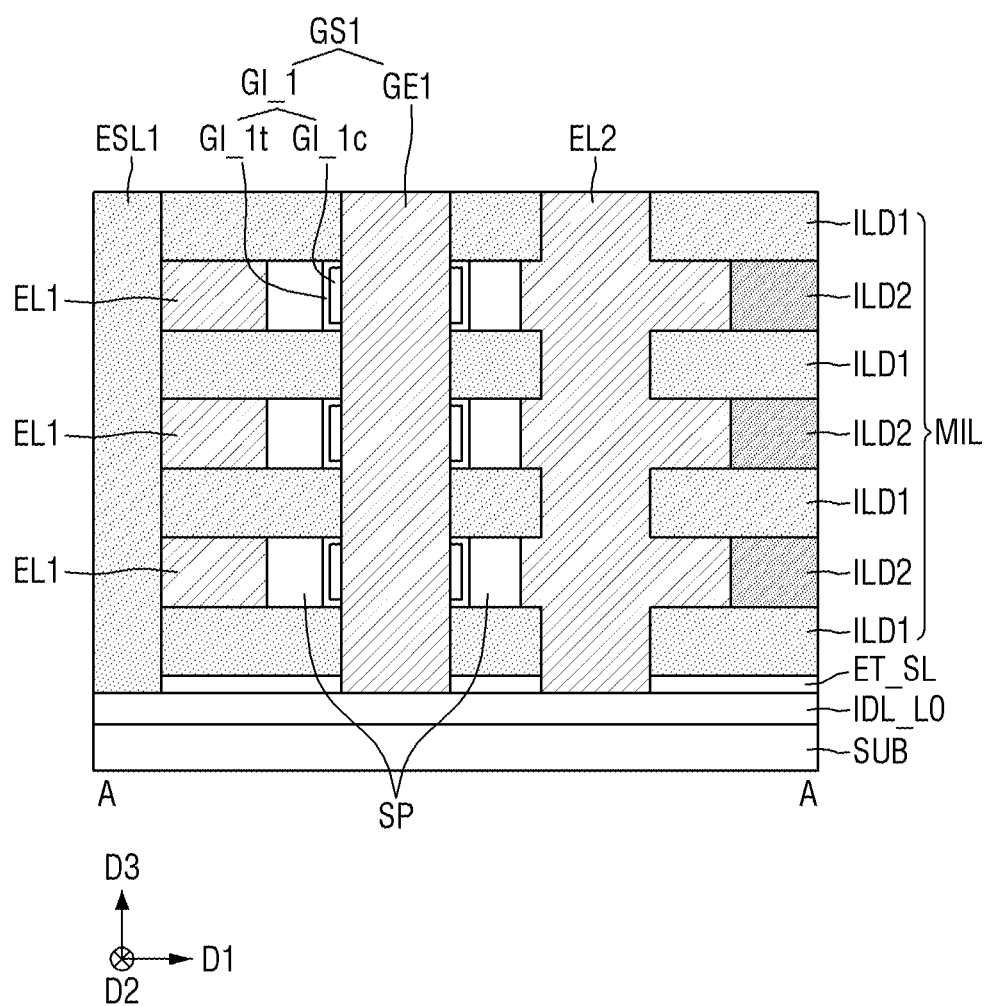

Referring to FIG. 16, in the semiconductor memory device according to some example embodiments, the first gate insulating film GI_1 may include a first charge holding film GI_1c and a first charge tunneling film GI_1t.

The first charge tunneling film GI_1t may be placed between the first charge holding film GI_1c and the semiconductor pattern SP. The first charge tunneling film GI_1t may be in contact with the semiconductor pattern SP.

Figure 17:
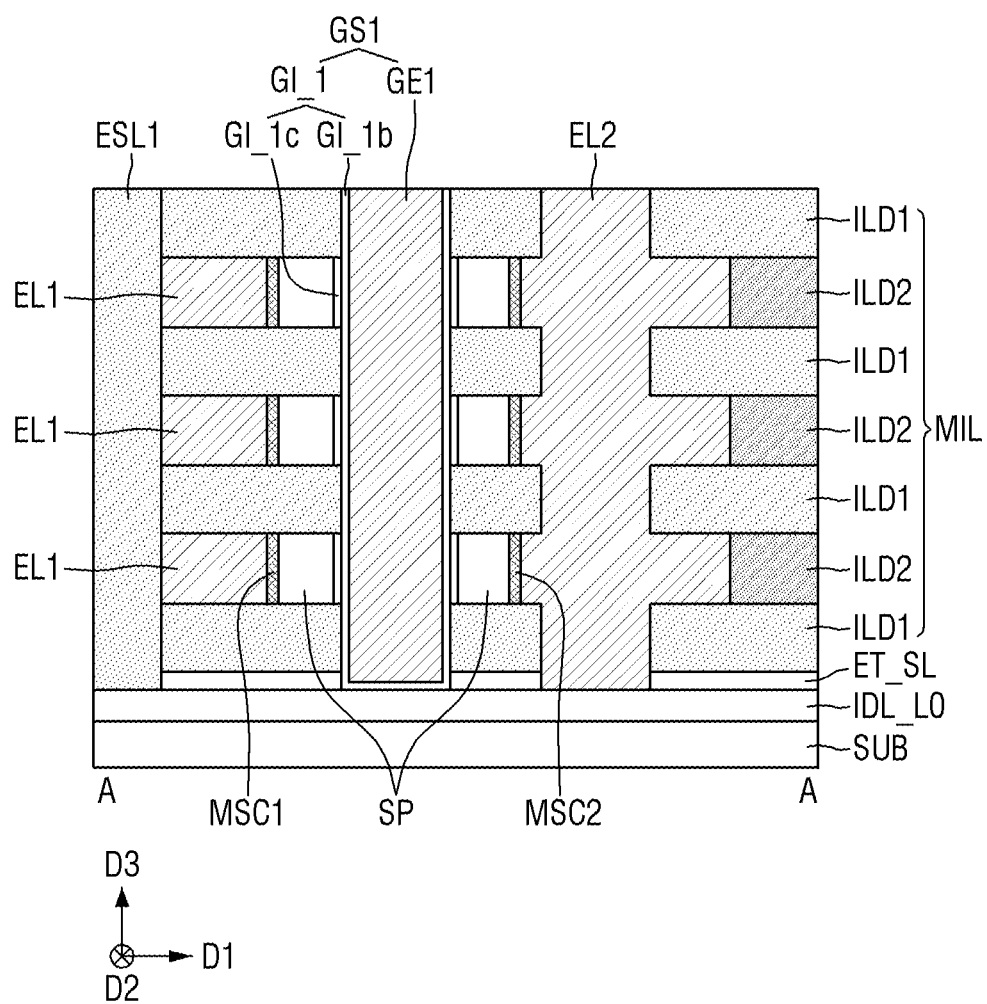

Referring to FIG. 17, the semiconductor memory device according to some example embodiments may further include a first silicide pattern MSC1 and a second silicide pattern MSC2.

The first silicide pattern MSC1 may be placed between the semiconductor pattern SP and the first conductive connecting line EL1. The second silicide pattern MSC2 may be placed between the semiconductor pattern SP and the second conductive connecting line EL2.

The first silicide pattern MSC1 and the second silicide pattern MSC2 may each include a metal-semiconductor compound.

Figure 18:
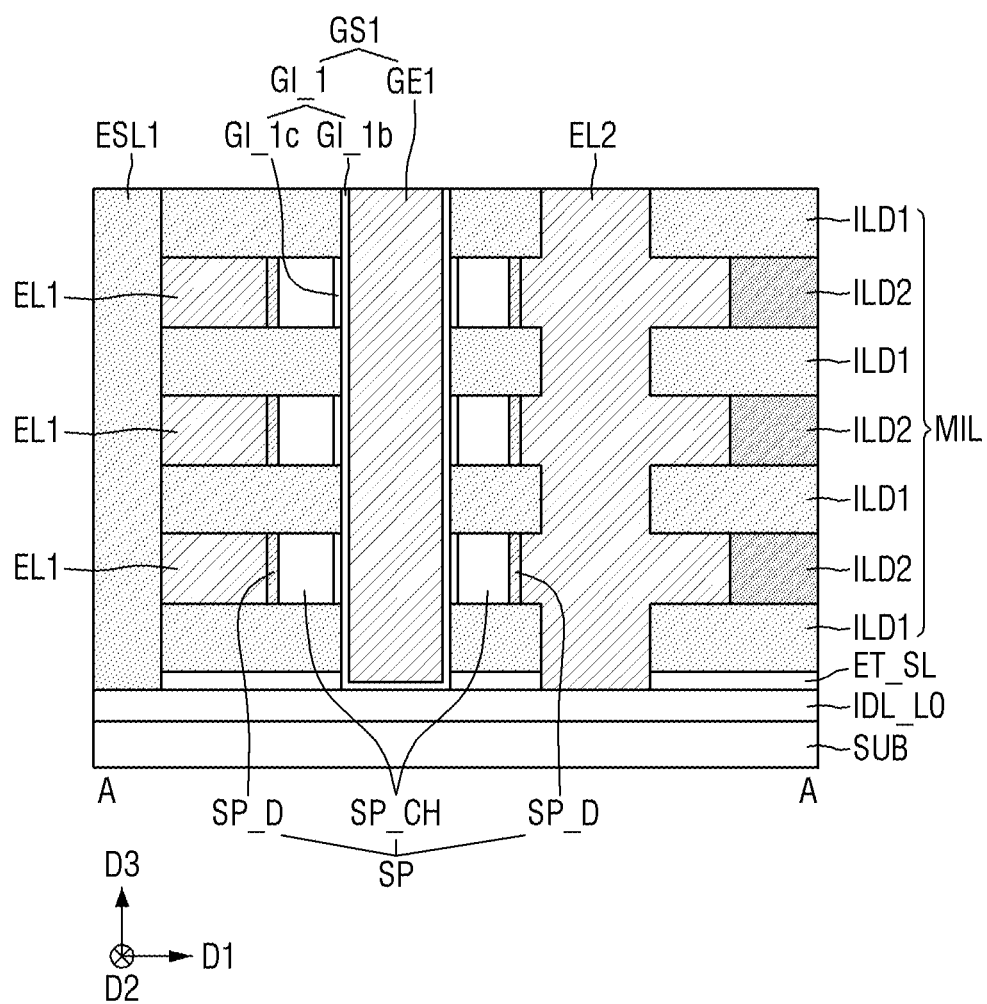

Referring to FIG. 18, in the semiconductor memory device according to some example embodiments, the semiconductor pattern SP may include a channel region SP_CH and an impurity region SP_D.

The impurity region SP_D may be placed between the first conductive connecting line EL1 and the channel region SP_CH, and between the second conductive connecting line EL2 and the channel region SP_CH. The first conductive connecting line EL1 and the second conductive connecting line EL1 may be connected to the impurity region SP_D.

As an example, when the channel region SP_CH is formed of an undoped semiconductor material, the impurity region SP_D may include p-type impurities and/or n-type impurities. As another example, when the channel region SP_CH is formed of a semiconductor material doped with p-type impurities, the impurity region SP_D may include n-type impurities. As still another example, when the channel region SP_CH is formed of a semiconductor material doped with n-type impurities, the impurity region SP_D may include p-type impurities.

The first gate electrode GE1 may penetrate the channel region SP_CH.

Figure 19:
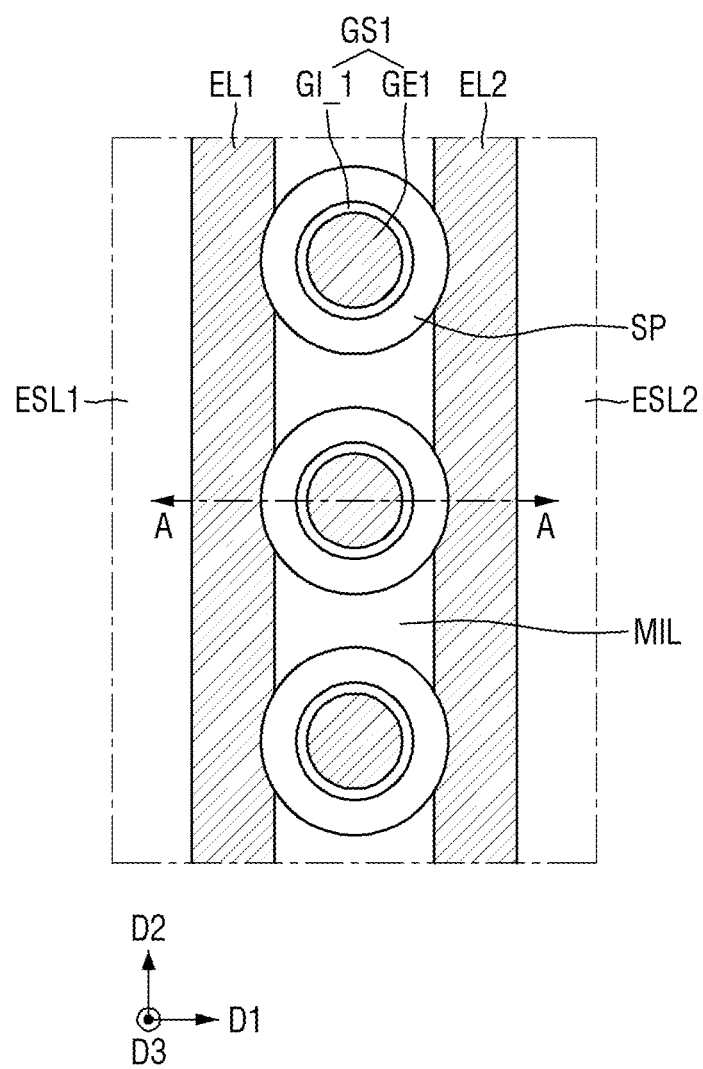
FIGS. 19 and 20 are diagrams for explaining the semiconductor memory device according to some example embodiments.
Figure 20:
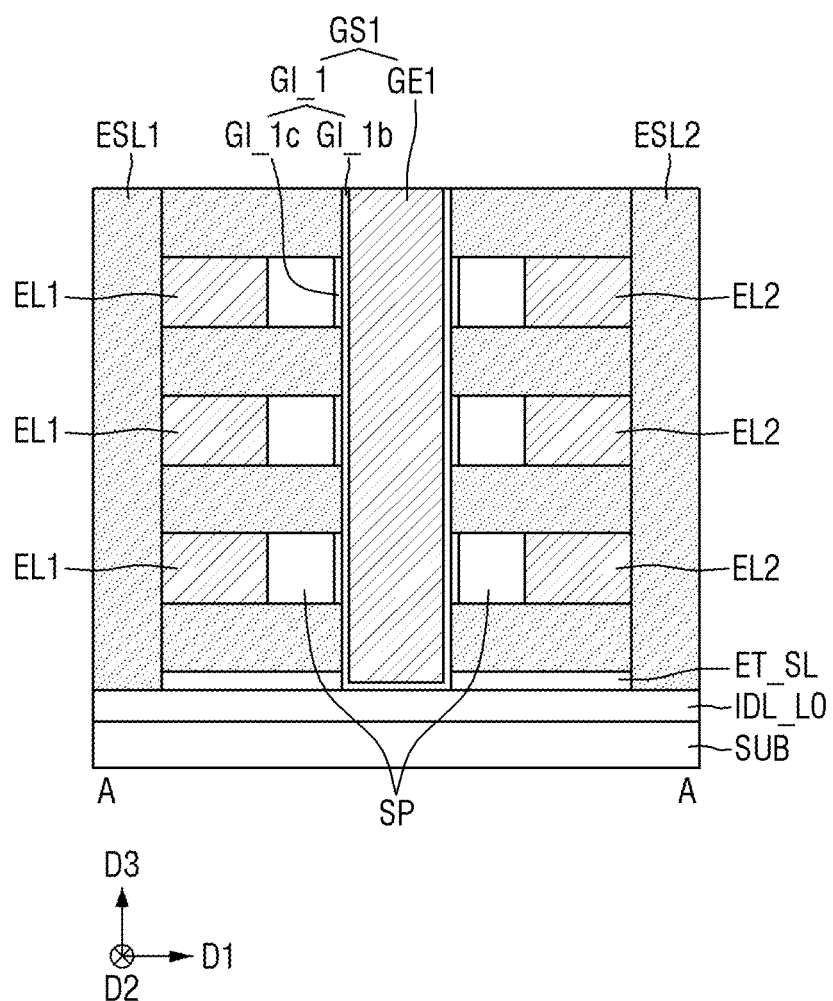

FIGS. 19 and 20 are diagrams for explaining the semiconductor memory device according to some example embodiments. For convenience of explanation, the points different from those described using FIGS. 9 to 11 will be mainly described. For reference, FIG. 19 is a plan view showing a semiconductor memory device according to some example embodiments. FIG. 20 is a cross-sectional view taken along a line A-A of FIG. 19.

Referring to FIGS. 19 and 20, in the semiconductor memory device according to some example embodiments, the second conductive connecting line EL2 may extend long in the second direction D2.

The second conductive connecting line EL2 may be aligned with the upper face of the substrate SUB. The second conductive connecting line EL2 is connected to the semiconductor patterns SP placed along the second direction D2.

The second conductive connecting line EL2 may be placed between the first mold insulating layers ILD1 separated from each other in the third direction D3. The second conductive connecting lines EL2 adjacent to each other in the third direction D3 are separated by the first mold insulating layer ILD1 and the second electrode separation pattern ESL2. The second electrode separation pattern ESL2 may extend long in the second direction D2. The second electrode separation pattern ESL1 may include an insulating material.

Figure 21:
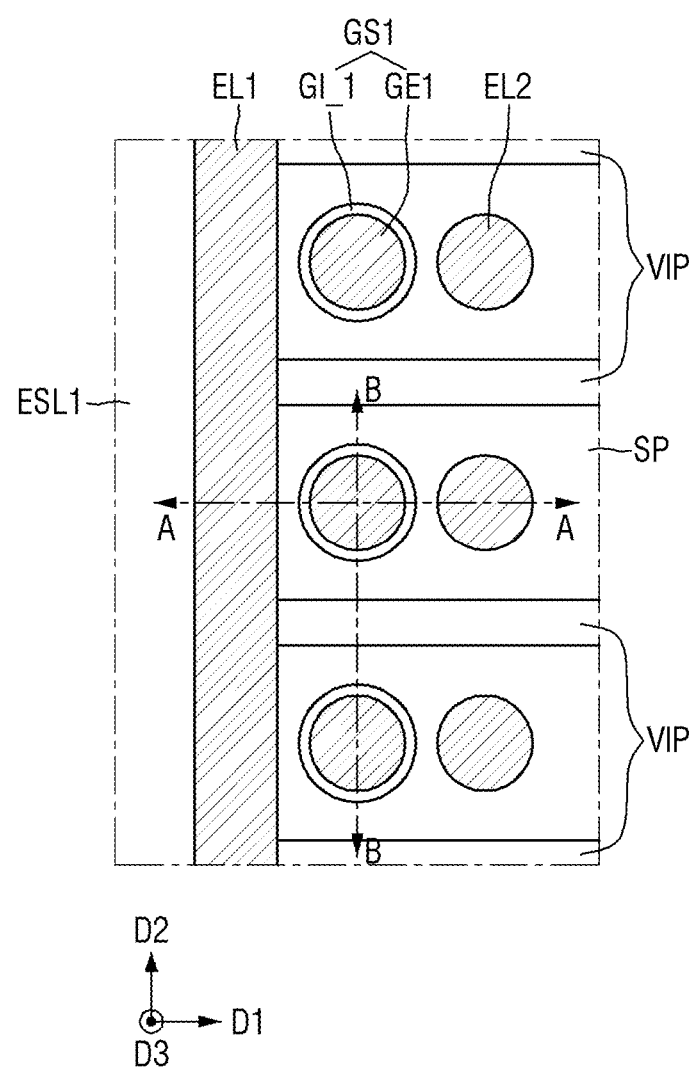
FIGS. 21 to 23 are diagrams for explaining the semiconductor memory device according to some example embodiments.
Figure 22:
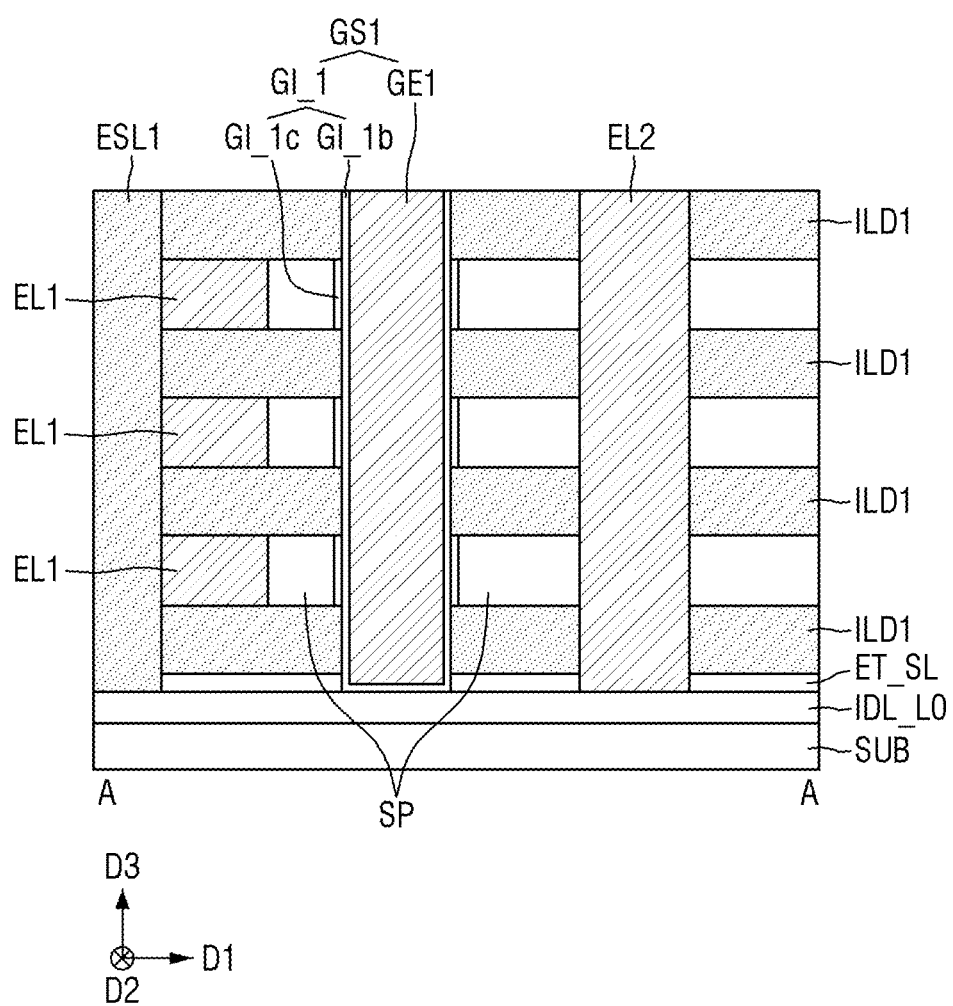
Figure 23:
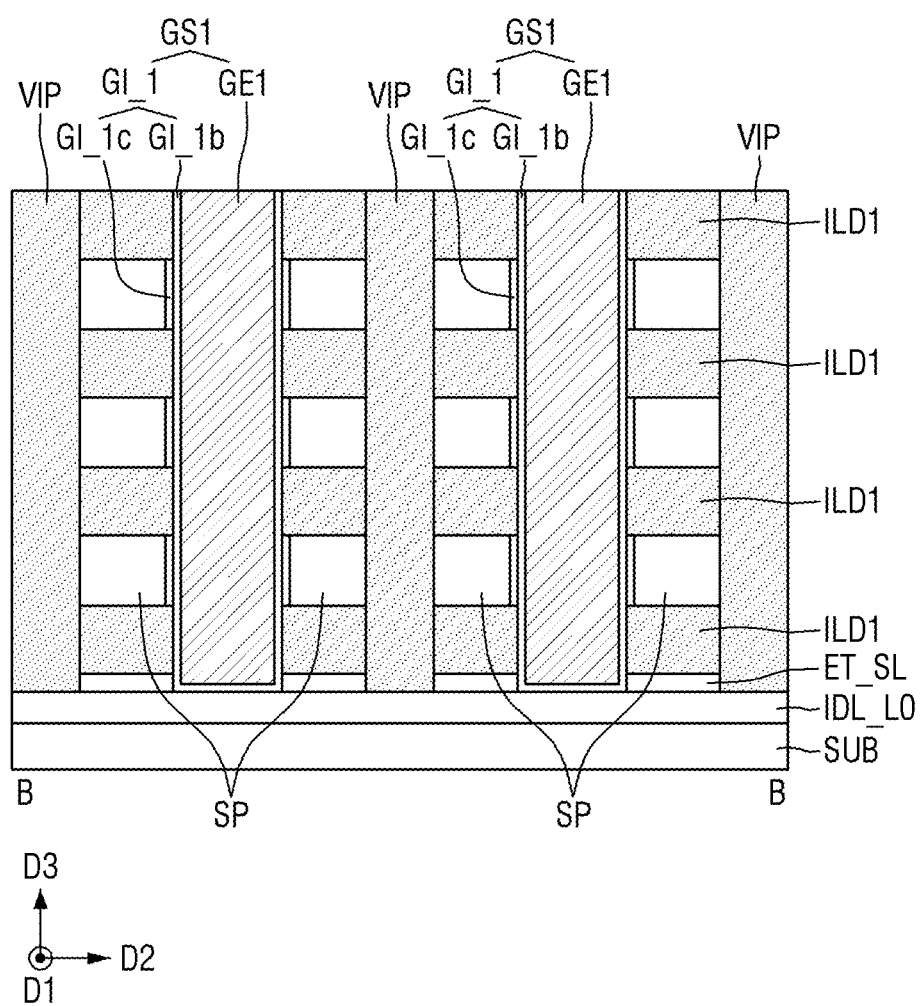

FIGS. 21 to 23 are diagrams for explaining the semiconductor memory device according to some example embodiments. For convenience of explanation, the points different from those described using FIGS. 4 and 9 to 11 will be mainly described. For reference, FIG. 21 is a plan view showing a semiconductor memory device according to some example embodiments. FIGS. 22 and 23 are cross-sectional views taken along lines A-A and B-B of FIG. 21.

Referring to FIGS. 21 to 23, in the semiconductor memory device according to some example embodiments, the semiconductor patterns SP and the first mold insulating layers ILD1 alternately stacked in the third direction D3 may be separated by a vertical insulating structure VIP.

The vertical insulating structure VIP may extend long in the first direction D1. The vertical insulating structure VIP is placed on the substrate SUB and may extend long in the third direction D3. The vertical insulating structure VIP may pass through the semiconductor pattern SP and the first mold insulating layer ILD1.

The semiconductor patterns SP arranged in the second direction D2 and the third direction D3 may be defined by a vertical insulating structure VIP. The semiconductor patterns SP and the first mold insulating layers ILD1 may be in contact with the vertical insulating structure VIP. The vertical insulating structure VIP may include, for example, an insulating material.

The semiconductor patterns SP adjacent to each other in the second direction D2 may be separated by the vertical insulating structure VIP. The semiconductor patterns SP adjacent to each other in the third direction D3 may be separated by the first mold insulating layer ILD1.

Figure 24:
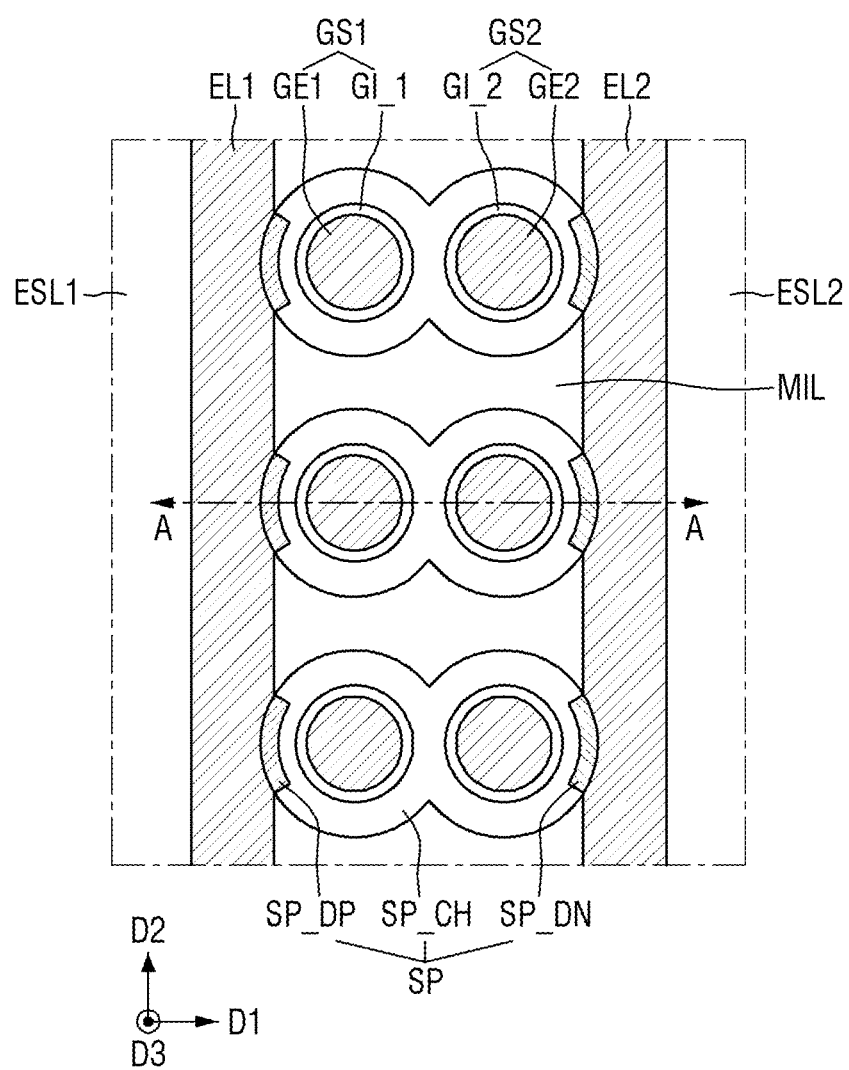
FIGS. 24 and 25 are diagrams for explaining the semiconductor memory device according to some example embodiments.
Figure 25:
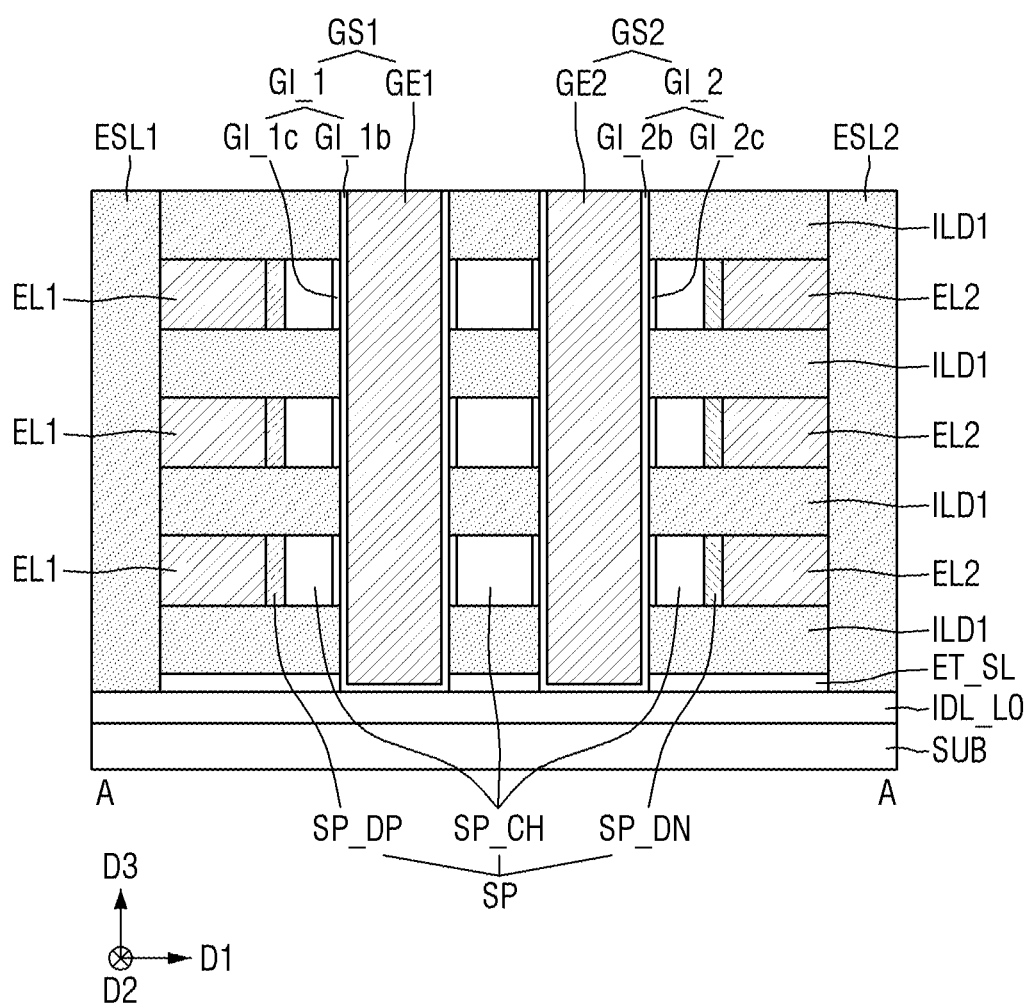

FIGS. 24 and 25 are diagrams for explaining the semiconductor memory device according to some example embodiments. For convenience of explanation, the points different from those described using FIGS. 4, 9 to 11, 19 and 20 will be mainly described. Also, repeated parts of contents explained using FIGS. 2A, 3A, 6 and 7 will be briefly described. For reference, FIG. 24 is a plan view showing a semiconductor memory device according to some example embodiments. FIG. 25 is a cross-sectional view taken along a line A-A of FIG. 24.

Referring to FIGS. 24 and 25, the semiconductor memory device according to some example embodiments further includes a second gate structure GS2.

The semiconductor patterns SP may include a first impurity region SP_DP, a second impurity region SP_DN, and a channel region SP_CH between the first impurity region SP_DP and the second impurity region SP_DN. The semiconductor patterns SP may each include a channel region SP_CH of the form in which closed loops are connected.

In the semiconductor memory device according to some example embodiments, the channel region SP_CH of the semiconductor pattern SP may be formed of an undoped semiconductor material or a semiconductor material doped with p-type impurities. When the channel region SP_CH is formed of the semiconductor material doped with p-type impurities, the concentration of p-type impurities of the channel region SP_CH is lower than the concentration of p-type impurities of the first impurity region SP_DP.

The second gate structure GS2 may be placed on the substrate SUB. The second gate structure GS2 may extend long in the third direction D3. The second gate structure GS2 may penetrate the semiconductor pattern SP. The second gate structure GS2 may penetrate the mold structure MIL.

The first gate structure GS1 and the second gate structure GS2 may be separated from each other in the first direction D1. The first gate structure GS1 and the second gate structure GS2 may each penetrate the channel region SP_CH.

The second gate structure GS2 may include a second gate electrode GE2 and a first gate insulating film GI_2. The second gate electrode GE2 may extend in the third direction D3 and penetrate the semiconductor pattern SP. The second gate insulating film GI_2 may be placed between the second gate electrode GE2 and the semiconductor pattern SP.

The first gate electrode GE1 and the second gate electrode GE2 may each penetrate the channel region SP_CH. The first gate insulating film GI_1 may be placed between the first gate electrode GE1 and the channel region SP_CH. The second gate insulating film GI_2 may be placed between the second gate electrode GE2 and the channel region SP_CH.

The second gate insulating film GI_2 may include a second charge holding film GI_2c and a second charge blocking film GI_2b. The first charge holding film GI_1c and the second charge holding film GI_2c may serve as the charge trap site of FIG. 2A.

For example, the second charge holding film GI_2c may be placed between the second charge blocking film GI_2b and the semiconductor pattern SP. Alternatively, the second charge blocking film GI_2b may be placed between the first charge holding film GI_2c and the second gate electrode GE2. In the semiconductor memory device according to some example embodiments, the second charge holding film GI_2c may be in contact with the semiconductor pattern SP.

For example, the stacked structure of the second gate insulating film GI_2 may be the same as the stacked structure of the first gate insulating film GI_1. The second charge holding film GI_2c may include, for example, a silicon nitride film. The second charge blocking film GI_2b may include, for example, a silicon oxide film.

The first conductive connecting line EL1 may be connected to the first impurity region SP_DP. The first conductive connecting line EL1 may extend long in the second direction D2.

The second conductive connecting line EL2 may be connected to the second impurity region SP_DN. The second conductive connecting line EL2 may extend long in the second direction D2.

Figure 26:
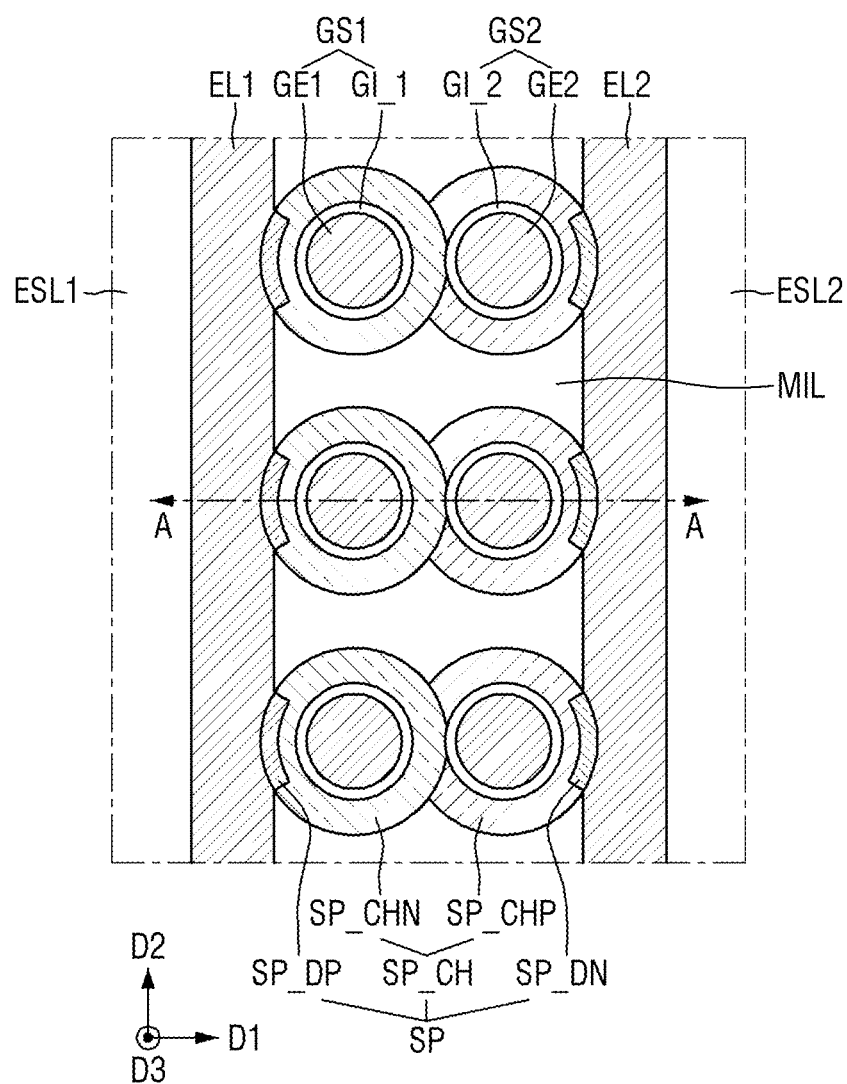
FIGS. 26 and 27 are diagrams for explaining the semiconductor memory device according to some example embodiments.
Figure 27:
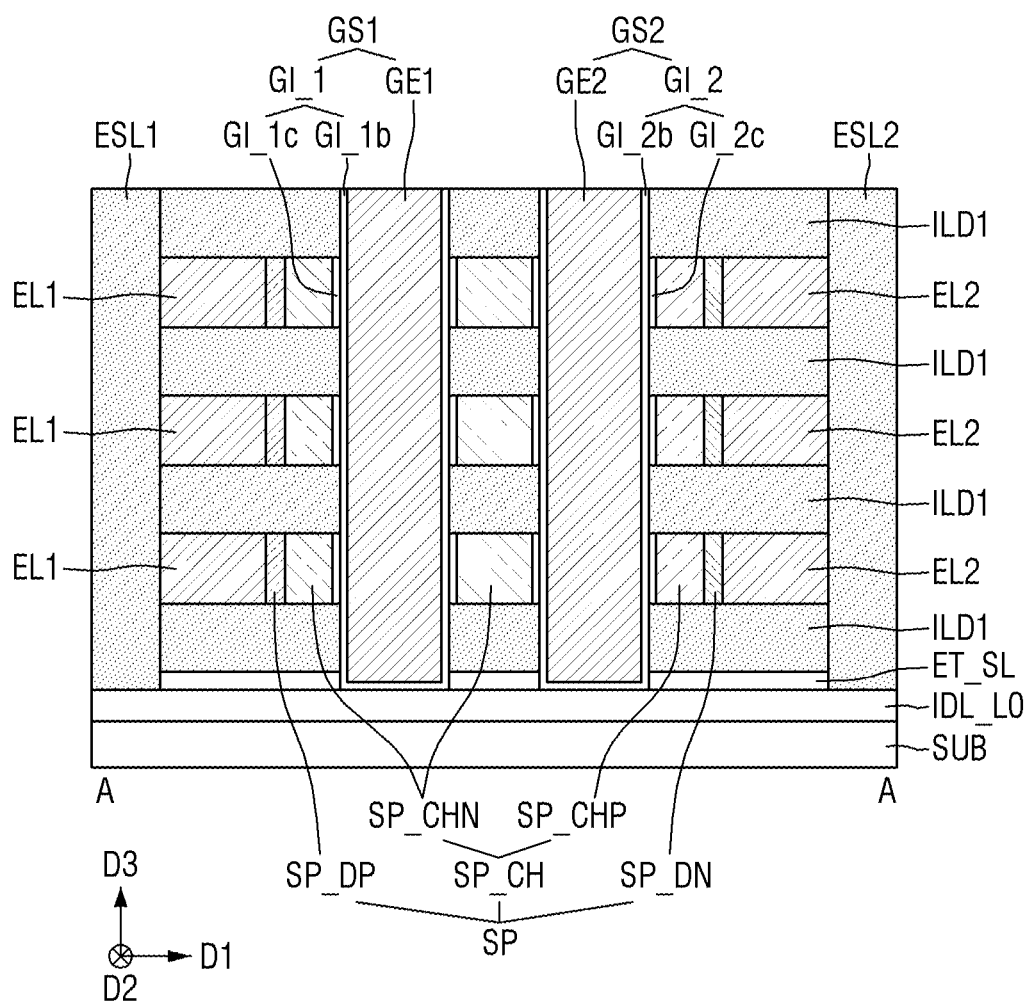

FIGS. 26 and 27 are diagrams for explaining the semiconductor memory device according to some example embodiments. For convenience of explanation, the points different from those described using FIGS. 24 and 25 will be mainly described.

Referring to FIGS. 24 and 25, in the semiconductor memory device according to some example embodiments, the channel region SP_CH may include an n-type base channel portion SP_CHN and a p-type base channel portion SP_CHP.

The n-type base channel portion SP_CHN may be in contact with the first impurity region SP_DP, and the p-type base channel portion SP_CHP may be in contact with the second impurity region SP_DN. The n-type base channel portion SP_CHN may be placed between the first impurity region SP_DP and the p-type base channel portion SP_CHP.

The n-type base channel portion SP_CHN may be formed of a semiconductor material doped with n-type impurities. The concentration of n-type impurities of the n-type base channel portion SP_CHN is lower than the concentration of n-type impurities of the second impurity region SP_DN. The p-type base channel portion SP_CHP may be formed of a semiconductor material doped with p-type impurities. The concentration of p-type impurities of the p-type base channel portion SP_CHP is lower than the concentration of p-type impurities of the first impurity region SP_DP.

In FIG. 27, although the n-type base channel portion SP_CHN is shown as being in contact with the second gate insulating film GI_2, the embodiment is not limited thereto. A part of the p-type base channel portion SP_CHP may, of course, be interposed between the n-type base channel portion SP_CHN and the second gate insulating film GI_2.

Also, although a part of the n-type base channel part SP_CHN is shown as entering inside the p-type base channel part SP_CHP, the embodiment is not limited thereto. The shapes of the n-type base channel part SP_CHN and the p-type base channel part SP_CHP may change, depending on the procedure for forming the n-type base channel part SP_CHN and the p-type base channel part SP_CHP.

The first gate electrode GE1 may penetrate the n-type base channel portion SP_CHN of the channel region SP_CH. The second gate electrode GE2 may penetrate the p-type base channel portion SP_CHP of the channel region SP_CH.

Figure 28:
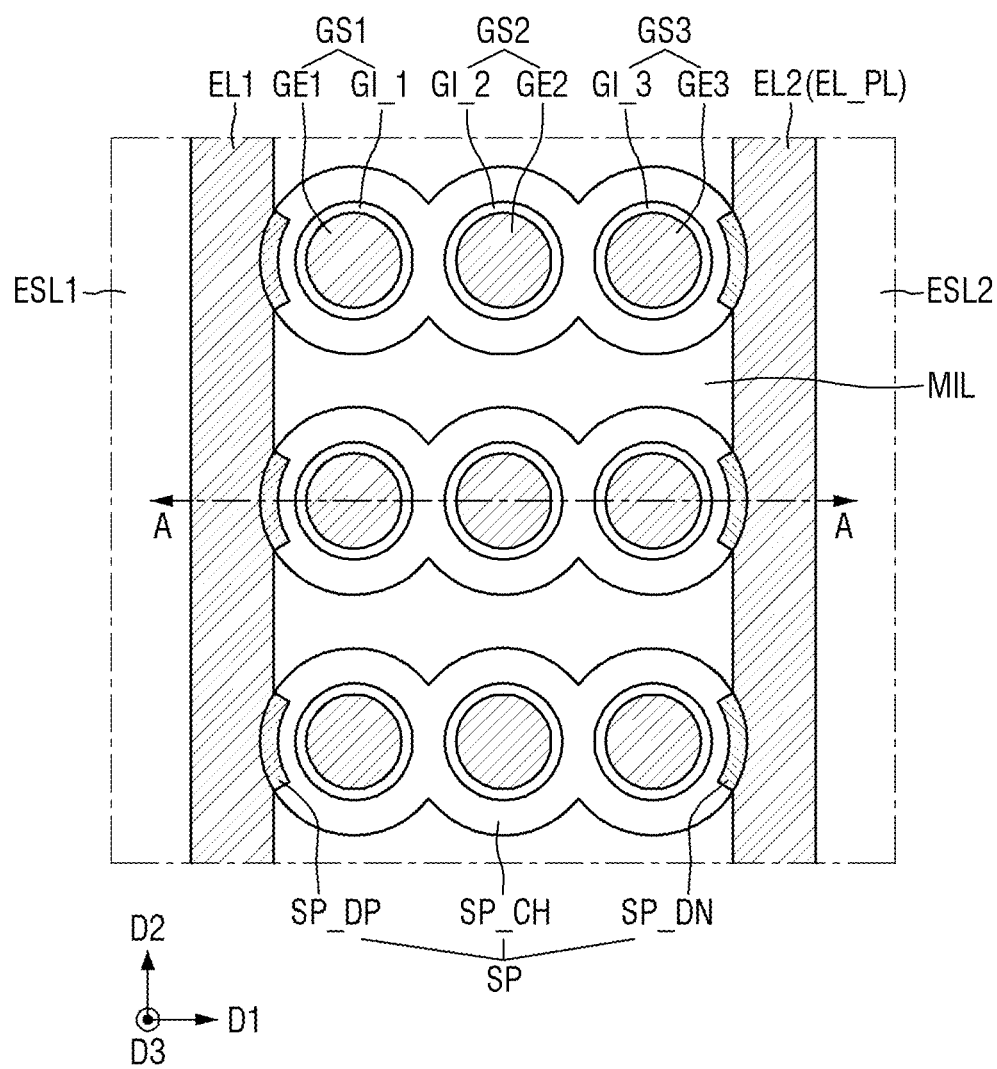
FIGS. 28 and 29 are diagrams for explaining the semiconductor memory device according to some example embodiments.
Figure 29:
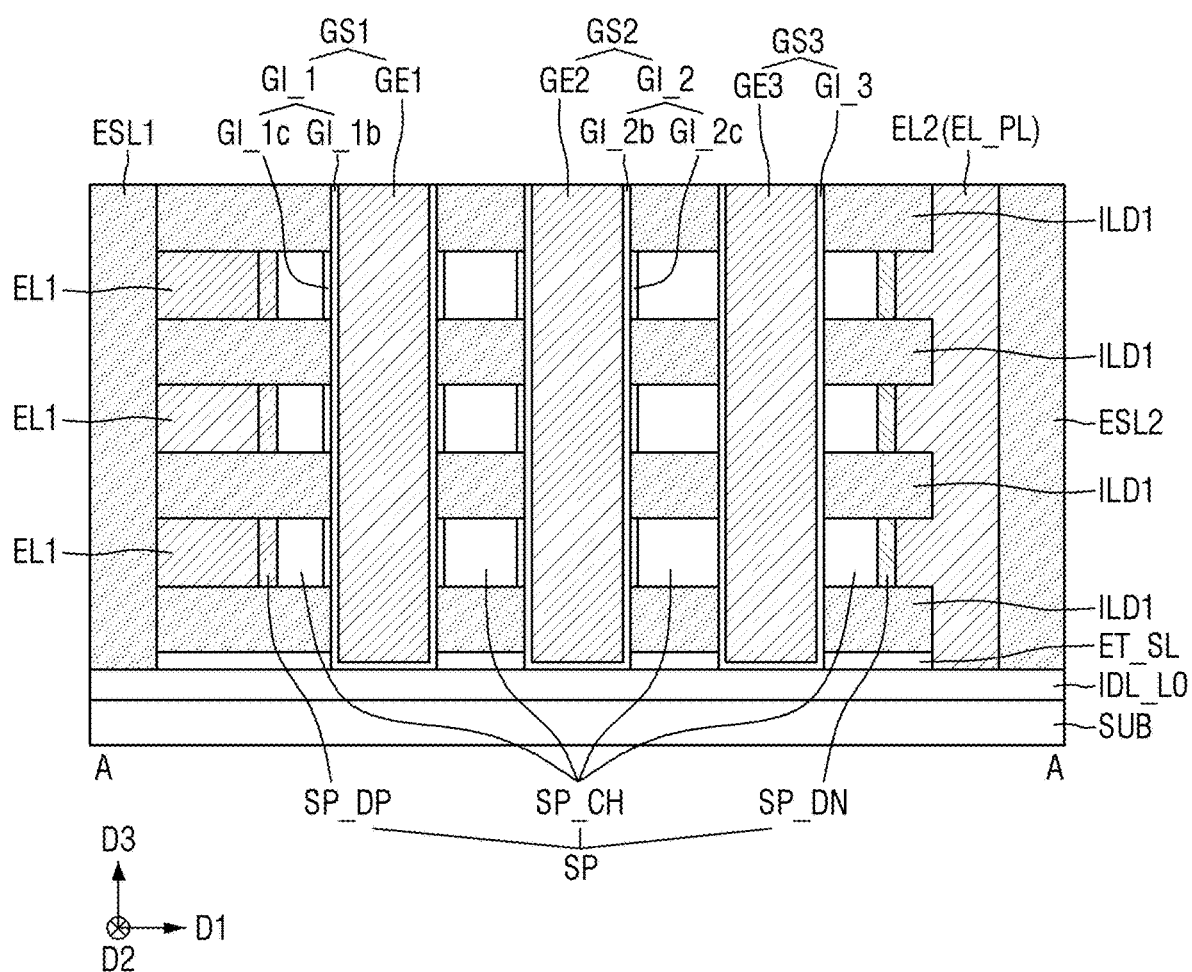

FIGS. 28 and 29 are diagrams for explaining the semiconductor memory device according to some example embodiments. For convenience of explanation, the points different from those described using FIGS. 24 and 25 will be mainly described.

Referring to FIGS. 28 and 29, the semiconductor memory device according to some example embodiments may further include a third gate structure GS3 penetrating the channel region SP_CH.

The third gate structure GS3 may be placed on the substrate SUB. The third gate structure GS3 may extend long in the third direction D3. Each of the third gate structures GS3 may penetrate the mold structure MIL.

At least a part of the third gate structure GS3 may be surrounded by the channel region SP_CH. In the region in which the third gate structure GS3 and the semiconductor pattern SP intersect, the channel region SP_CH may entirely surround the side walls of the third gate structure GS3 extending in the third direction D3.

The first to third gate structures GS1, GS2, and GS3 may be sequentially arranged in the first direction D1 on the basis of the first conductive connecting line EL1.

The third gate structure GS3 may include a third gate electrode GE3 and a third gate insulating film GI_3. The third gate electrode GE3 may extend in the third direction D3 and penetrate the channel region SP_CH. The third gate insulating film GI_3 may be placed between the third gate electrode GE3 and the semiconductor pattern SP. The third gate insulating film GI_3 may be placed between the third gate electrode GE3 and the channel region SP_CH. The third gate electrode GE3 may correspond to the gate electrode of the selection transistor $T_{SEL}$ of FIG. 2B.

The third gate electrode GE3 may include at least one of a conductive metal nitride, a metal, and a metal-semiconductor compound. The third gate insulating film GI_3 may include at least one of a high dielectric constant insulating film, a silicon oxide film, a silicon nitride film, and a silicon oxynitride film. As an example, the high dielectric constant insulating film may include at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The third gate insulating film GI_3 may include the same, or different, material than that of the first gate insulating film GI_1 or the second gate insulating film GI_2.

As an example, when the third gate insulating film GI_3 is formed together with the first gate insulating film GI_1 and the second gate insulating film GI_2, the stacked structure of the third gate insulating film GI_3 may be the same as the stacked structure of the first gate insulating film GI_1. As another example, when the third gate insulating film GI_3 is formed in the fabricating process different from the first gate insulating film GI_1 and the second gate insulating film GI_2, the stacked structure of the third gate insulating film GI_3 may be different from or the same as the stacked structure of the first gate insulating film GI_1.

The second conductive connecting line EL2 may be a conductive plate electrode EL_PL having a plate form. The conductive plate electrode EL_PL is in contact with one ends of the semiconductor patterns SP. The conductive plate electrode EL_PL is in contact with the second impurity region SP_DN.

When the semiconductor patterns SP include the first semiconductor pattern and the second semiconductor pattern placed along the second direction D2, the conductive plate electrode EL_PL is in contact with one end of the first semiconductor pattern and one end of the second semiconductor pattern. Further, when the semiconductor patterns SP include the third semiconductor pattern and the fourth semiconductor pattern placed along the third direction D3, the conductive plate electrode EL_PL is in contact with/ direct contact with one end of the third semiconductor pattern and one end of the fourth semiconductor pattern.

The conductive plate electrode EL_PL may also connect the second impurity regions SP_DN separated in the third direction D3. The conductive plate electrode EL_PL also covers the side walls of the first mold insulating layer ILD1 between the second impurity regions SP_DN. The conductive plate electrode EL_PL is separated by the second electrode separation pattern ESL2.

Figure 30:
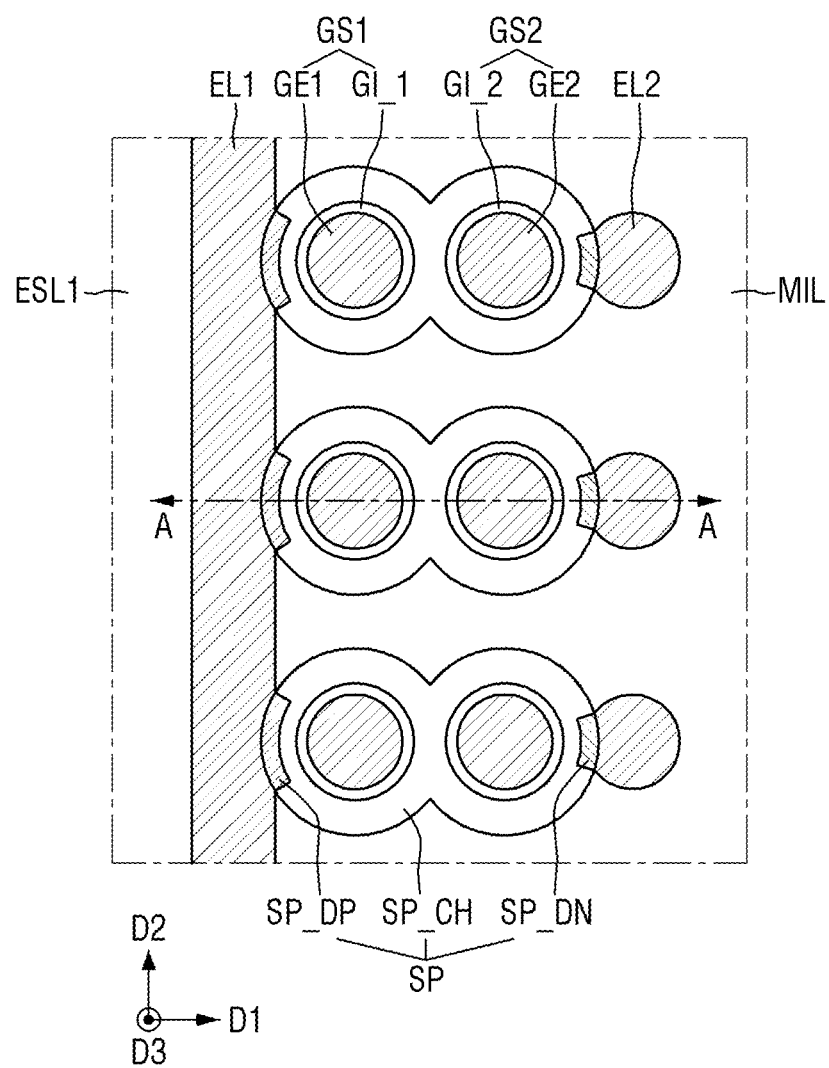
FIGS. 30 and 31 are diagrams for explaining the semiconductor memory device according to some example embodiments.
Figure 31:
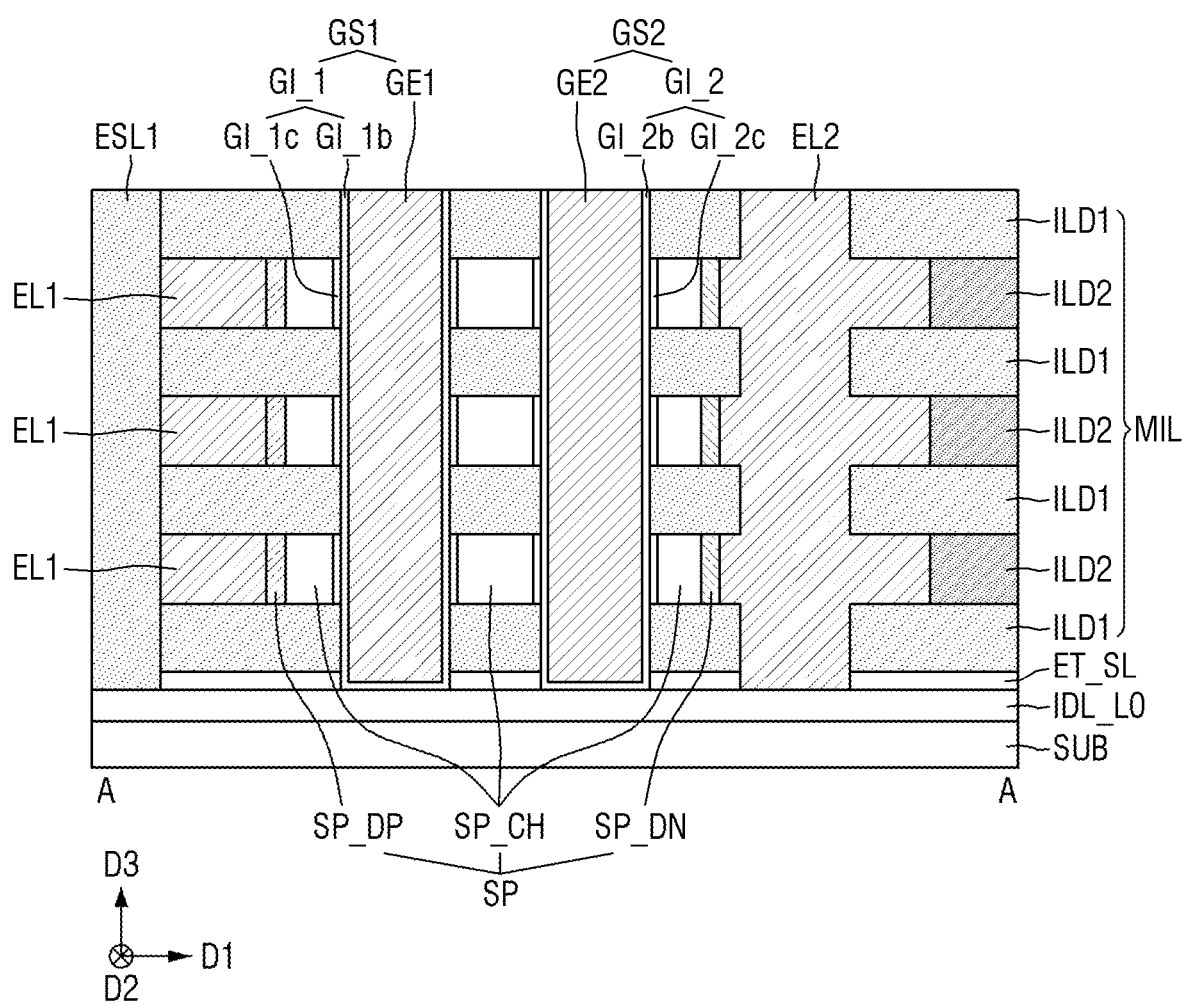

FIGS. 30 and 31 are diagrams for explaining the semiconductor memory device according to some example embodiments. For convenience of explanation, the points different from those described using FIGS. 24 and 25 will be mainly described.

Referring to FIGS. 30 and 31, in the semiconductor memory device according to some example embodiments, the second conductive connecting line EL2 may extend in the third direction D3.

The second conductive connecting line EL2 is connected to the semiconductor pattern SP arranged in the third direction D3. The second conductive connecting line EL2 may connect the second impurity regions SP_DN separated from each other in the third direction D3.

Figure 32:
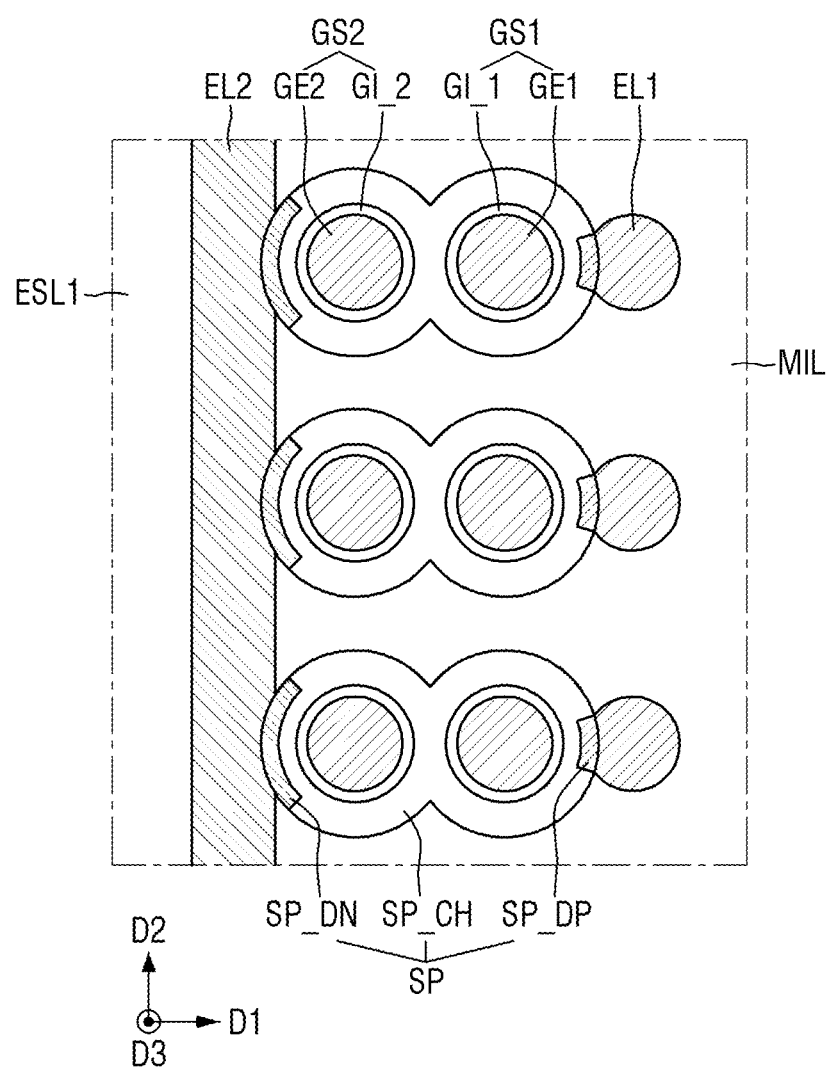
FIG. 32 is a diagram for explaining the semiconductor memory device according to some example embodiments.

FIG. 32 is a diagram for explaining the semiconductor memory device according to some example embodiments. For convenience of explanation, the points different from those described using FIGS. 30 and 31 will be mainly described.

Referring to FIG. 32, in the semiconductor device according to some example embodiments, the second conductive connecting line EL2 may extend long in the second direction D2. The first conductive connecting line EL1 may extend in the third direction D3.

The first conductive connecting line EL1 is connected to the semiconductor pattern SP arranged in the third direction D3. The second conductive connecting line EL2 is connected to the semiconductor pattern SP arranged in the second direction D2.

Figure 33:
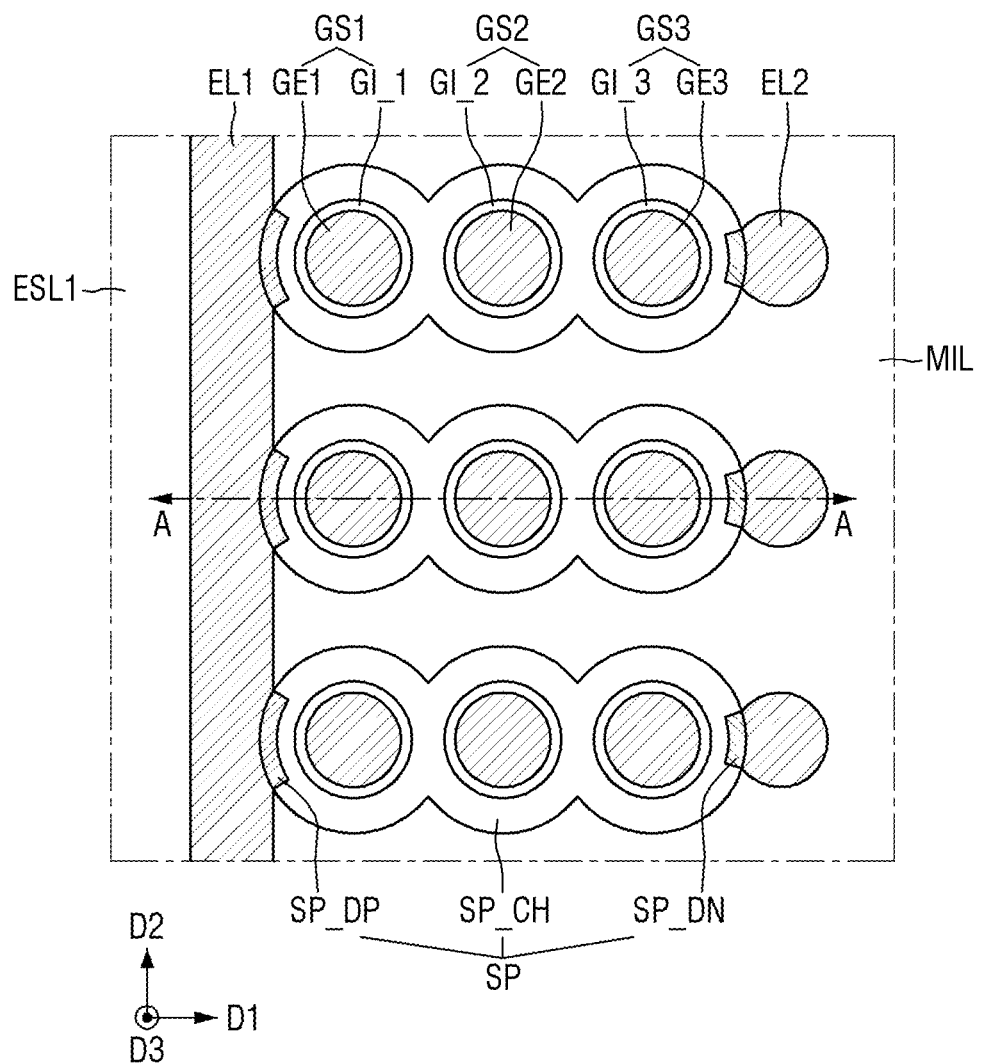
FIGS. 33 and 34 are diagrams for explaining the semiconductor memory device according to some example embodiments.
Figure 34:
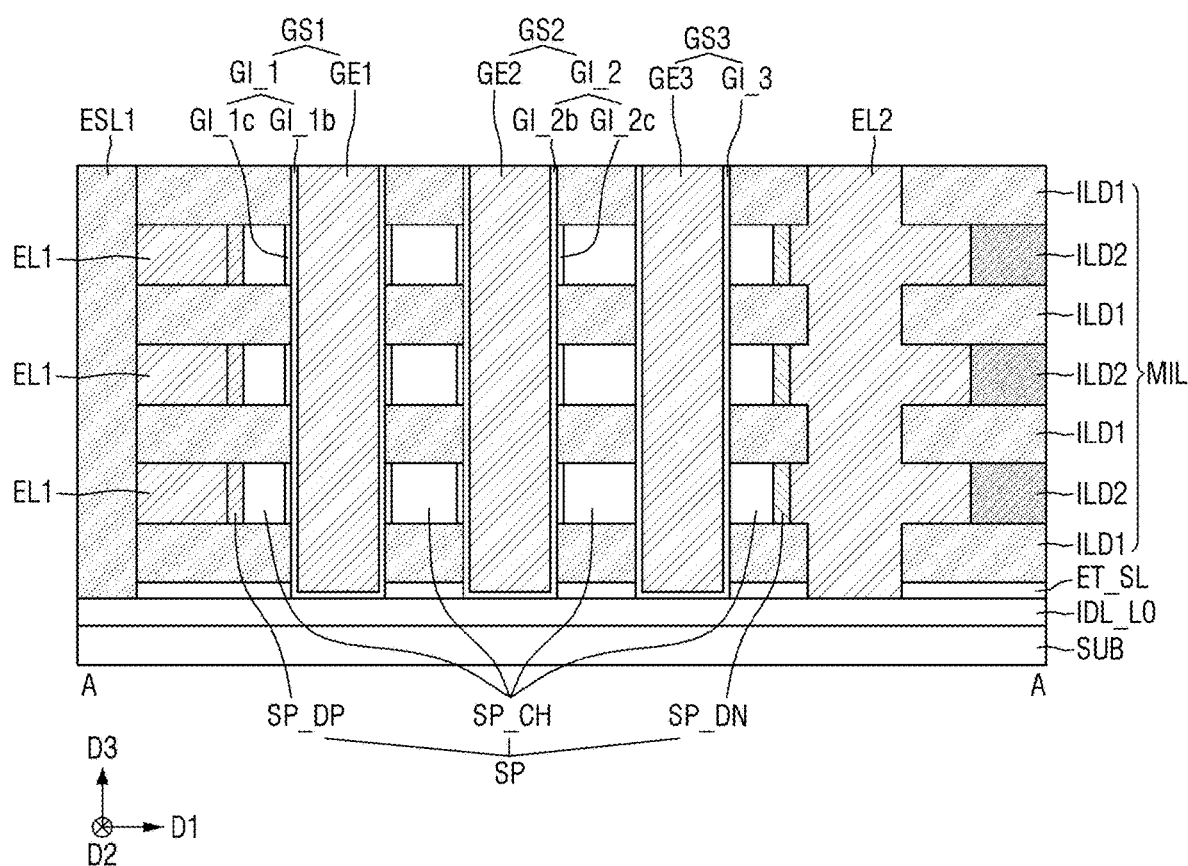

FIGS. 33 and 34 are diagrams for explaining the semiconductor memory device according to some example embodiments. For convenience of explanation, the points different from those described using FIGS. 30 and 31 will be mainly described.

Referring to FIGS. 33 and 34, the second conductive connecting line EL2 may extend in the third direction D3.

The semiconductor patterns SP arranged in the third direction D3 are connected by the single second conductive connecting line EL2. The second conductive connecting line EL2 may connect the second impurity regions SP_DN separated from each other in the third direction D3.

The semiconductor patterns SP arranged in the second direction D2 are not connected by the single second conductive connecting line EL2.

Figure 35:
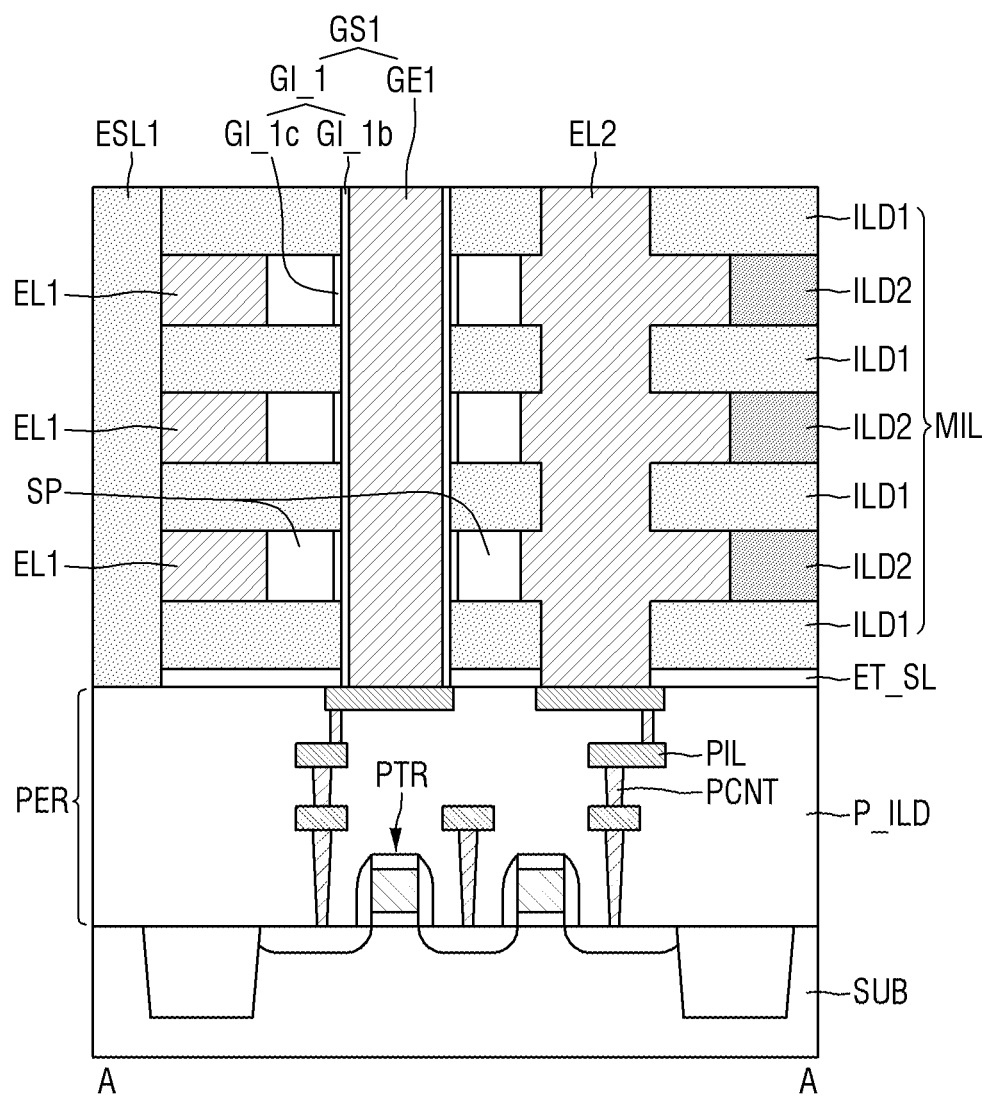
FIGS. 35 to 37 are diagrams for explaining the semiconductor memory device according to some example embodiments, respectively.
Figure 36:
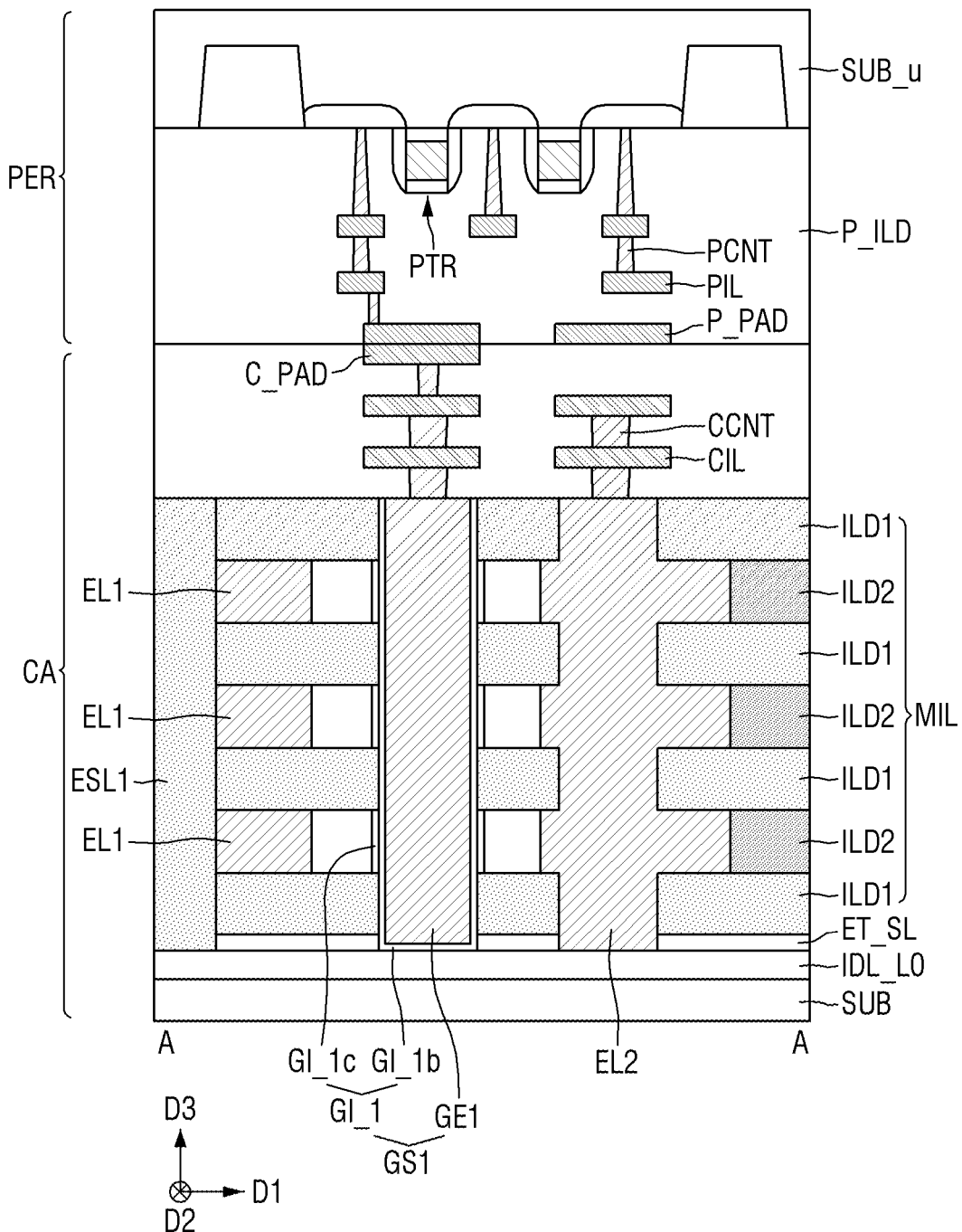
Figure 37:
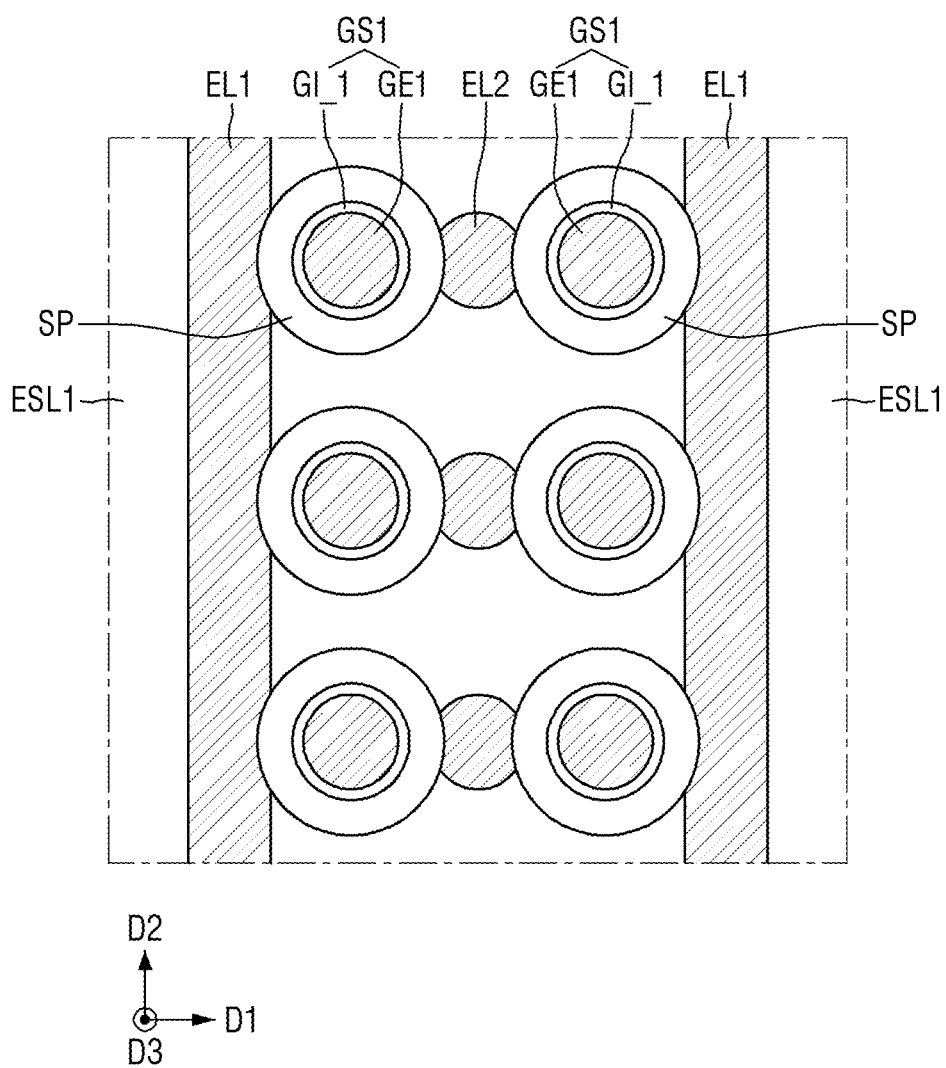

FIGS. 35 to 37 are diagrams for explaining a semiconductor memory device according to some example embodiments, respectively. For convenience of explanation, the points different from those described using FIGS. 4 and 9 to 11 will be mainly described.

Referring to FIGS. 35 and 36, a cell array region CA and a peripheral circuit region PER may be provided on the substrate SUB. The cell array region CA and the peripheral circuit region PER may be stacked in the third direction D3.

In FIG. 35, the peripheral circuit region PER may be provided between the cell array region CA and the substrate SUB. The peripheral circuit regions PER may include peripheral circuits PTR, PIL, and PCNT for operating the cell array region CA. At least a part of the peripheral circuits PTR, PIL, and PCNT may be formed inside the peripheral circuit insulating film P_ILD.

Specifically, the peripheral circuit formed in the peripheral circuit region PER may include peripheral transistors PTR, peripheral wirings PIL on the peripheral transistors PTR, and peripheral contacts PCNT that vertically connect the peripheral wirings PIL. As an example, the first gate electrode GE1 and the second conductive connecting line EL2 may penetrate the etching stop film ET_SL and be electrically connected to the peripheral wirings PIL. Further, although not shown, the first conductive connecting line EL1 may be connected to the peripheral wirings PIL through the through electrode or the like.

The semiconductor memory device according to some example embodiments may have a cell-on-peri (COP) structure in which the memory cells are provided on the peripheral circuit region PER. By three-dimensionally stacking the peripheral circuit region PER and the cell array region CA, the area of the semiconductor memory chip can be reduced and high integration of the circuit can be achieved.

In FIG. 36, the cell array region CA may include cell array wirings CIL, CCNT, and C_PAD.

The cell array wiring may include a first gate electrode GE1, cell wirings CIL connected to the first conductive connecting line EL1 and the second conductive connecting line EL2, and cell contacts PCNT which vertically connect the cell wirings CIL. Also, the cell array wiring may include a cell connection pad C_PAD connected to the cell wirings CIL and the cell contacts PCNT.

The peripheral circuit region PER may include an upper substrate SUB_u, and peripheral circuits PTR, PIL, and PCNT placed on the upper substrate SUB_u to operate the cell array region CA. At least a part of the peripheral circuits PTR, PIL, and PCNT may be formed inside the peripheral circuit insulating film P_ILD. Also, the peripheral circuit region PER may also include a peri connection pad P_PAD.

The peripheral circuit region PER and the cell array region CA may be wafer-bonded. Through the connection of the peri-connection pad P_PAD and the cell connection pad C_PAD, the peripheral circuits PTR, PIL, and PCNT may be connected to the first gate electrode GE1, the first conductive connecting line EL1, and the second conductive connecting line EL2.

The semiconductor memory device according to some example embodiments may have a peri-on-cell (POC) structure in which the peripheral circuit region PER is provided on the memory cell. By three-dimensionally stacking the cell array region CA and the peripheral circuit region PER, the area of the semiconductor memory chip can be reduced and high integration of the circuit can be achieved.

Referring to FIG. 37, in the semiconductor memory device according to some example embodiments, the semiconductor pattern SP may be placed around the second conductive connecting line EL2.

The semiconductor patterns SP separated from each other in the first direction D1 may share the second conductive connecting line EL2. Since two semiconductor patterns SP separated in the first direction D1 are placed between the first conductive connecting lines EL1 adjacent to each other in the first direction D1A, the area of the semiconductor memory chip can be reduced, and high integration of the circuit can be achieved.

Example embodiments are not limited to the above, nor are the above example embodiments intended to be mutually exclusive to one another. For example, some example embodiments may include features described with one the above figures, and may also include features described with reference to others of the above figures.

FIGS. 38A to 43 are intermediate stage diagrams for explaining a method for fabricating a semiconductor memory device according to some example embodiments.

Figure 38A:
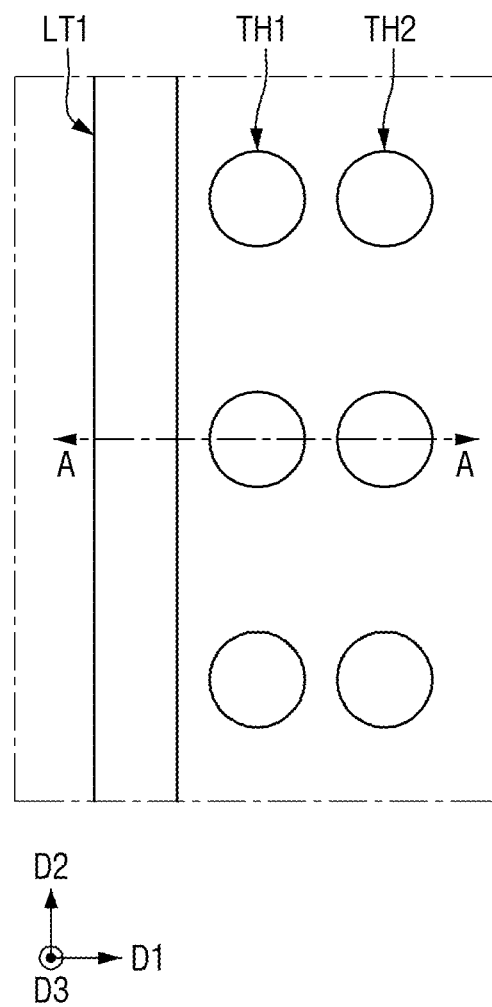
FIGS. 38A to 43 are intermediate stage diagrams for explaining a method for fabricating the semiconductor memory device according to some example embodiments.
Figure 38B:
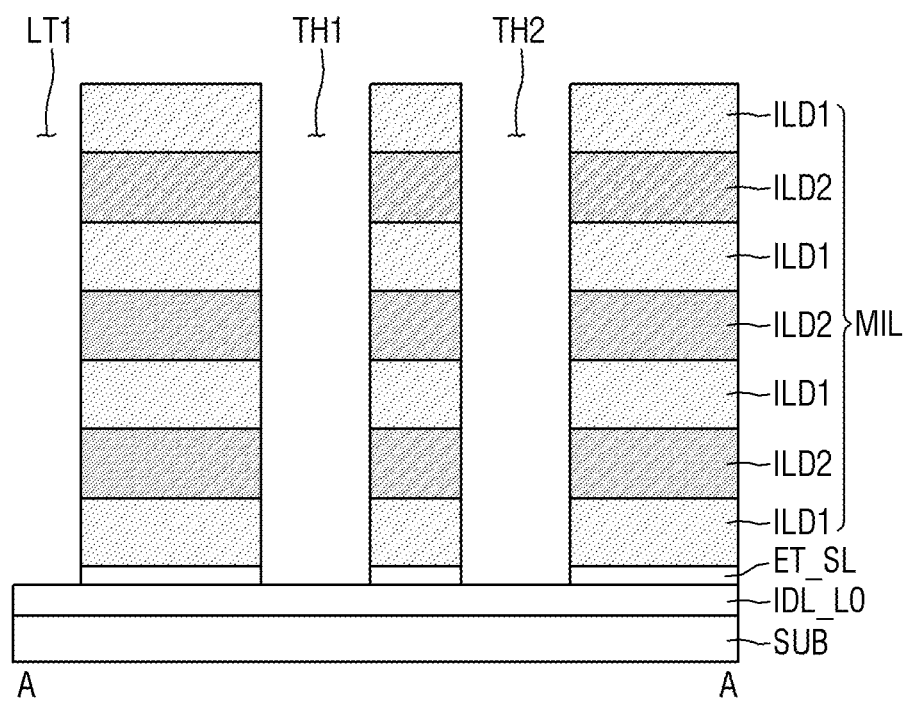

Referring to FIGS. 38A and 38B, a lower interlayer insulating film ILD_LO, an etching stop film ET_SL, and a mold structure MIL may be formed on the substrate SUB, and may be formed with at least one of a chemical vapor deposition (CVD) process or an atomic layer deposition (ALD) process. The mold structure MIL may include a plurality of first mold insulating layers ILD1 and second mold insulating layers ILD2 which are stacked vertically.

First and second holes TH1 and TH2, and a first linear trench LT1 penetrating the mold structure MIL may be formed, e.g. may be formed with a photolithographic process and an etching process such as a dry etching process. The first and second holes TH1 and TH2 may have a contact form, and the first linear trench LT1 may have a line form extending long in the second direction D2. The first linear trench LT1 is adjacent to the first hole TH1.

Figure 39:
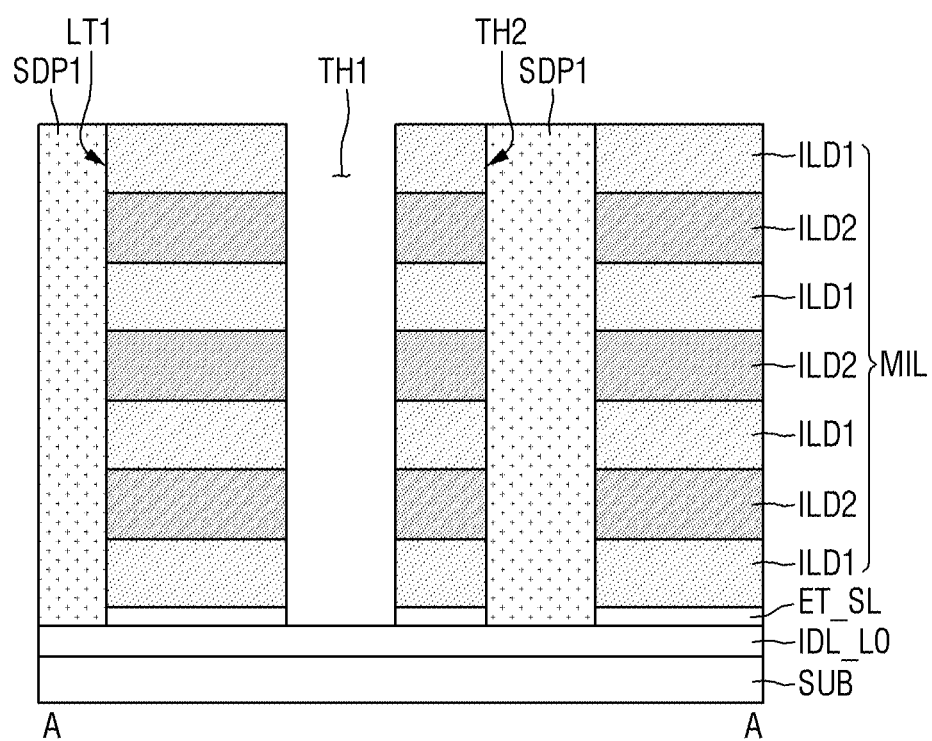
Figure 39:
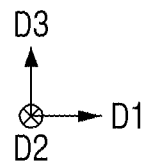

Referring to FIG. 39, a first sacrificial pattern SDP1 may be formed inside the second hole TH2 and the first linear trench LT1. The first sacrificial pattern SDP1 is not formed inside the first hole TH1, or may be formed within the first hole TH1 and then later selectively removed from the first hole TH1.

Figure 40:
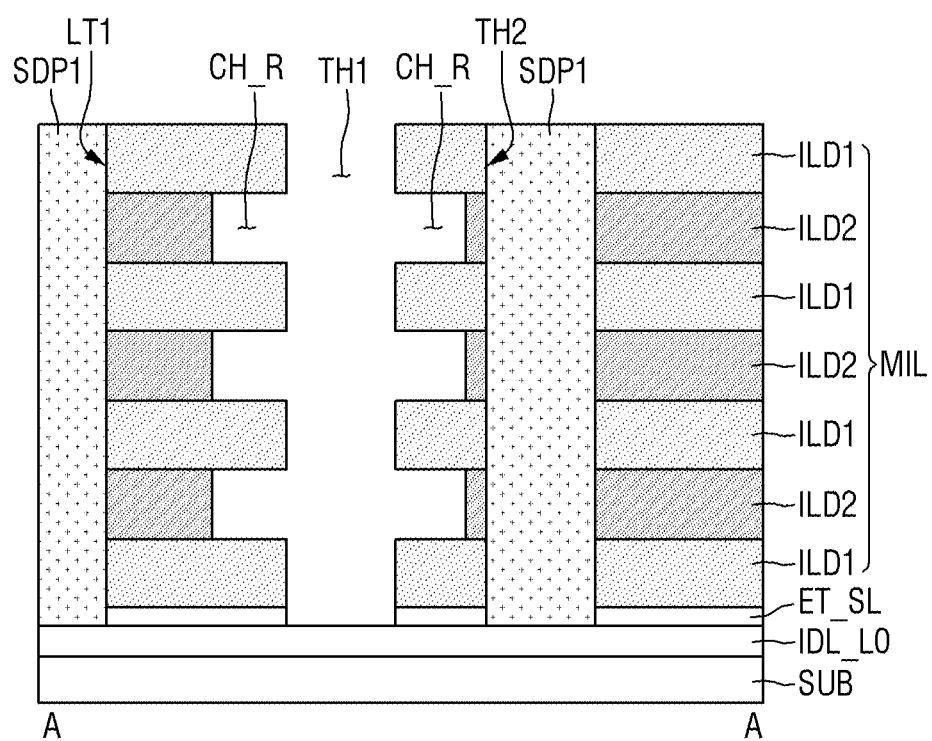
Figure 40:
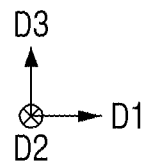

Referring to FIG. 40, the second mold insulating layer ILD2 exposed by the first hole TH1 may be partially etched, e.g. with an isotropic etch such as a wet etching process, to form a channel recess CH_R.

Figure 41:
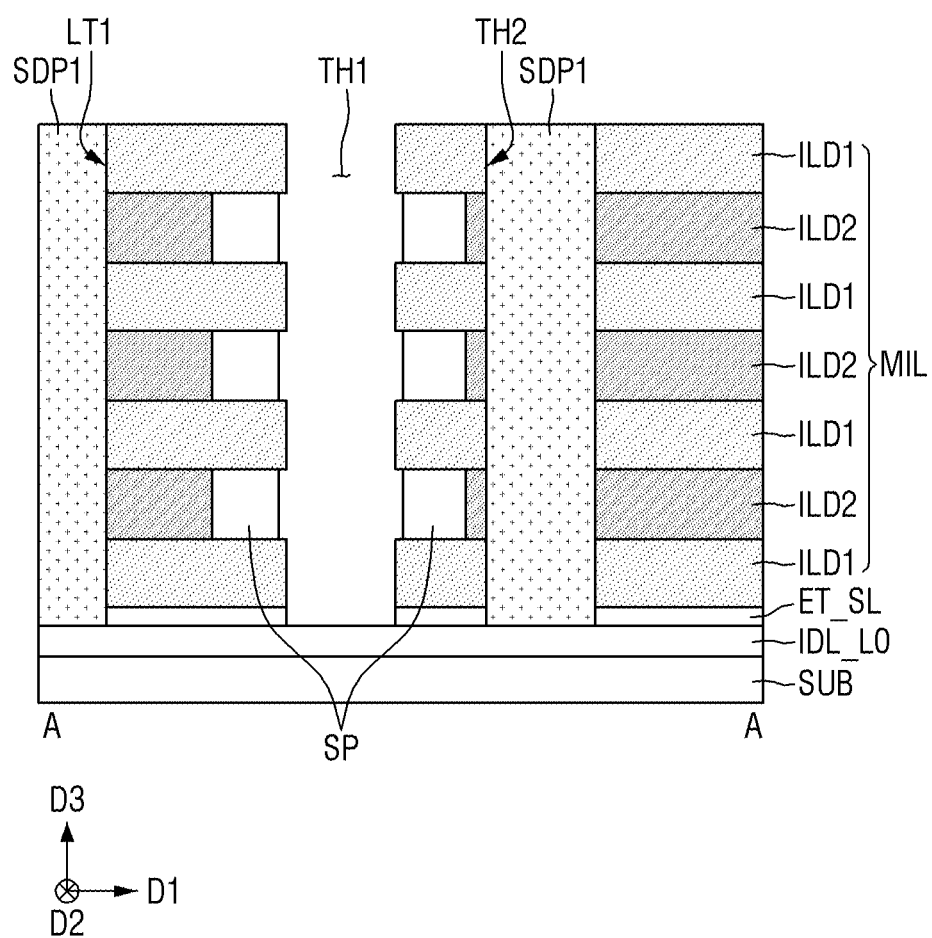

Referring to FIG. 41, a semiconductor pattern SP which fills the channel recess CH_R is formed. The semiconductor pattern SP may not completely fill the channel recess CH_R, or may completely fill the channel recess CH_R and may further be recessed through a subsequent etching process.

Unlike the shown configuration, the semiconductor pattern SP may completely fill the channel recess CH_R.

Figure 42:
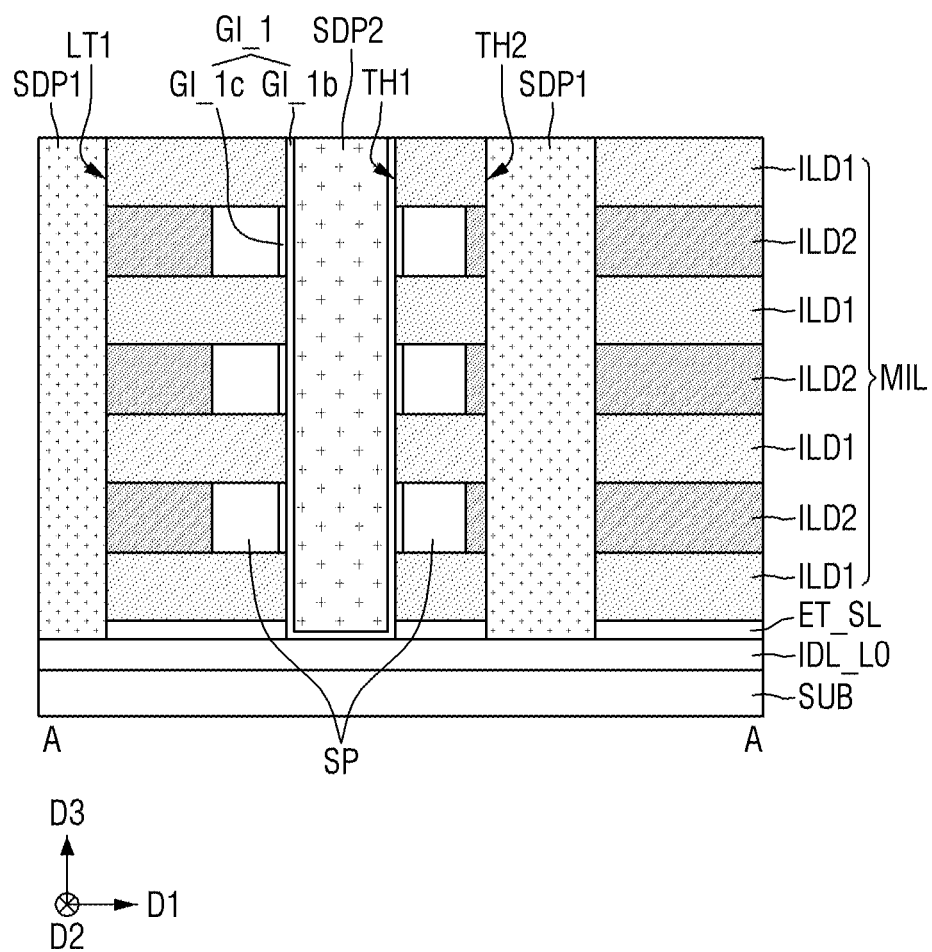

Referring to FIG. 42, the first gate insulating film GI_1 may be formed on the semiconductor pattern SP exposed by the first hole TH1. Subsequently, a second sacrificial pattern SDP2 may be formed inside the first hole TH1.

Figure 43:
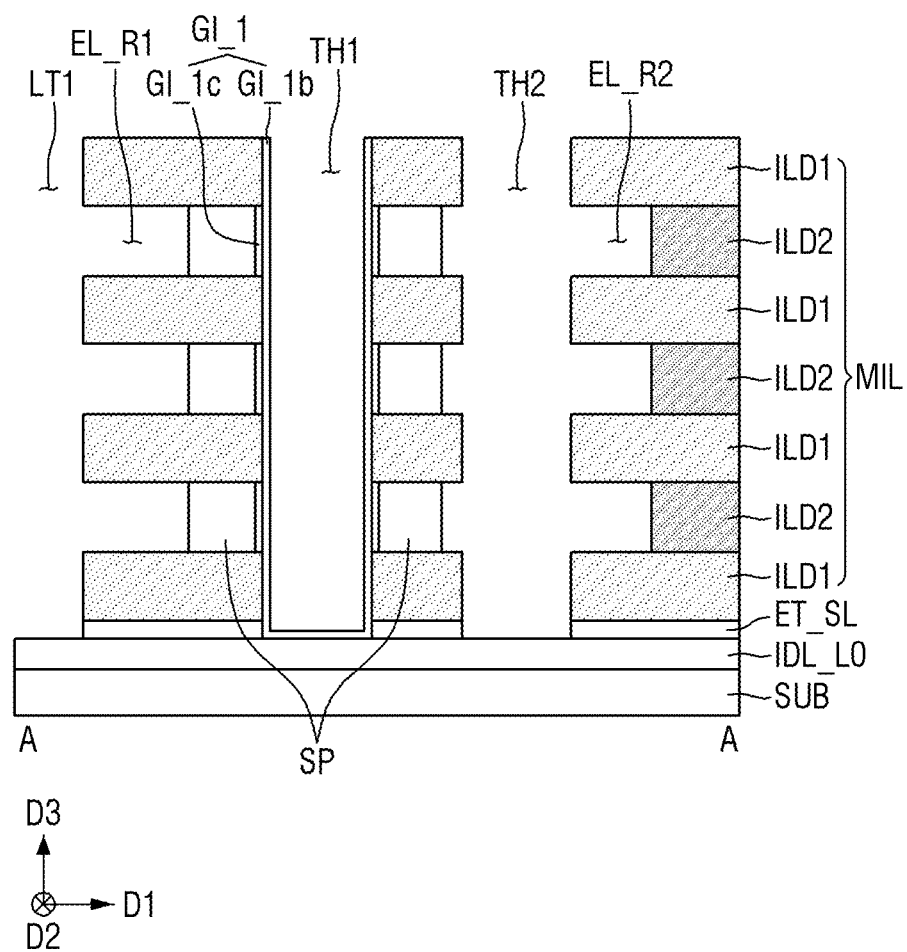

Referring to FIG. 43, the second sacrificial pattern SDP2 in the first hole TH1, and the first sacrificial pattern SDP1 in the second hole TH2 and the first linear trench LT1 may be removed.

Additionally, the second mold insulating layer ILD2 exposed by the second hole TH2 and the first linear trench LT1 may be partially etched to form the first electrode recess EL_R1 and the second electrode recess EL_2. The semiconductor pattern SP may be exposed by the first electrode recess EL_R1 and the second electrode recess EL_2.

Referring back to FIG. 10, the first conductive connecting line EL1 is formed inside the first electrode recess EL_R1. The second conductive connecting line EL2 is formed inside the second electrode recess EL_R2 and the second hole TH2. The first gate electrode GE1 is formed inside the first hole TH1.

FIGS. 44A to 48 are intermediate stage diagrams for explaining the method for fabricating the semiconductor memory device according to some example embodiments.

Figure 44A:
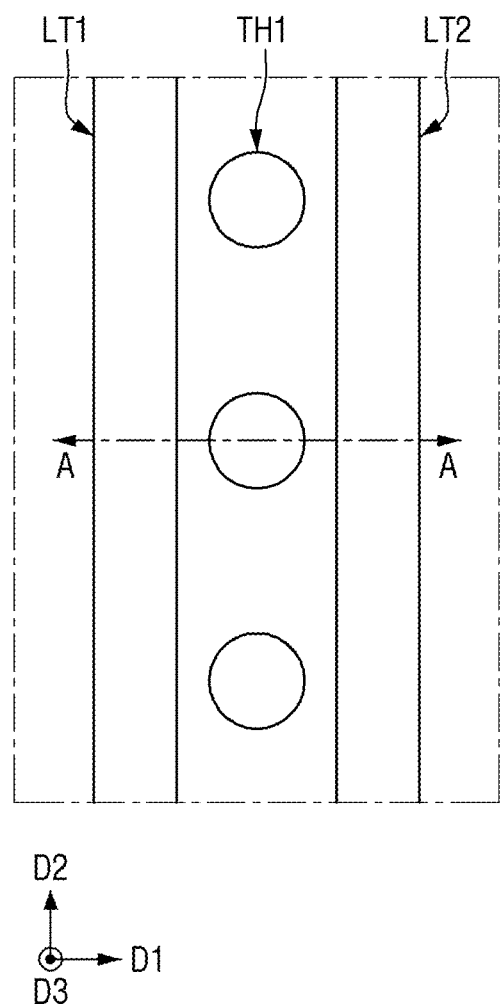
FIGS. 44A to 48 are intermediate stage diagrams for explaining the method for fabricating the semiconductor memory device according to some example embodiments.
Figure 44B:
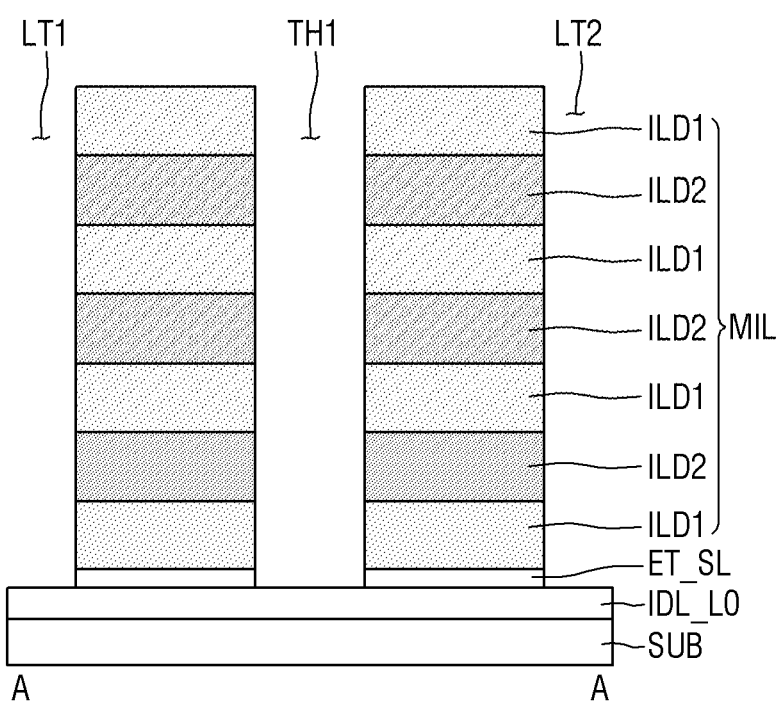

Referring to FIGS. 44A and 44B, the first hole TH1, and the first and second linear trenches LT1 and LT2 penetrating the mold structure MIL may be formed. The first hole TH1 may have a contact form, and the first and second linear trenches LT1 and LT2 may have a line form extending long in the second direction D2. The first hole TH1 is placed between the first linear trench LT1 and the second linear trench LT2.

Figure 45:
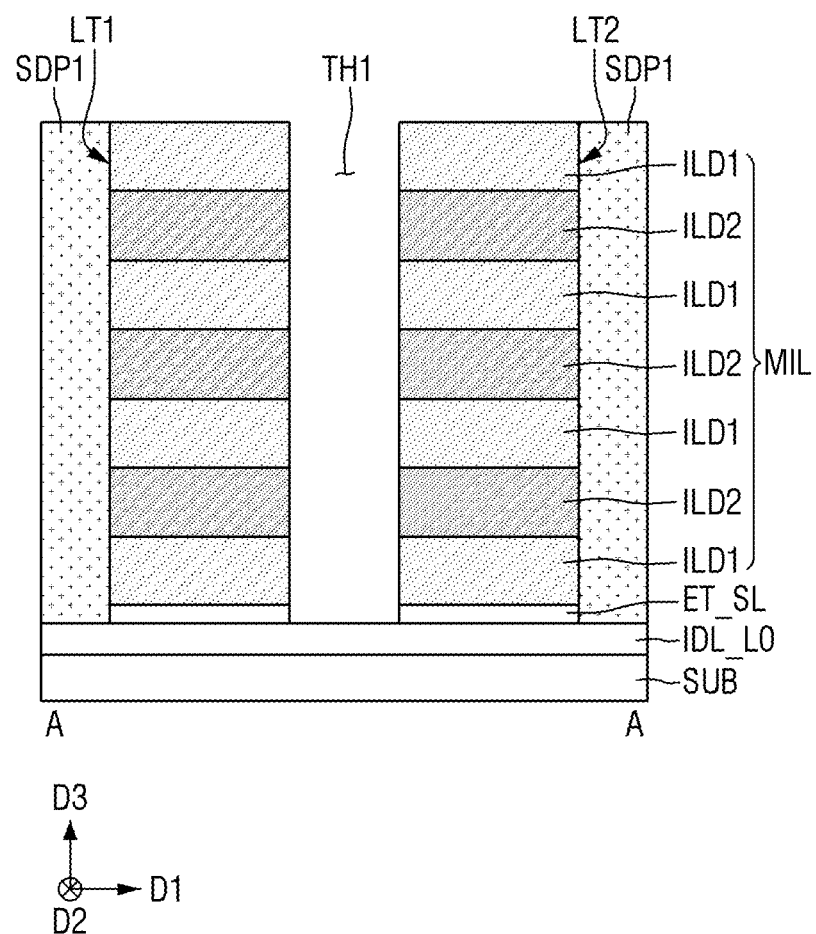

Referring to FIG. 45, the first sacrificial pattern SDP1 may be formed inside the first linear trench LT1 and the second linear trench LT2. The first sacrificial pattern SDP1 is not formed inside the first hole TH1.

Figure 46:
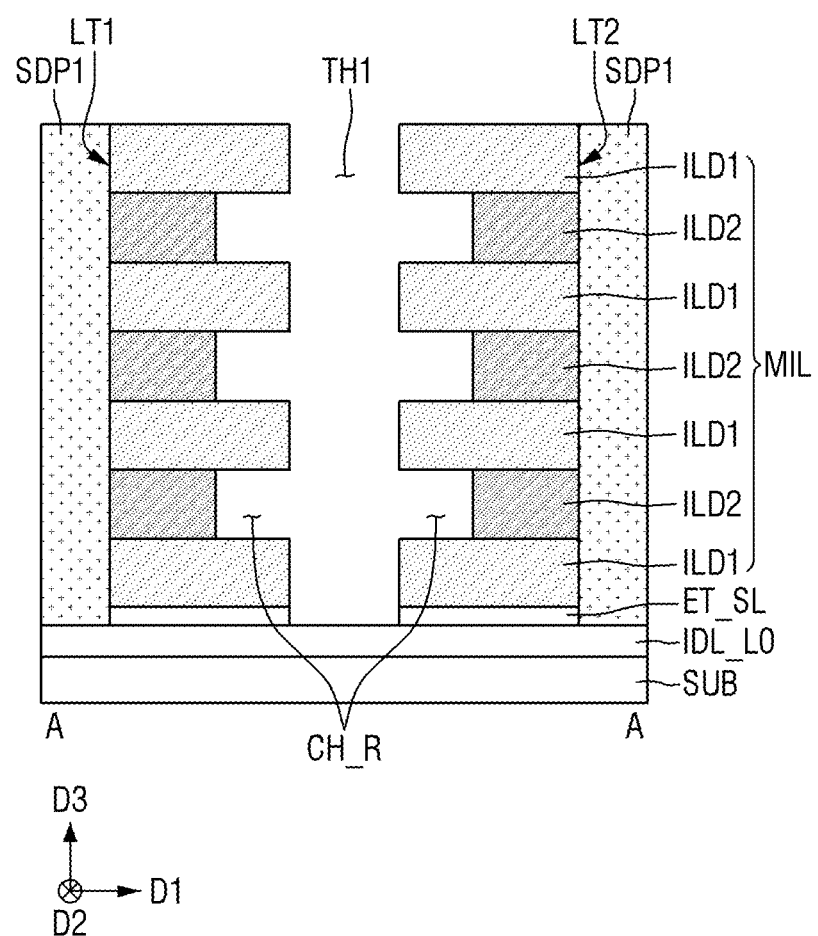

Referring to FIG. 46, the second mold insulating layer ILD2 exposed by the first hole TH1 may be partially etched to form a channel recess CH_R.

Figure 47:
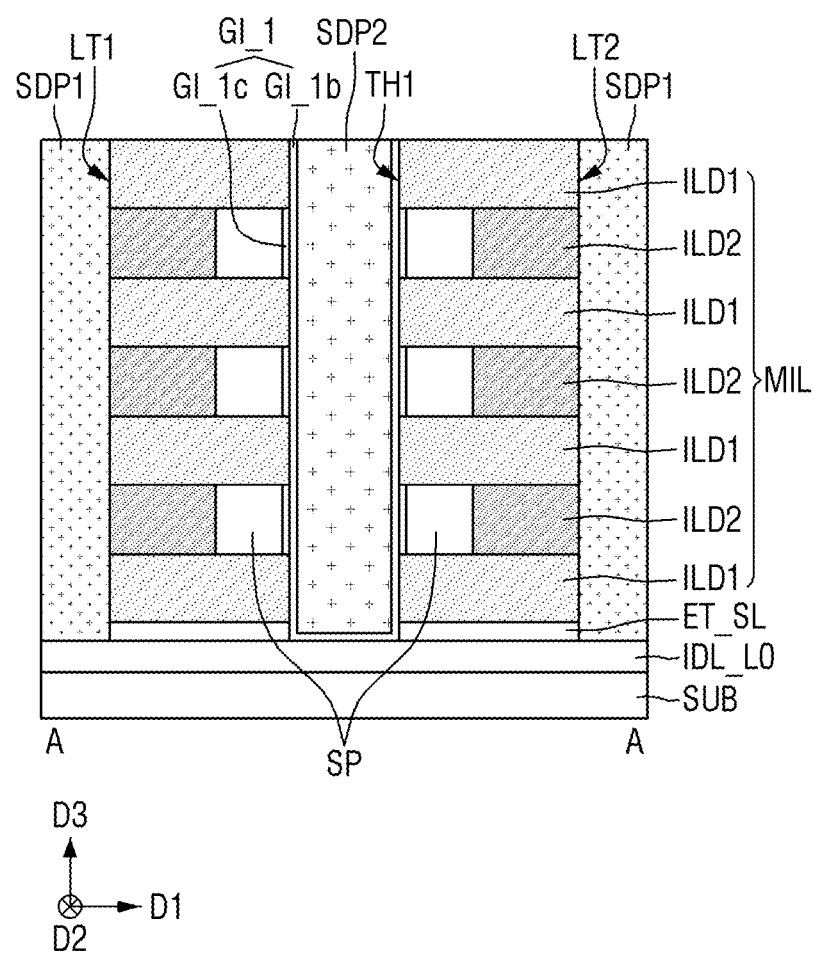

Referring to FIG. 47, a semiconductor pattern SP that fills the channel recess CH_R is formed. The semiconductor pattern SP may not completely fill the channel recess CH_R.

Subsequently, the first gate insulating film GI_1 may be formed on the semiconductor pattern SP exposed by the first hole TH1. Subsequently, a second sacrificial pattern SDP2 may be formed inside the first hole TH1.

Figure 48:
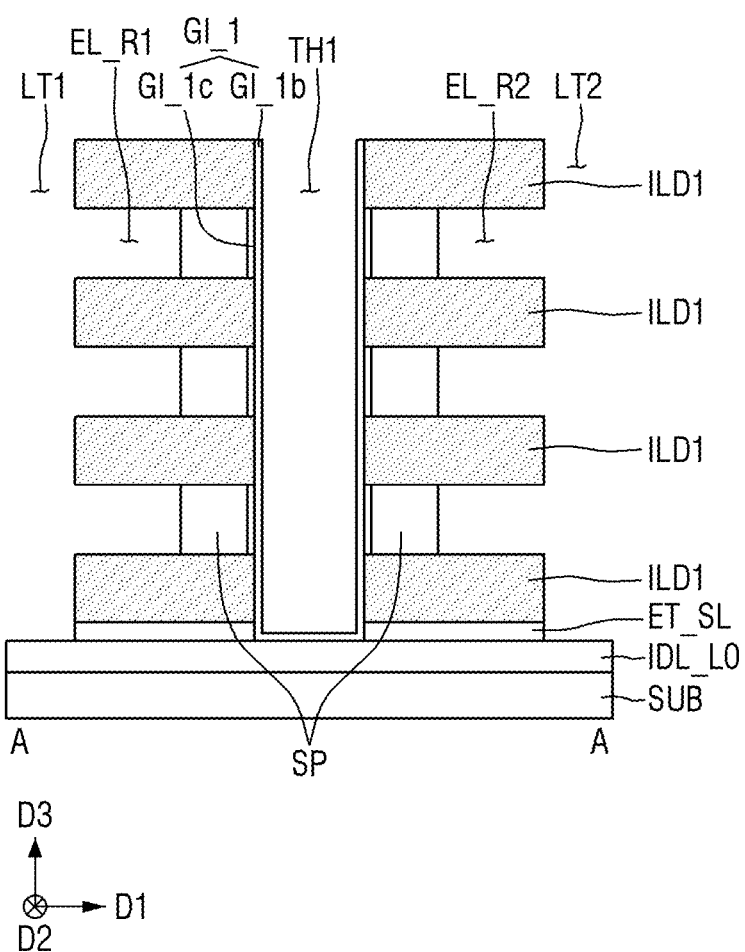

Referring to FIG. 48, the second sacrificial pattern SDP2 in the first hole TH1, and the first sacrificial pattern SDP1 in the first and second linear trenches LT1 and LT2 may be removed.

Further, the second mold insulating layer ILD2 exposed by the first and second linear trenches LT1 and LT2 may be partially etched to form the first electrode recess EL_R1 and the second electrode recess EL_2. The semiconductor pattern SP may be exposed by the first electrode recess EL_R1 and the second electrode recess EL_2.

Referring back to FIG. 20, the first conductive connecting line EL1 is formed in the first electrode recess EL_R1. The second conductive connecting line EL2 is formed in the second electrode recess EL_R2. The first gate electrode GE1 is formed in the first hole TH1.

FIGS. 49A to 54 are intermediate stage diagrams for explaining the method for fabricating the semiconductor memory device according to some example embodiments.

Figure 49A:
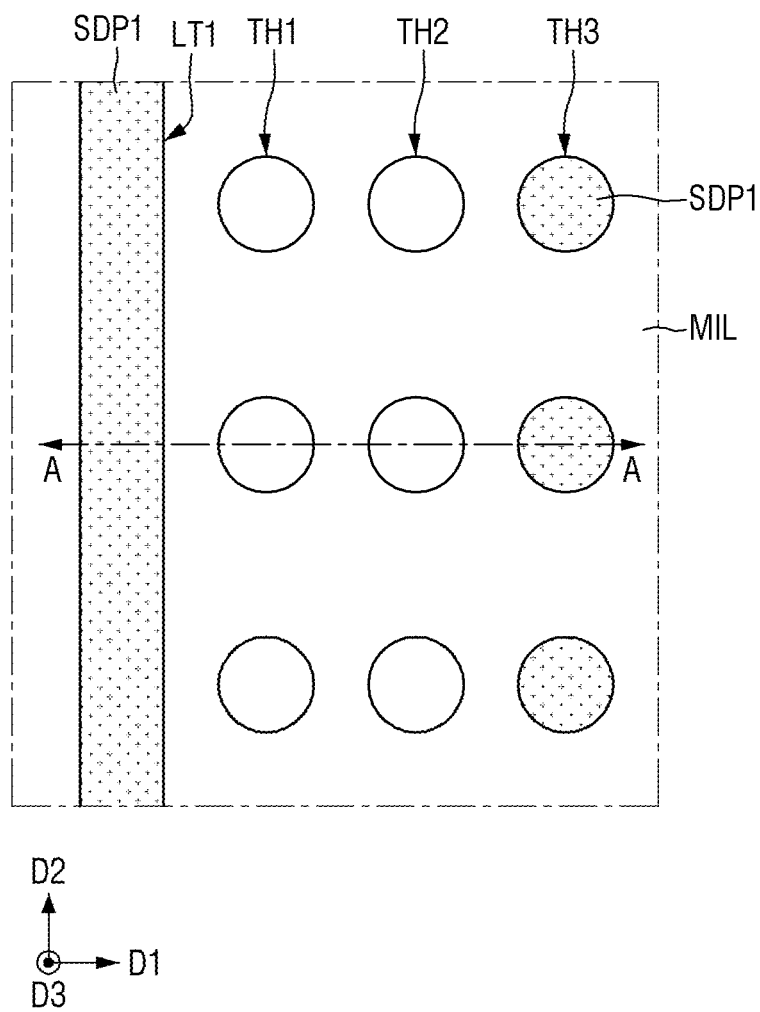
FIGS. 49A to 54 are intermediate stage diagrams for explaining the method for fabricating the semiconductor memory device according to some example embodiments.
Figure 49B:
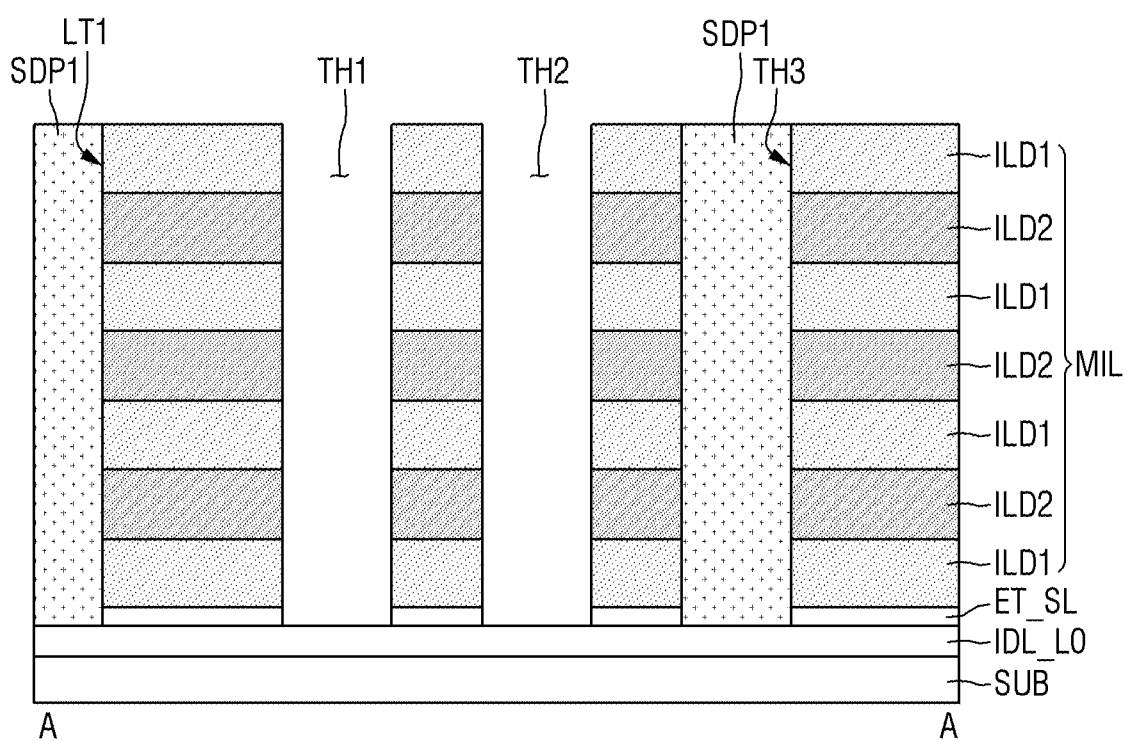
Figure 49B:
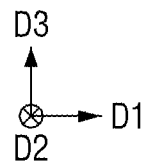

Referring to FIGS. 49A and 49B, first to third holes TH1, TH2, and TH3, and the first linear trench LT1 penetrating the mold structure MIL may be formed. The first to third holes TH1, TH2, and TH3 may have a contact form, and the first linear trench LT1 may have a line form extending long in the second direction D2. The first to third holes TH1, TH2, and TH3 may be sequentially arranged in the first direction D1. The first linear trench LT1 is adjacent to the first hole TH1.

Subsequently, the first sacrificial pattern SDP1 may be formed inside the third hole TH3 and the first linear trench LT1. The first sacrificial pattern SDP1 is not formed inside the first hole TH1 and the second hole TH2.

Figure 50:
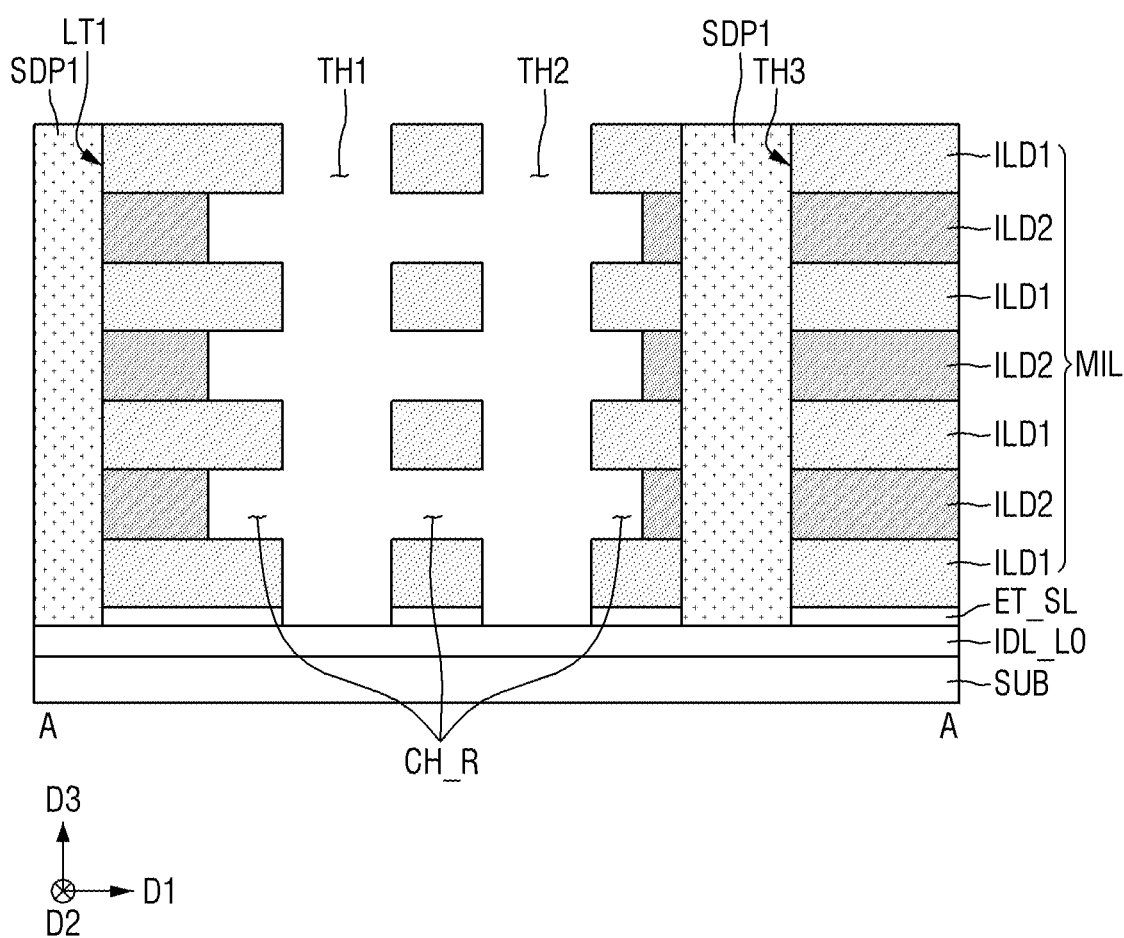

Referring to FIG. 50, the second mold insulating layer ILD2 exposed by the first and second holes TH1 and TH2 may be partially etched to form a channel recess CH_R.

Figure 51:
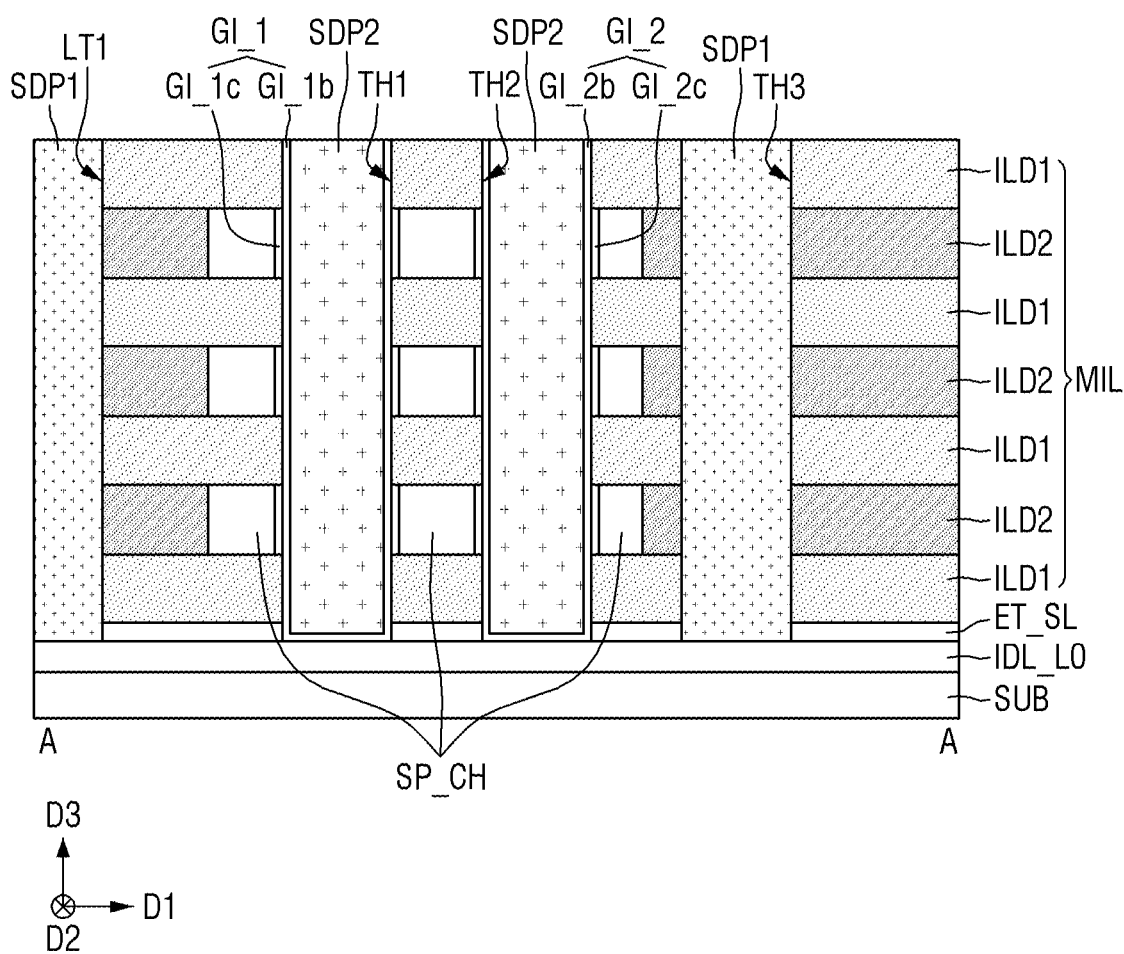

Referring to FIG. 51, a semiconductor pattern SP which fills the channel recess CH_R is formed. The semiconductor pattern SP may not completely fill the channel recess CH_R.

Subsequently, the first gate insulating film GI_1 may be formed on the semiconductor pattern SP exposed by the first hole TH1. A second gate insulating film GI_2 may be formed on the semiconductor pattern SP exposed by the second hole TH2. Subsequently, a second sacrificial pattern SDP2 may be formed inside the first hole TH1 and the second hole TH2.

Figure 52:
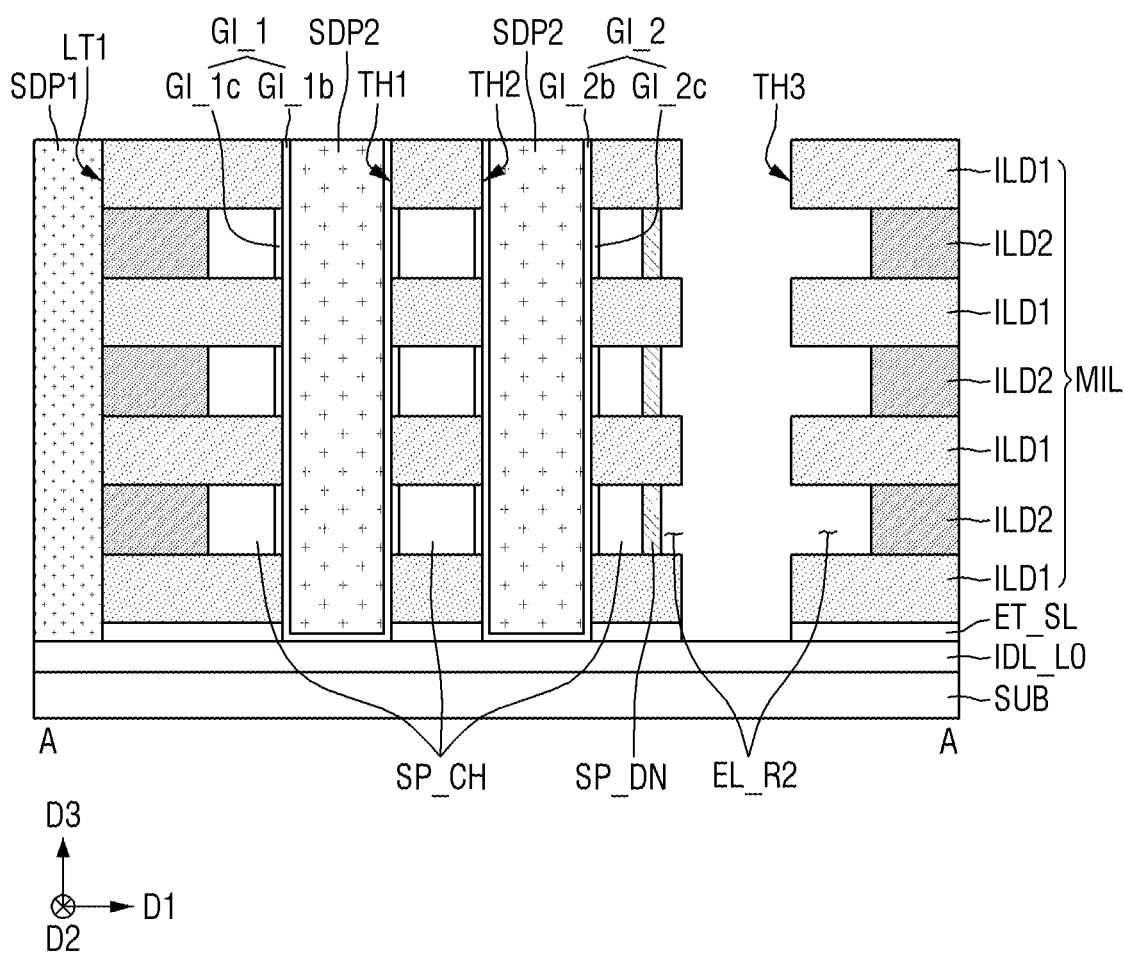

Referring to FIG. 52, the first sacrificial pattern SDP1 that fills the third hole TH3 is removed.

Subsequently, the second mold insulating layer ILD2 exposed by the third hole TH3 may be partially etched to form the second electrode recess EL_R2. The semiconductor pattern SP is exposed by the second electrode recess EL_R2.

The semiconductor pattern SP exposed by the second electrode recess EL_R2 may be doped with impurities to form a second impurity region SP_DN.

Figure 53:
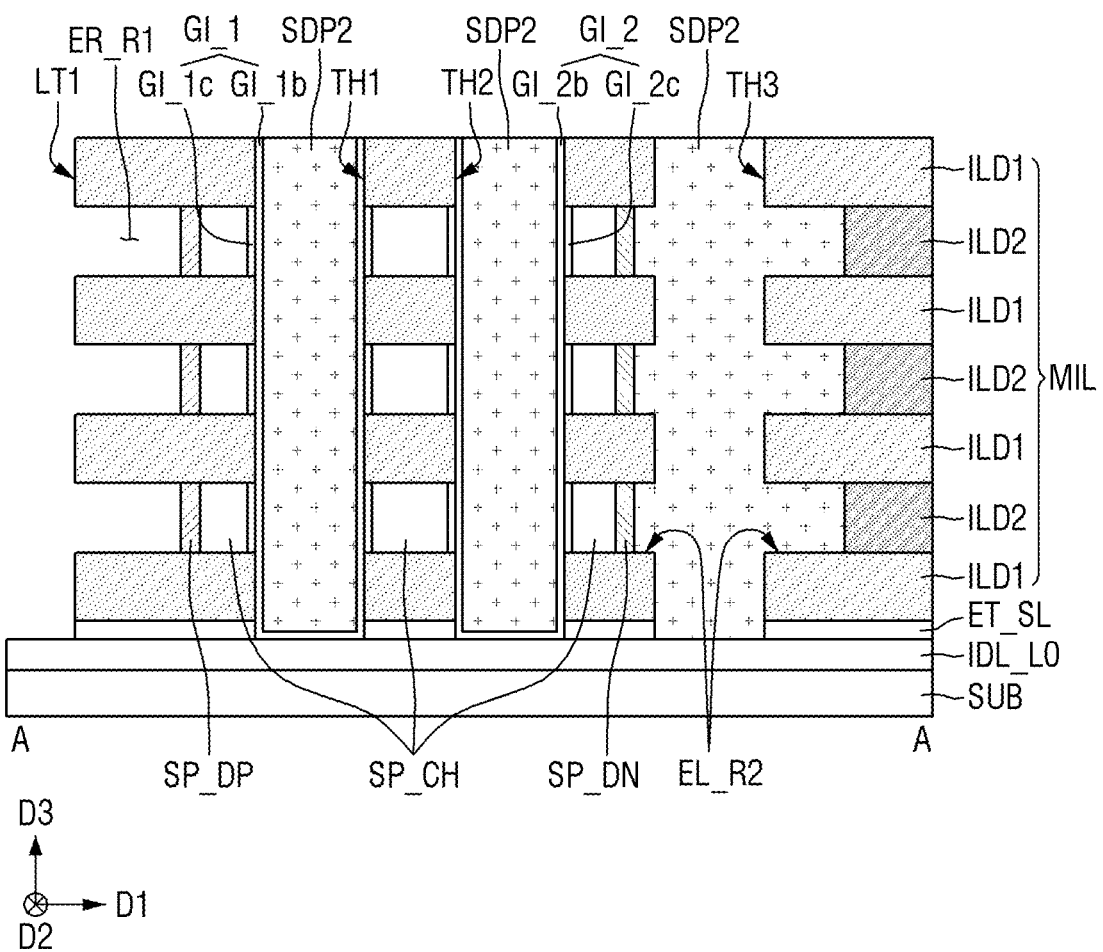

Referring to FIG. 53, a second sacrificial pattern SDP2 is formed inside the second electrode recess EL_R2 and the third hole TH3.

Subsequently, the first sacrificial pattern SDP1 that fills the first linear trench LT1 is removed. The second mold insulating layer ILD2 exposed by the first linear trench LT1 may be partially etched to form the first electrode recess EL_R1. The semiconductor pattern SP is exposed by the first electrode recess EL_R1. The semiconductor pattern SP exposed by the first electrode recess EL_R1 may be doped with impurities to form the first impurity region SP_DP.

Figure 54:
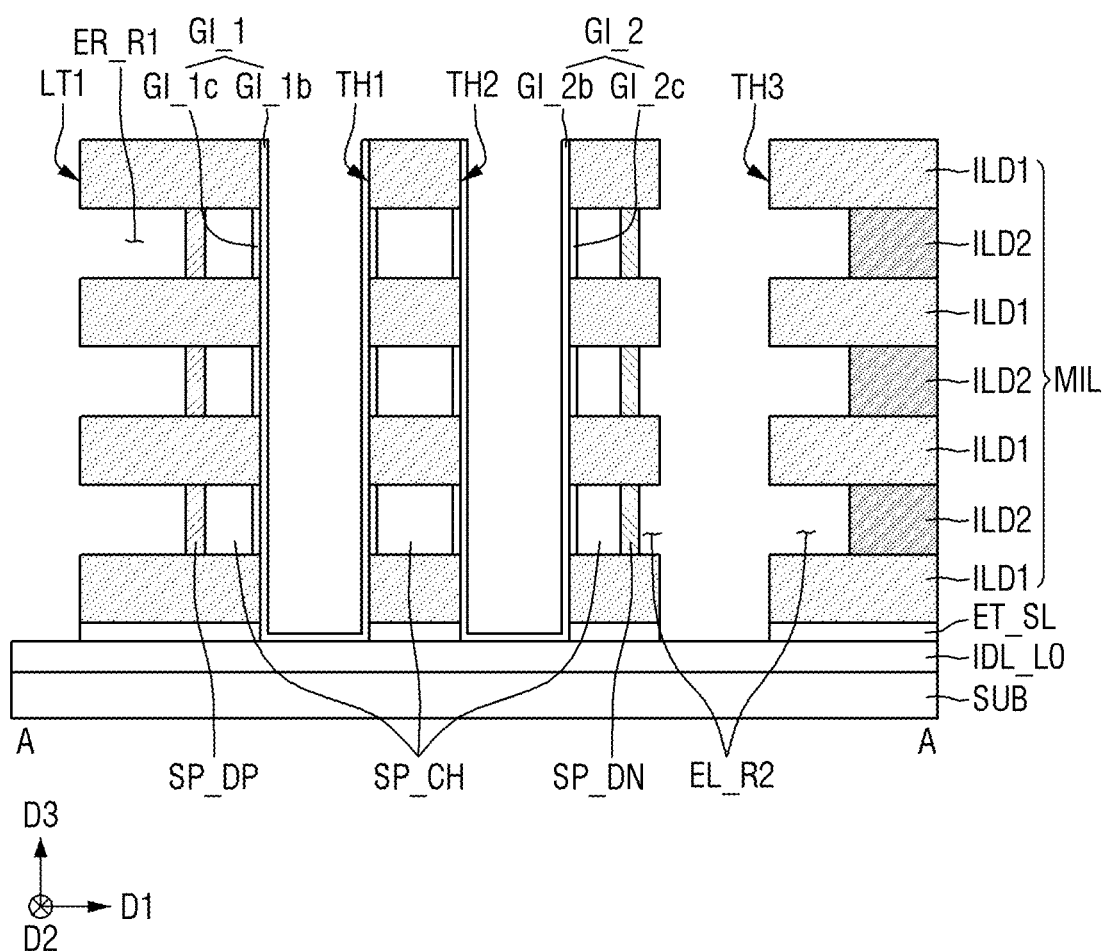

Referring to FIG. 54, the second sacrificial pattern SDP2 in the second electrode recess EL_R2 and the third hole TH3 is removed. The second sacrificial pattern SDP2 in the first hole TH1 and the second hole TH2 is removed.

Referring back to FIG. 31, the first conductive connecting line EL1 is formed in the first electrode recess EL_R1. The second conductive connecting line EL2 is formed in the second electrode recess EL_R2 and the third hole TH3. The first gate electrode GE1 is formed in the first hole TH1. The second gate electrode GE2 is formed in the second hole TH2.

Unlike the shown configuration, the first electrode recess EL_R1 may be formed earlier than the second electrode recess EL_R2.

According to some example embodiments, a three-dimensional memory device may be provided as a pnpn memory device as an alternative to a memory device including a capacitor. The memory device may have improved electrical characteristics and/or may have an improved method of fabrication and/or may have an improvement in scalability.

In concluding the detailed description, those of ordinary skill in the art will appreciate that many variations and modifications may be made to example embodiments without substantially departing from the principles of inventive concepts. Therefore, the disclosed example embodiments are used in a generic and descriptive sense only and not for purposes of limitation.

What is claimed is:

1. A semiconductor memory device comprising:
   a first semiconductor pattern separated from a substrate in a first direction;
   a first gate structure extending in the first direction and penetrating the first semiconductor pattern;
   a first conductive connecting line connected to the first semiconductor pattern, the first conductive connecting line having a length dimension and a width dimension, the length dimension being greater than the width dimension, and the length dimension extending in a second direction different from the first direction;
   a second conductive connecting line connected to the first semiconductor pattern, the second conductive connecting line having a length dimension and a width dimension, the length dimension being greater than the width dimension, the length dimension extending in the first direction; and a second gate structure extending in the first direction and penetrating the first semiconductor pattern, wherein the first gate structure and the second gate structure are spaced apart in a third direction different from the first direction and the second direction and the first gate structure and the second gate structure are between the first conductive connecting line and the second conductive connecting line, the first gate structure includes a first gate electrode and a first gate insulating film, the first gate insulating film includes a first charge holding film contacting with the first semiconductor pattern, and the first semiconductor pattern extending from the first conductive connecting line to the second conductive connecting line.

2. The semiconductor memory device of claim 1, wherein the first gate insulating film further includes a charge blocking film between the first charge holding film and the first gate electrode.

3. The semiconductor memory device of claim 2, wherein the first charge holding film includes a silicon nitride film, and the charge blocking film includes a silicon oxide film.

4. The semiconductor memory device of claim 1, wherein, the second gate structure includes a second gate electrode and a second gate insulating film, and the second gate insulating film includes a second charge holding film contacting the first semiconductor pattern.

5. The semiconductor memory device of claim 4, wherein the first semiconductor pattern includes a first impurity region having a first conductive type, a second impurity region having a second conductive type different from the first conductive type, and a channel region between the first impurity region and the second impurity region, the first impurity region connects to the first conductive connecting line, the second impurity region connects to the second conductive connecting line, and the first gate structure and the second gate structure penetrate the channel region.

6. The semiconductor memory device of claim 4, further comprising:

a third gate structure extending in the first direction, penetrating the first semiconductor pattern, and including a third gate electrode and a third gate insulating film, wherein the first semiconductor pattern includes a first impurity region having a first conductive type, a second impurity region having a second conductive type different from the first conductive type, and a channel region between the first impurity region and the second impurity region, the first impurity region connects to the first conductive connecting line, the second impurity region connects to the second conductive connecting line, and the first gate structure, the second gate structure, and the third gate structure penetrate the channel region.

7. The semiconductor memory device of claim 6, further comprising:

a second semiconductor pattern between the substrate and the first semiconductor pattern, wherein the first gate structure, the second gate structure, and the third gate structure penetrate the second semiconductor pattern, the second semiconductor pattern connects to the second conductive connecting line, and the second conductive connecting line includes a conductive plate electrode having a plate shape.

8. The semiconductor memory device of claim 1, further comprising:

a maid insulating layer on the first semiconductor pattern, wherein the first charge holding film does not extend along a side wall of the mold insulating layer.

9. The semiconductor memory device of claim 1, further comprising:

a mold insulating layer on the first semiconductor pattern, wherein the first charge holding film extends along a side wall of the mold insulating layer.

10. The semiconductor memory device of claim 4, wherein the first semiconductor pattern has a shape of a plurality of connected closed loops.

11. The semiconductor memory device of claim 1, further comprising a peripheral circuit region spaced apart from the first semiconductor pattern in the first direction, the peripheral circuit region being connected to the first semiconductor pattern through the second conductive connecting line.

12. A semiconductor memory device comprising a semiconductor pattern separated from a substrate in a first direction;

a first gate structure extending in the first direction and penetrating the semiconductor pattern;

a first conductive connecting line connected to the semiconductor pattern, the first conductive connecting line having a length dimension and a width dimension, the length dimension being greater than the width dimension, and the length dimension extending in a second direction different from the first direction;

a second conductive connecting line connected to the semiconductor pattern and extending in the first direction, the second conductive connecting line having a length dimension and a width dimension, the length dimension being greater than the width dimension, the length dimension extending in the first direction;

a second gate structure extending in the first direction and penetrating the semiconductor pattern, wherein the first gate structure and the second gate structure are spaced apart in a third direction different from the first direction and the second direction and the first gate structure and the second gate structure are between is between the first conductive connecting line and the second conductive connecting line, the first gate structure includes a first gate electrode and a first gate insulating film, the first gate insulating film includes a first charge holding film, and the semiconductor pattern extends from the first conductive connecting line to the second conductive connecting line.

13. The semiconductor memory device of claim 12, wherein the first gate insulating film further includes a charge blocking film between the first charge holding film and the first gate electrode.

14. The semiconductor memory device of claim 13, wherein the first gate insulating film further includes a charge tunneling film between the first charge holding film and the semiconductor pattern.

15. The semiconductor memory device of claim 13, wherein the first charge holding film contacts the semiconductor pattern.

16. The semiconductor memory device of claim 12, wherein the first gate insulating film further includes a charge tunneling film between the first charge holding film and the semiconductor pattern, and the charge tunneling film contacts the semiconductor pattern.

17. The semiconductor memory device of claim 12, wherein the second gate structure includes a second gate electrode and a second gate insulating film, wherein the semiconductor pattern includes a first impurity region having a first conductive type, a second impurity region having a second conductive type different from the first conductive type, and a channel region between the first impurity region and the second impurity region, the first impurity region connects to the first conductive connecting line, the second impurity region connects to the second conductive connecting line, the first gate structure and the second gate structure penetrate the channel region, the second gate insulating film includes a second charge holding film, and a stacked structure of the first gate insulating film is identical to a stacked structure of the second gate insulating film.

18. A semiconductor memory device comprising:

a semiconductor pattern including a first impurity region separated from a substrate in a first direction, the first impurity region having a first conductive type, a second impurity region having a second conductive type different from the first conductive type, and a channel region between the first impurity region and the second impurity region;

a first gate structure and a second gate structure, the first gate structure and the second gate structure extending in the first direction and penetrating the channel region;

a first conductive connecting line connected to the first impurity region and extending in a second direction different from the first direction; and a second conductive connecting line connected to the second impurity region, wherein the first gate structure and the second gate structure each include a gate electrode and a gate insulating film, and the gate insulating film includes a charge holding film.

19. The semiconductor memory device of claim 18, wherein the gate insulating film further includes a charge blocking film between the charge holding film and the gate electrode.

20. The semiconductor memory device of claim 19, wherein the gate insulating film further includes a charge tunneling film between the charge holding film and the semiconductor pattern.

* * * * *